US012757397B2

(12) United States Patent
Choi

(10) Patent No.: US 12,757,397 B2
(45) Date of Patent: Oct. 6, 2026

(54) SEMICONDUCTOR MEMORY DEVICE AND METHOD OF MANUFACTURING THE SEMICONDUCTOR MEMORY DEVICE

(71) Applicant: SK hynix Inc., Icheon-si (KR)

(72) Inventor: Kang Sik Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 1008 days.

(21) Appl. No.: 17/965,565

(22) Filed: Oct. 13, 2022

(65) Prior Publication Data

US 2023/0354603 A1 Nov. 2, 2023

(30) Foreign Application Priority Data

Apr. 27, 2022 (KR) ........................ 10-2022-0051738

(51) Int. Cl.
*H10B 43/27* (2023.01)
*H10B 43/10* (2023.01)

(52) U.S. Cl.
CPC ............. *H10B 43/27* (2023.02); *H10B 43/10* (2023.02)

(58) Field of Classification Search
CPC ........ H10B 43/27; H10B 43/10; H10B 43/35; H10B 43/40; H10B 43/30; H10B 43/50
See application file for complete search history.

(56) References Cited

U.S. PATENT DOCUMENTS

| | | | | |
|---|---|---|---|---|
| 10,381,362 B1 * | 8/2019 | Cui | ........................ | H10B 41/50 |
| 10,600,804 B2 * | 3/2020 | Kanamori | ................ | G11C 5/06 |
| 10,658,377 B2 * | 5/2020 | Kubo | ...................... | H10B 43/27 |
| 11,469,244 B2 * | 10/2022 | Lee | ........................ | H10B 43/50 |
| 2017/0243651 A1 * | 8/2017 | Choi | .................. | G11C 16/0483 |
| 2019/0312035 A1 * | 10/2019 | Takuma | ................. | H10B 43/10 |
| 2021/0217769 A1 * | 7/2021 | Lee | ........................ | H10B 43/27 |

FOREIGN PATENT DOCUMENTS

| | | | |
|---|---|---|---|
| KR | 1020140062636 | A | 5/2014 |
| KR | 1020190010403 | A | 1/2019 |
| KR | 1020200142976 | A | 12/2020 |

* cited by examiner

*Primary Examiner* — Steven H Loke
*Assistant Examiner* — Khatib A Rahman
(74) *Attorney, Agent, or Firm* — WILLIAM PARK AND ASSOCIATES LTD.

(57) ABSTRACT

Provided herein may be a semiconductor memory device and a method of manufacturing the semiconductor memory device. The semiconductor memory device may include a sub-block insulating layer interposed between a first select gate structure and a second select gate structure, a plurality of conductive patterns stacked over first and second select gate structures to be spaced apart from each other, and a channel structure penetrating one of the first and second select gate structures and the plurality of conductive patterns, the channel structure including an inflection point located at a level between the sub-block insulating layer and the plurality of conductive patterns.

20 Claims, 51 Drawing Sheets

SEMICONDUCTOR MEMORY DEVICE AND METHOD OF MANUFACTURING THE SEMICONDUCTOR MEMORY DEVICE

CROSS-REFERENCE TO RELATED APPLICATION

The present application claims priority under 35 U.S.C. § 119(a) to Korean patent application number 10-2022-0051738, filed on Apr. 27, 2022, in the Korean Intellectual Property Office, the entire disclosure of which is incorporated herein by reference.

BACKGROUND

1. Technical Field

Various embodiments of the present disclosure generally relate to a semiconductor memory device and a method of manufacturing the semiconductor memory device, and more particularly to a three-dimensional (3D) semiconductor memory device and a method of manufacturing the 3D semiconductor memory device.

2. Related Art

A semiconductor memory device includes memory cells capable of storing data. A three-dimensional (3D) semiconductor memory device may include a 3D memory cell array.

In order to improve the degree of integration of a 3D memory cell array, the number of memory cell stacks may be increased. As the number of memory cell stacks is increased, misalignment between patterns may more easily occur, and operational reliability may deteriorate.

SUMMARY

An embodiment of the present disclosure may provide for a semiconductor memory device. The semiconductor memory device may include a first select gate structure including a first surface facing a first direction and a second surface facing a second direction opposite the first direction, the first surface and the second surface extending in a third direction, a second select gate structure neighboring the first select gate structure in the third direction, a sub-block insulating layer interposed between the first select gate structure and the second select gate structure, a plurality of conductive patterns stacked over the first surface of the first select gate structure to be spaced apart from each other in the first direction and extending in the third direction to overlap the sub-block insulating layer and the second select gate structure, a first channel structure penetrating the first select gate structure and the plurality of conductive patterns, and a second channel structure penetrating the second select gate structure and the plurality of conductive patterns, wherein a sidewall of each of the first channel structure and the second channel structure includes a first inflection point disposed at a level between the plurality of conductive patterns and the sub-block insulating layer.

An embodiment of the present disclosure may provide for a semiconductor memory device. The semiconductor memory device may include a horizontal doped semiconductor pattern, a first channel structure and a second channel structure contacting the horizontal doped semiconductor pattern and extending in a first direction, a sub-block structure including a first select gate structure surrounding the first channel structure, a second select gate structure surrounding the second channel structure, and a sub-block insulating layer disposed between the first select gate structure and the second select gate structure, a first stacked body including a first conductive pattern and a first interlayer insulating layer that are alternately stacked over the sub-block structure, and a second stacked body including a second conductive pattern and a second interlayer insulating layer that are alternately stacked over the first stacked body, wherein a sidewall of each of the first channel structure and the second channel structure includes a first inflection point disposed at a level between the first stacked body and the sub-block insulating layer.

An embodiment of the present disclosure may provide for a method of manufacturing a semiconductor memory device. The method may include forming a preliminary select structure, forming a sub-slit passing through the preliminary select structure, forming a sub-block insulating layer in the sub-slit, forming a first preliminary stacked body over the preliminary select structure and the sub-block insulating layer, forming a second preliminary stacked body over the first preliminary stacked body, forming a first channel hole and a second channel hole that pass through the preliminary select structure, the first preliminary stacked body, and the second preliminary stacked body on both sides of the sub-slit, wherein each of the first channel hole and the second channel hole includes a first inflection point located at a level between the first preliminary stacked body and the sub-block insulating layer, forming a first channel structure and a second channel structure in the first channel hole and the second channel hole, respectively, and forming a slit passing through the preliminary select structure, the first preliminary stacked body, and the second preliminary stacked body.

DETAILED DESCRIPTION

Specific structural or functional descriptions disclosed herein are merely illustrative for the purpose of describing embodiments according to the concept of the present disclosure. Embodiments according to the concept of the present disclosure can be implemented in various forms, and should not be construed as being limited to the specific embodiments set forth herein.

Hereinafter, the terms 'first' and 'second' are used to distinguish one component from another component and are not meant to imply a specific number or order of components. The terms may be used to describe various components, but the components are not limited by the terms. It will be understood that when an element or layer etc., is referred to as being "on," "connected to" or "coupled to" another element or layer etc., it can be directly on, connected or coupled to the other element or layer etc., or intervening elements or layers etc., may be present. In contrast, when an element or layer etc., is referred to as being "directly on," "directly connected to" or "directly coupled to" another element or layer etc., there are no intervening elements or layers etc., present. Like numerals refer to like elements throughout. As used herein, the term "and/or" includes any and all combinations of one or more of the associated listed items.

Various embodiments of the present disclosure are directed to a semiconductor memory device that is capable of securing an alignment margin and improving operational reliability, and a method of manufacturing the semiconductor memory device.

Figure 1:
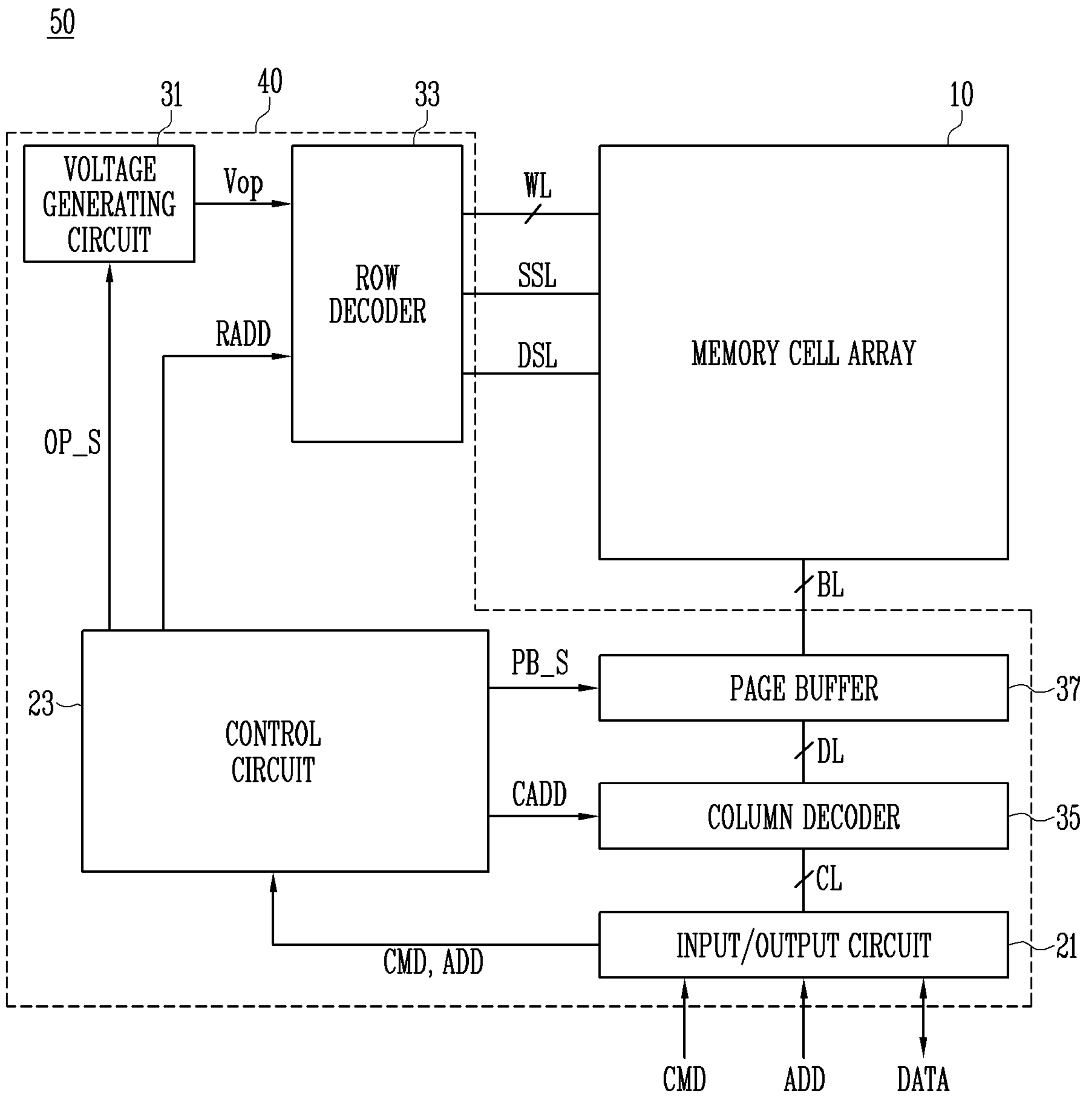
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 50 may include a peripheral circuit structure 40 and a memory cell array 10.

The peripheral circuit structure 40 may be configured to perform a program operation of storing data in the memory cell array 10, a read operation of outputting data stored in the memory cell array 10, and an erase operation of erasing data stored in the memory cell array 10. In an embodiment, the peripheral circuit structure 40 may include an input/output circuit 21, a control circuit 23, a voltage generating circuit 31, a row decoder 33, a column decoder 35, and a page buffer 37.

In an embodiment, to improve the degree of integration of the semiconductor memory device, the memory cell array 10 may overlap the peripheral circuit structure 40.

The memory cell array 10 may include a plurality of memory cells in which data is stored. The memory cells may be arranged in three dimensions. The memory cell array 10 may be coupled to a drain select line DSL, a plurality of word lines WL, a source select line SSL, and a plurality of bit lines BL.

The input/output circuit 21 may transfer a command CMD and an address ADD, received from an external device (e.g., a memory controller) of the semiconductor memory device 50, to the control circuit 23. The input/output circuit 21 may exchange data DATA with the external device and the column decoder 35.

The control circuit 23 may output an operation signal OP_S, a row address RADD, a page buffer control signal PB_S, and a column address CADD in response to the command CMD and the address ADD.

The voltage generating circuit 31 may generate various operating voltages Vop to be used for a program operation, a read operation, and an erase operation in response to the operation signal OP_S.

The row decoder 33 may transfer the operating voltages Vop to the drain select line DSL, the word lines WL, and the source select line SSL in response to the row address RADD.

The column decoder 35 may transmit data DATA, received from the input/output circuit 21, to the page buffer 37 or transmit data DATA, stored in the page buffer 37, to the input/output circuit 21 in response to the column address CADD. The column decoder 35 may exchange the data DATA with the input/output circuit 21 through column lines CL. The column decoder 35 may exchange the data DATA with the page buffer 37 through data lines DL.

The page buffer 37 may temporarily store data DATA received through the bit lines BL in response to the page buffer control signal PB_S. The page buffer 37 may sense the voltages or currents of the bit lines BL during a read operation.

Figure 2A:
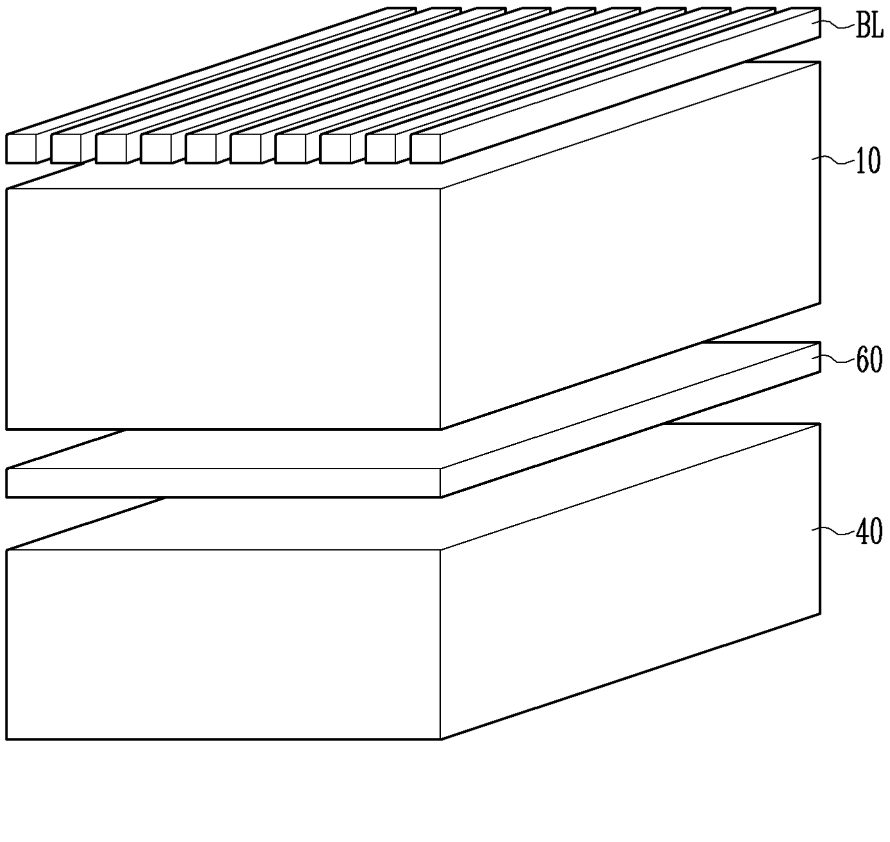
FIGS. 2A and 2B are views schematically illustrating the arrangement of a peripheral circuit structure, a memory cell array, a plurality of bit lines, and a horizontal doped semiconductor pattern according to embodiments of the present disclosure.
Figure 2B:
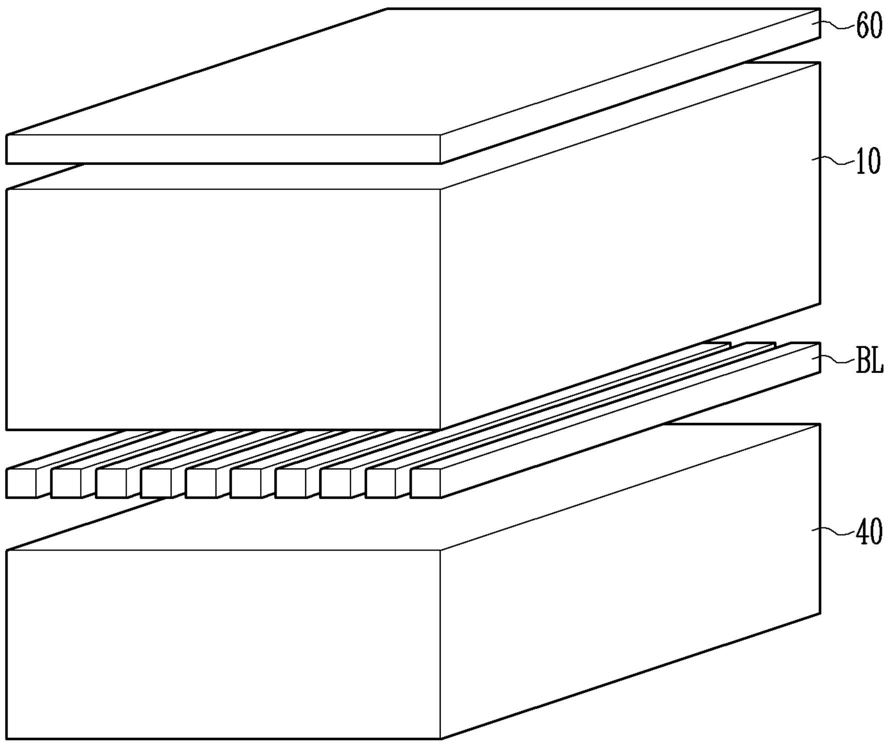

FIGS. 2A and 2B are views schematically illustrating the arrangement of a peripheral circuit structure, a memory cell array, a plurality of bit lines, and a horizontal doped semiconductor pattern according to embodiments of the present disclosure.

Referring to FIGS. 2A and 2B, the peripheral circuit structure 40 may be arranged on a substrate. A memory cell array 10, a horizontal doped semiconductor pattern 60, and a plurality of bit lines BL may overlap the peripheral circuit structure 40. The memory cell array 10 may be disposed between the horizontal doped semiconductor pattern 60 and the plurality of bit lines BL.

The horizontal doped semiconductor pattern 60 and the plurality of bit lines BL may be coupled to the memory cell array 10 through a plurality of channel structures. The horizontal doped semiconductor pattern 60 may include at least one of n-type impurities and p-type impurities.

The arrangement of the horizontal doped semiconductor pattern 60, the plurality of bit lines BL, and the memory cell array 10 may be implemented in various forms.

In an embodiment, as illustrated in FIG. 2A, the horizontal doped semiconductor pattern 60 may be disposed between the memory cell array 10 and the peripheral circuit structure 40. Here, the plurality of bit lines BL may overlap the horizontal doped semiconductor pattern 60 with the memory cell array 10 interposed therebetween. In other words, the horizontal doped semiconductor pattern 60 and the memory cell array 10 may be disposed between the peripheral circuit structure 40 and the plurality of bit lines BL.

In an embodiment, as illustrated in FIG. 2B, the plurality of bit lines BL may be disposed between the memory cell array 10 and the peripheral circuit structure 40. In this case, the horizontal doped semiconductor pattern 60 may overlap the plurality of bit lines BL with the memory cell array 10 interposed therebetween. In other words, the plurality of bit lines BL and the memory cell array 10 may be disposed between the peripheral circuit structure 40 and the horizontal doped semiconductor pattern 60.

Referring back to FIGS. 2A and 2B, in an embodiment, processes of forming the horizontal doped semiconductor pattern 60, the plurality of bit lines BL, and the memory cell array 10 may be performed over the peripheral circuit structure 40. In an embodiment, the process of forming the memory cell array 10 may be performed separately from the process of forming the peripheral circuit structure 40. In this case, the memory cell array 10 and the peripheral circuit structure 40 may be electrically connected to each other by bonding conductive bonding pads to each other.

Figure 3A:
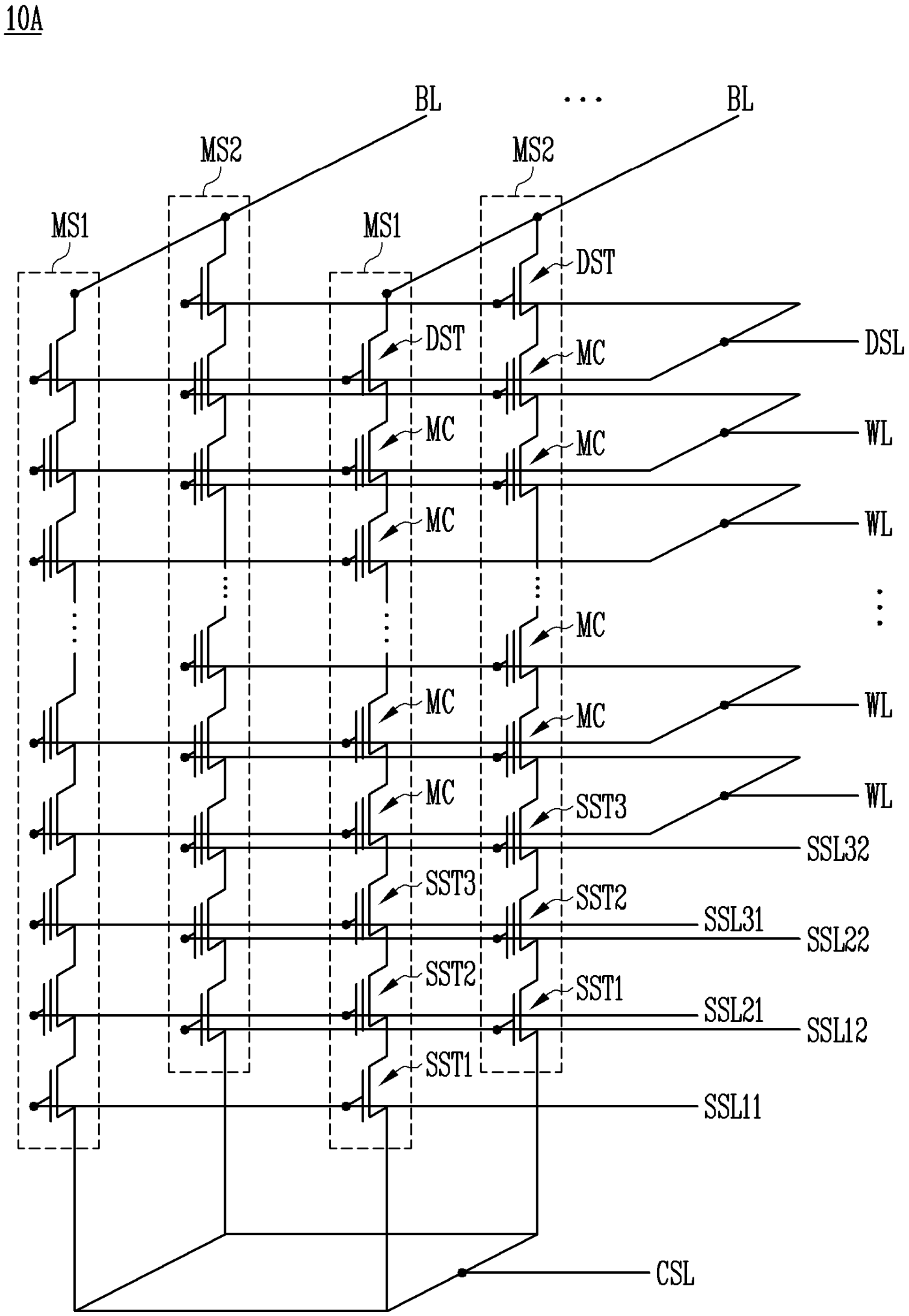
FIGS. 3A and 3B are circuit diagrams illustrating a memory cell array according to embodiments of the present disclosure.
Figure 3B:
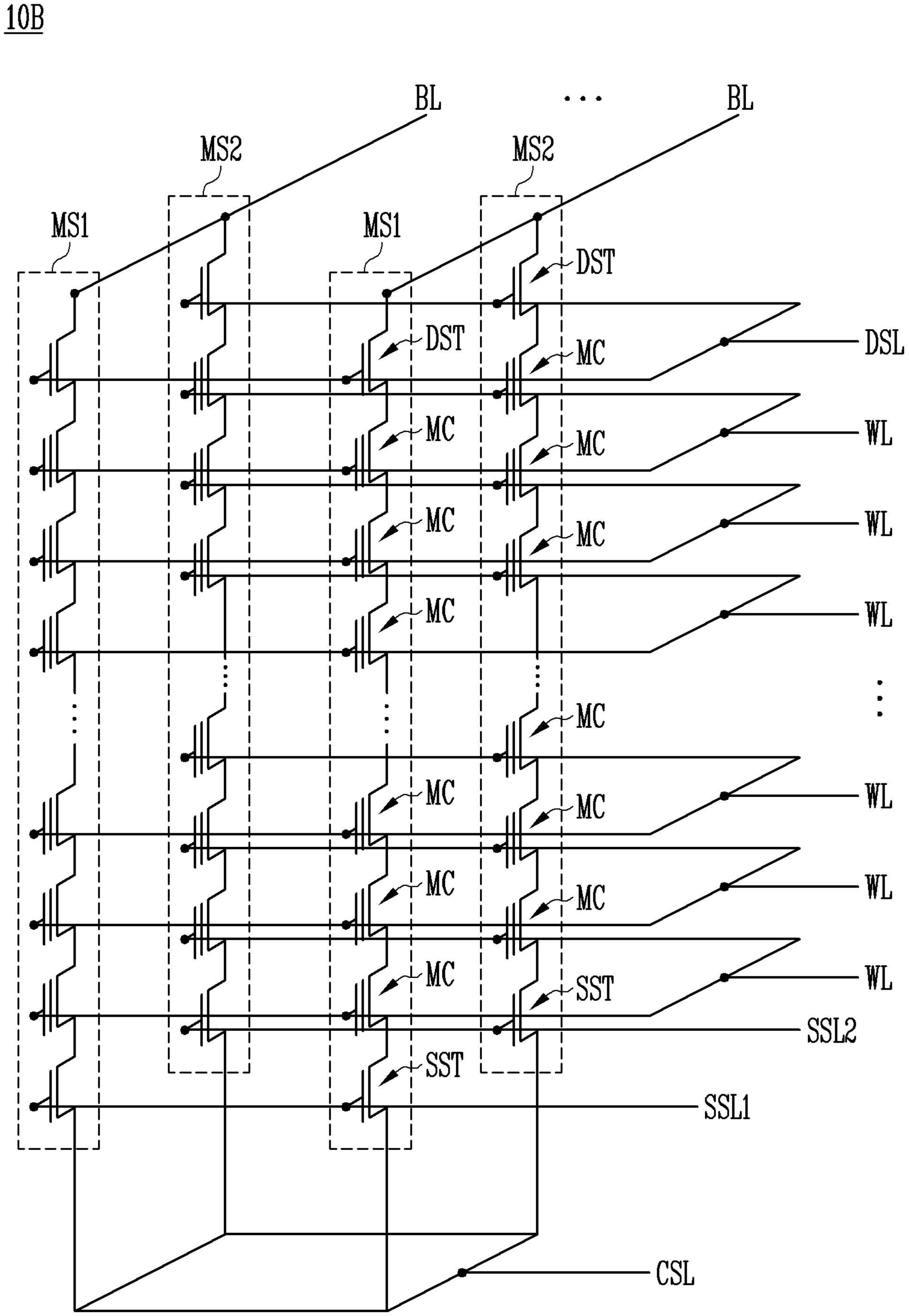

FIGS. 3A and 3B are circuit diagrams illustrating a memory cell array according to embodiments of the present disclosure.

Referring to FIGS. 3A and 3B, a memory cell array 10A or 10B may include a plurality of memory cell strings MS1 and MS2 coupled to a common source line CSL and a plurality of bit lines BL.

Each of the memory cell strings MS1 and MS2 may include a plurality of memory cells MC, at least one source select transistor, and at least one drain select transistor, which are coupled in series to each other.

In an embodiment, as illustrated in FIG. 3A, each of the memory cell strings MS1 and MS2 may include two or more source select transistors SST1, SST2, and SST3 coupled in series between the plurality of memory cells MC and the common source line CSL. In an embodiment, the first source select transistor SST1, the second source select transistor SST2, and the third source select transistor SST3 may be coupled in series between the plurality of memory cells MC and the common source line CSL. In an embodiment, as illustrated in FIG. 3B, each of the memory cell strings MS1 and MS2 may include one source select transistor SST coupled between the plurality of memory cells MC and the common source line CSL.

FIGS. 3A and 3B illustrate the case in which one drain select transistor DST is coupled between each bit line BL and the plurality of memory cells MC, but an embodiment of the present disclosure is not limited thereto. In an embodiment, two or more drain select transistors may be coupled in series between the corresponding bit line BL and the plurality of memory cells MC.

A gate of the drain select transistor DST may be coupled to the drain select line DSL, and a plurality of gates of the plurality of memory cells MC may be coupled to the plurality of word lines WL, respectively. The plurality of memory cell strings MS1 and MS2 may be coupled in common to each word line WL. For example, the plurality of memory cell strings MS1 and MS2 may include first memory cell strings MS1 and second memory cell strings MS2, which are coupled in common to each word line WL.

A source select transistor of each first memory cell string MS1 and a source select transistor of each second memory cell string MS2 may be respectively coupled to source select lines separated from each other. Referring to FIG. 3A, a gate of the first source select transistor SST1, a gate of the second source select transistor SST2, and a gate of the third source select transistor SST3 in the first memory cell string MS1 may be coupled to a first source select line SSL11 in a first group, a first source select line SSL21 in a second group, and a first source select line SSL31 in a third group, respectively. Further, a gate of a first source select transistor SST1, a gate of a second source select transistor SST2, and a gate of a third source select transistor SST3 in the second memory cell string MS2 may be coupled to a second source select line SSL12 in the first group, a second source select line SSL22 in the second group, and a second source select line SSL32 in the third group, respectively. Referring to FIG. 3B, a gate of the source select transistor SST in the first memory cell string MS1 may be coupled to a first source select line SSL1, and a gate of the source select transistor SST in the second memory cell string MS2 may be coupled to a second source select line SSL2.

Each bit line BL may be coupled to the first memory cell string MS1 and the second memory cell string MS2 corresponding thereto, among the plurality of memory cell strings MS1 and MS2. One of the first memory cell string MS1 and the second memory cell string MS2 coupled to the same bit line BL may be individually selected by controlling signals to be applied to the first source select lines SSL11 to SSL31 and the second source select lines SSL12 to SSL32 illustrated in FIG. 3A. Alternatively, one of the first memory cell string MS1 and the second memory cell string MS2 coupled to the same bit line BL may be individually selected by controlling signals to be applied to the first source select line SSL1 and the second source select line SSL2 illustrated in FIG. 3B. Accordingly, during a read operation or a verify operation, the first memory cell string MS1 or the second memory cell string MS2, among the plurality of memory cell strings MS1 and MS2, may be selectively coupled to the common source line CSL. In this case, compared to the case in which all of the plurality of memory cell strings MS1 and MS2 are simultaneously coupled to the common source line CSL, current flowing into the common source line CSL may be reduced, with the result that voltage bouncing may be reduced. Therefore, an embodiment of the present disclosure may decrease the incidence of a read disturb attributable to such voltage bouncing.

An erase operation on the memory cell array 10A or 10B may be performed through a gate-induced drain leakage (GIDL) erase method of supplying holes using a GIDL current or through a well-erase method of supplying holes from a p-type well. The GIDL erase method may be performed using an n-type doped semiconductor layer coupled to the plurality of memory cell strings MS1 and MS2 and the common source line CSL. The well-erase method may be performed using a p-type doped semiconductor layer coupled to the plurality of memory cell strings MS1 and MS2.

Figure 4:
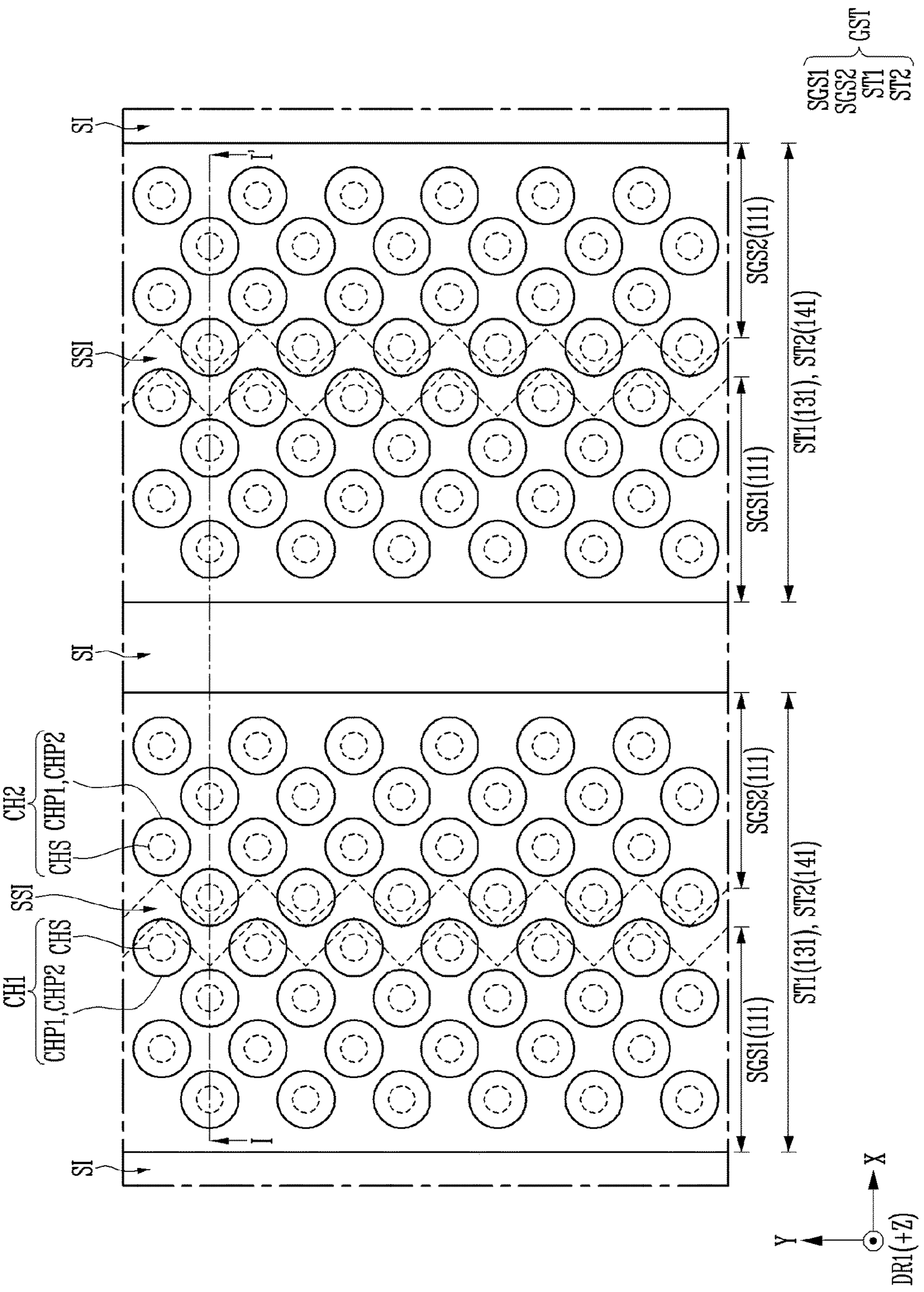
FIG. 4 is a plan view illustrating a portion of a semiconductor memory device according to an embodiment of the present disclosure.

FIG. 4 is a plan view illustrating a portion of a semiconductor memory device according to an embodiment of the present disclosure.

Referring to FIG. 4, the semiconductor memory device may include a gate stacked body GST divided by a slit SI. The gate stacked body GST may include a first select gate structure SGS1, a second select gate structure SGS2, a first stacked body ST1, and a second stacked body ST2. The first select gate structure SGS1 and the second select gate structure SGS2 may be separated from each other by a sub-slit SSI.

The first select gate structure SGS1 and the second select gate structure SGS2 may include select gate patterns 111, respectively. Each of the select gate patterns 111 may be implemented as at least one layer. The select gate pattern 111 of the first select gate structure SGS1 and the select gate pattern 111 of the second select gate structure SGS2 may be separated from each other by the sub-slit SSI. The first stacked body ST1 may include at least one first conductive pattern 131. The second stacked body ST2 may include a plurality of second conductive patterns 141.

The select gate pattern 111, the first conductive pattern 131, and each second conductive pattern 141 may each include at least one of a doped semiconductor layer, a metal layer, and a conductive metal nitride layer. The doped semiconductor layer may include a doped silicon layer. The metal layer may contain tungsten, copper, molybdenum, or the like. The conductive metal nitride layer may include a titanium nitride, a tantalum nitride, or the like.

Each of the select gate pattern 111, the first conductive pattern 131, and the second conductive pattern 141 may be formed as plates parallel to an XY plane in an XYZ coordinate system. The select gate pattern 111, the first conductive pattern 131, and the plurality of second conductive patterns 141 may be stacked to be spaced apart from each other in a first direction DR1 intersecting the XY plane. The first direction DR1 may be the positive direction of a Z axis (i.e., a +Z direction).

The first select gate structure SGS1 may be penetrated by each first channel structure CH1, and the second select gate structure SGS2 may be penetrated by each second channel structure CH2.

The first stacked body ST1 may overlap the first select gate structure SGS1 and the second select gate structure SGS2 in the first direction DR1. Each first channel structure CH1 and each second channel structure CH2 may extend in the first direction DR1 to penetrate the first stacked body ST1.

The second stacked body ST2 may overlap the first stacked body ST1 in the first direction DR1. The first channel structure CH1 and the second channel structure CH2 may extend in the first direction DR1 to penetrate the second stacked body ST2. Each of the first channel structure CH1 and the second channel structure CH2 may include a select channel component CHS, a first channel component CHP1, and a second channel component CHP2. The first channel component CHP1 may be spaced apart from the select channel component CHS in the first direction DR1, and may be coupled to the select channel component CHS through the second channel component CHP2.

Each of the first select gate structure SGS1 and the second select gate structure SGS2 may be penetrated by the select channel component CHS corresponding thereto. The select channel component CHS may be formed to have a width smaller than those of the first channel component CHP1 and the second channel component CHP2. The first channel component CHP1 may penetrate the second stacked body ST2. The second channel component CHP2 may penetrate the first stacked body ST1. The first channel component CHP1 may be formed in a tapered shape. The first channel component CHP1 may include a portion formed to have a width smaller than the maximum width of the second channel component CHP2 and a portion formed to have a width substantially same to the maximum width of the second channel component CHP2, depending on a location in the first direction DR1. The width of the end of the first channel component CHP1 that is farthest away from the second channel component CHP2 may be formed to be greater than the maximum width of the second channel component CHP2. The embodiment of the present disclosure is not limited thereto, and the width of the end of the first channel component CHP1 that is farthest away from the second channel component CHP2 may be formed to be substantially same to the maximum width of the second channel component CHP2.

As described above, because the select channel component CHS is formed to have a width smaller than those of the first channel component CHP1 and the second channel component CHP2, the shortest distance between the select channel component CHS of the first channel structure CH1 and the select channel component CHS of the second channel structure CH2 may be greater than the shortest distance between the first channel component CHP1 of the first channel structure CH1 and the first channel component CHP1 of the second channel structure CH2. Also, the shortest distance between the select channel component CHS of the first channel structure CH1 and the select channel component CHS of the second channel structure CH2 may be greater than the shortest distance between the second channel component CHP2 of the first channel structure CH1 and the second channel component CHP2 of the second channel structure CH2. Accordingly, space in which the sub-slit SSI is arranged may be secured to be wider between the select channel component CHS of the first channel structure CH1 and the select channel component CHS of the second channel structure CH2 than between the first channel component CHP1 of the first channel structure CH1 and the first channel component CHP1 of the second channel structure CH2 and between the second channel component CHP2 of the first channel structure CH1 and the second channel component CHP2 of the second channel structure CH2. As a result, in accordance with the present disclosure, an alignment margin between the sub-slit SSI, the select channel component CHS of the first channel structure CH1, and the select channel component CHS of the second channel structure CH2 may be secured.

The sub-slit SSI and the slit SI may be formed in various shapes, such as a zigzag shape, a linear shape, a wave shape, or any combination thereof, in the XY plane.

Figure 5A:
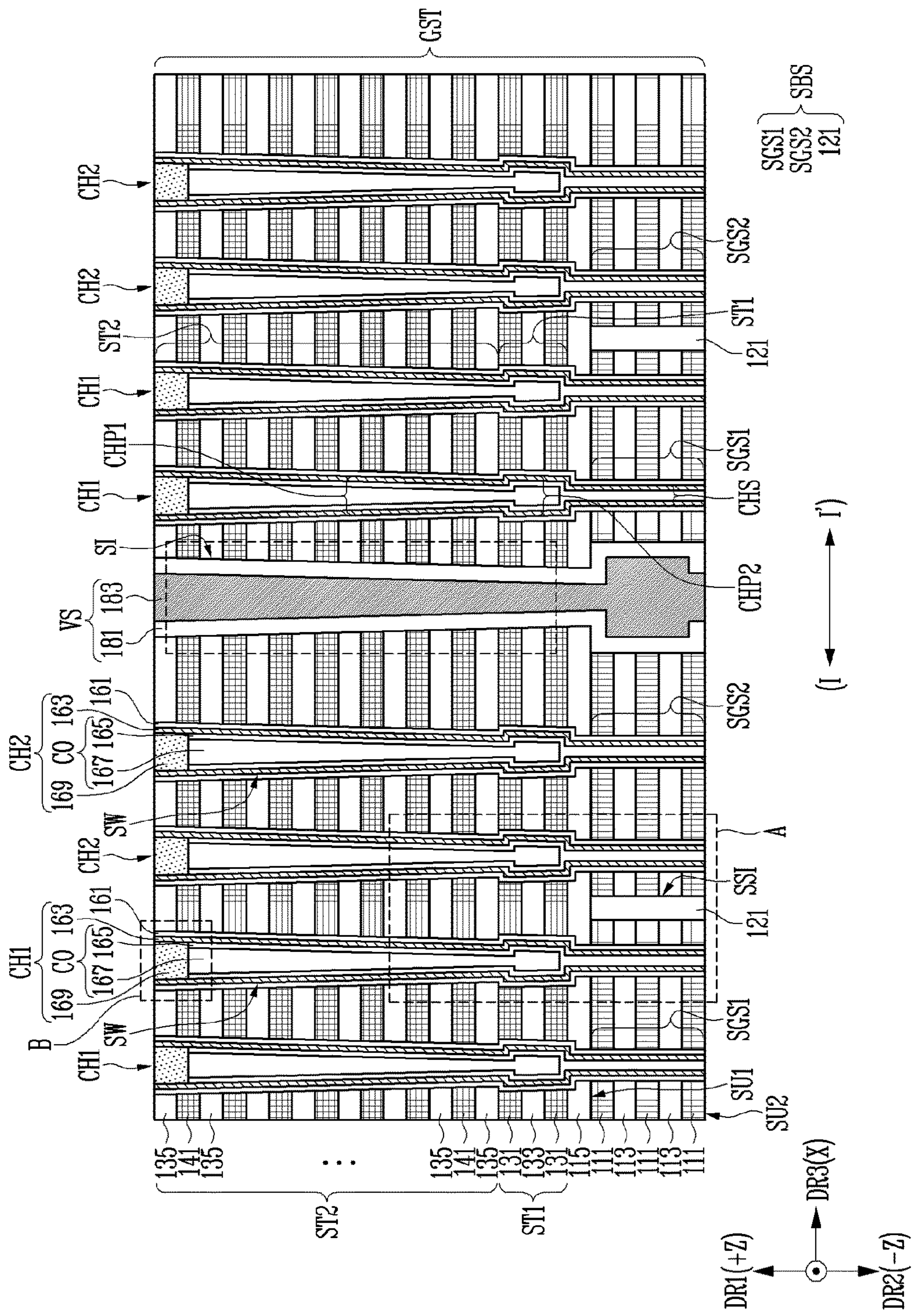
FIG. 5A is a sectional view of a semiconductor memory device taken along line I-I' of FIG. 4.
Figure 5B:
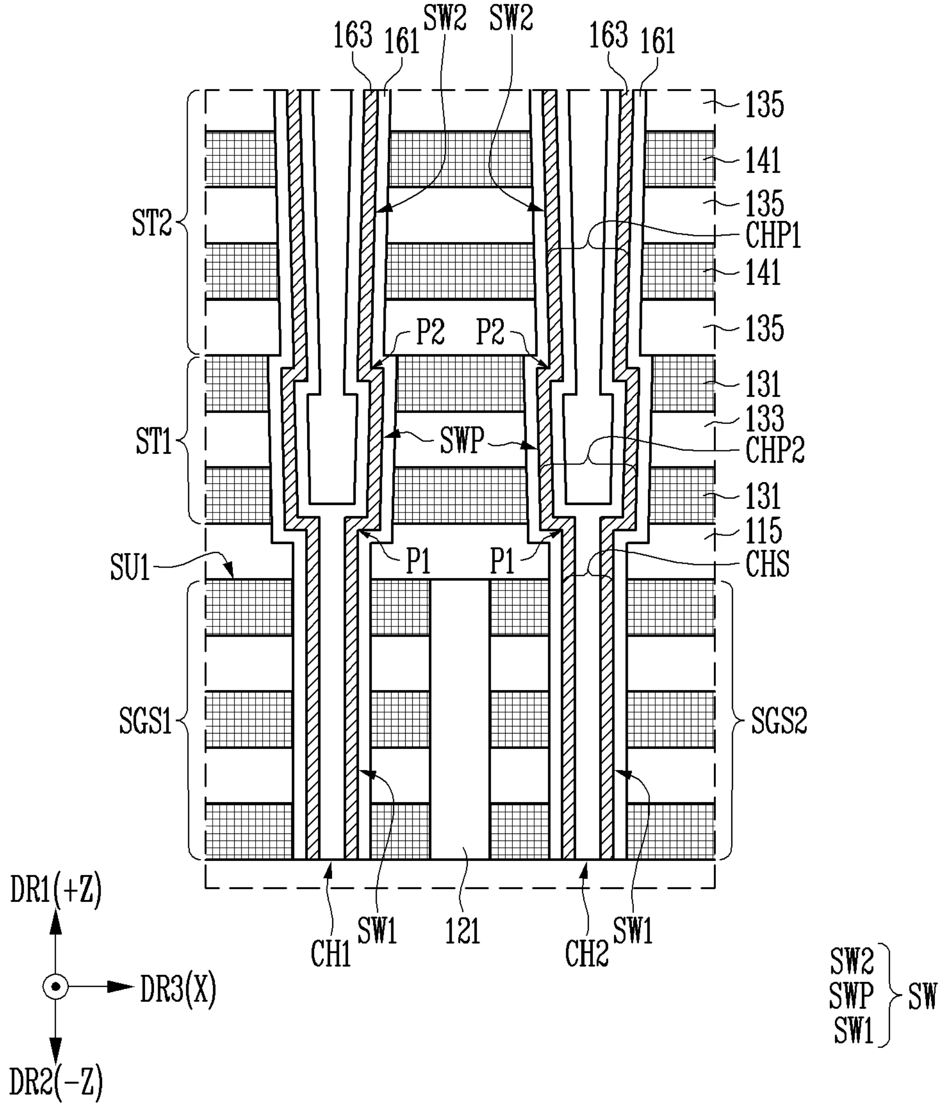
FIG. 5B is an enlarged sectional view of region A of FIG. 5A.
Figure 5C:
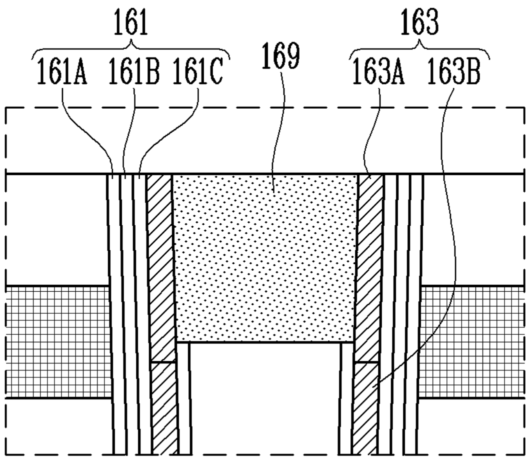
FIG. 5C is an enlarged sectional view of region B of FIG. 5A.

FIG. 5A is a sectional view of a semiconductor memory device taken along line I-I' of FIG. 4, FIG. 5B is an enlarged sectional view of region A of FIG. 5A, and FIG. 5C is an enlarged sectional view of region B of FIG. 5A.

Referring to FIG. 5A, a gate stacked body GST may include a sub-block structure SBS, a sub-interlayer insulating layer 115, a first stacked body ST1, and a second stacked body ST2, which are stacked in a first direction DR1.

The sub-block structure SBS may include a first select gate structure SGS1, a second select gate structure SGS2, and a sub-block insulating layer 121. The sub-block structure SBS may be covered with the sub-interlayer insulating layer 115.

The first select gate structure SGS1 may include a first surface SU1 facing the first direction DR1 and a second surface SU2 facing a second direction DR2, which is opposite the first direction DR1. As described above with reference to FIG. 4, the first direction DR1 may be the positive direction of a Z axis (i.e., a +Z direction). The second direction DR2 may be the negative direction of the Z axis (i.e., a −Z direction).

The first surface SU1 and the second surface SU2 may be arranged in the XY plane. For example, the first surface SU1 and the second surface SU2 may extend in a third direction DR3. The third direction DR3 may be the X-axis direction.

The second select gate structure SGS2 may neighbor the first select gate structure SGS1. For example, the second select gate structure SGS2 may neighbor the first select gate structure SGS1 in the third direction DR3 as shown in FIG. 5A. Each of the first select gate structure SGS1 and the second select gate structure SGS2 may include a single-layer select gate pattern or include select gate patterns disposed on two or more layers spaced apart from each other in the first direction DR1 depending on the number of stacks of each of a first source select line and a second source select line. In an embodiment, the first select gate structure SGS1 and the second select gate structure SGS2 may be respectively provided for the first source select lines SSL11, SSL21, and SSL31 in the first to third groups illustrated in FIG. 3A, and the second source select lines SSL12, SSL22, and SSL32 in the first to third groups illustrated in FIG. 3A. Here, each of the first select gate structure SGS1 and the second select gate structure SGS2 may include select gate patterns 111 disposed on three layers spaced apart from each other in the first direction DR1. The select gate patterns 111 of the first select gate structure SGS1 may be used as the first source select lines SSL11, SSL21, and SSL31 in the first to third groups, illustrated in FIG. 3A, and the select gate patterns 111 of the second select gate structure SGS2 may be used as the second source select lines SSL12, SSL22, and SSL32 in the first to third groups illustrated in FIG. 3A.

Each of the first select gate structure SGS1 and the second select gate structure SGS2 may further include inter-gate insulating layers 113 disposed alternately with the select gate patterns 111 in the first direction DR1.

The sub-block insulating layer 121 may be disposed in the sub-slit SSI. The sub-block insulating layer 121 may be interposed between the first select gate structure SGS1 and the second select gate structure SGS2, thus, in an embodiment, insulating the select gate patterns 111 of the first select gate structure SGS1 from the select gate patterns 111 of the second select gate structure SGS2. The sub-block insulating layer 121 may include an insulating material such as a silicon oxide.

The first stacked body ST1 may be disposed over the first surface SU1 of the first select gate structure SGS1 with the sub-interlayer insulating layer 115 interposed therebetween. The first stacked body ST1 may extend in the third direction DR3 to overlap the sub-block insulating layer 121 and the second select gate structure SGS2. The first stacked body ST1 may include at least one first conductive pattern and at least one first interlayer insulating layer, which are alternately disposed in the first direction DR1. In an embodiment, the first stacked body ST1 may include first conductive patterns 131 disposed on two layers spaced apart from each other in the first direction DR1 and a first interlayer insulating layer 133 disposed between first conductive patterns 131 neighboring each other in the first direction DR1. Each of the first conductive patterns 131 may be used as a word line or a dummy word line.

The second stacked body ST2 may be disposed over the first stacked body ST1. The second stacked body ST2 may be disposed over the first surface SU1 of the first select gate structure SGS1 with the sub-interlayer insulating layer 115 and the first stacked body ST1 interposed therebetween. The second stacked body ST2 may extend in the third direction DR3 to overlap the sub-block insulating layer 121 and the second select gate structure SGS2. The second stacked body ST2 may include a plurality of second interlayer insulating layers 135 and a plurality of second conductive patterns 141, which are alternately disposed in the first direction DR1. A second conductive pattern on an uppermost layer, which is spaced apart from the first select gate structure SGS1 and the second select gate structure SGS2 by the longest distance, among the plurality of second conductive patterns 141, may be used as a drain select line, and the remaining second conductive patterns may be used as word lines.

The first conductive patterns 131 and the second conductive patterns 141 may be stacked over the first surface SU1 of the first select gate structure SGS1 to be spaced apart from each other in the first direction DR1, and may continuously extend in the third direction DR3 to overlap the sub-block insulating layer 121 and the second select gate structure SGS2.

Each of the inter-gate insulating layers 113, the sub-interlayer insulating layer 115, the first interlayer insulating layer 133, and the second interlayer insulating layers 135 may include an insulating material, such as a silicon oxide.

Each first channel structure CH1 may extend in the first direction DR1 to penetrate the first select gate structure SGS1, the first stacked body ST1, and the second stacked body ST2. Each second channel structure CH2 may extend in the first direction DR1 to penetrate the second select gate structure SGS2, the first stacked body ST1, and the second stacked body ST2. As described above with reference to FIG. 4, each of the first channel structure CH1 and the second channel structure CH2 may include a select channel component CHS, a first channel component CHP1, and a second channel component CHP2.

Each of the first channel structure CH1 and the second channel structure CH2 may include a channel layer 163, a core insulating pattern CO, and a capping pattern 169. The select channel component CHS, the first channel component CHP1, and the second channel component CHP2 of the first channel structure CH1 and the select channel component CHS, the first channel component CHP1, and the second channel component CHP2 of the second channel structure CH2 may be implemented as the channel layers 163. The select channel component CHS, the first channel component CHP1, and the second channel component CHP2 of each of the first channel structure CH1 and the second channel structure CH2 may be formed in the tubular shape.

The core insulating pattern CO of the first channel structure CH1 may be disposed in a central region of each of the first channel component CHP1, the second channel component CHP2, and the select channel component CHS of the first channel structure CH1. The capping pattern 169 of the first channel structure CH1 may be disposed in the central region of the first channel component CHP1 at the end of the first channel structure CH1. The core insulating pattern CO of the second channel structure CH2 may be disposed in a central region of each of the first channel component CHP1, the second channel component CHP2, and the select channel component CHS of the second channel structure CH2. The capping pattern 169 of the second channel structure CH2 may be disposed in the central region of the first channel component CHP1 at the end of the second channel structure CH2.

The channel layers 163 may surround respective sidewalls of the core insulating patterns CO of the first channel structure CH1 and the second channel structure CH2 and may surround respective sidewalls of the capping patterns 169 of the first channel structure CH1 and the second channel structure CH2. Each channel layer 163 may include a single layer or a dual layer including a semiconductor material, such as silicon or germanium. The core insulating pattern CO may include a buffer layer 165 and a gap-fill layer 167. The buffer layer 165 may be arranged on an inner wall of the channel layer 163. The buffer layer 165 may be disposed between the gap-fill layer 167 and the first channel component CHP1 of the channel layer 163, and may extend to a space between the gap-fill layer 167 and the second channel component CHP2. The buffer layer 165 may fill partial space, surrounded with the select channel component CHS, in the central region of each of the first channel structure CH1 and the second channel structure CH2. The capping pattern 169 may include a doped semiconductor layer including at least one of n-type impurities and p-type impurities. In an embodiment, the capping pattern 169 may include an n-type doped silicon layer.

The semiconductor memory device may further include a vertical structure VS disposed in the slit SI. The vertical structure VS may be formed only of a single insulating material, or may be formed of an insulating material and a conductive material. In an embodiment, the vertical structure VS may include a sidewall insulating layer 181 and a source contact structure 183. The sidewall insulating layer 181 may be disposed on a sidewall of the gate stacked body GST. The sidewall insulating layer 181 may include at least one of a silicon oxide, a silicon nitride, and a silicon oxynitride, and may include a single-layer or multi-layer structure stacked on the sidewall of the gate stacked body GST. The source contact structure 183 may include at least one of a doped semiconductor layer, a metal layer, a conductive metal nitride layer, and a transition metal layer. The doped semiconductor layer may include a doped silicon layer. The metal layer may include tungsten, copper, molybdenum, or the like. The conductive metal nitride layer may include a titanium nitride, a tantalum nitride, or the like. The transition metal layer may include titanium, tantalum, or the like. The common source line CSL illustrated in FIGS. 3A and 3B may be coupled to the first channel structure CH1 and the second channel structure CH2 via the source contact structure 183 illustrated in FIG. 5A.

The semiconductor memory device may further include a memory layer 161 extending along each of the sidewalls of the first channel structure CH1 and the second channel structure CH2. The memory layer 161 may be interposed between each of the first channel structure CH1 and the second channel structure CH2 and the gate stacked body GST.

Referring to FIG. 5B, the sidewalls SW of the first channel structure CH1 and the second channel structure CH2 may be defined along outer walls of the select channel components CHS, the first channel components CHP1, and the second channel components CHP2 of the first channel structure CH1 and the second channel structure CH2. In accordance with an embodiment of the present disclosure, the widths of the select channel component CHS, the first channel component CHP1, and the second channel component CHP2 of each of the first channel structure CH1 and the second channel structure CH2 may change at the boundaries between the select channel component CHS, the first channel component CHP1, and the second channel component CHP2. Accordingly, the sidewall SW of each of the first channel structure CH1 and the second channel structure CH2 may include a first inflection point P1 and a second inflection point P2.

In order to secure an arrangement space for the sub-block insulating layer 121, the first inflection point P1 may be located closer to the first stacked body ST1 than the sub-block insulating layer 121. In other words, the first inflection point P1 may be located at a level between the sub-block insulating layer 121 and the first conductive pattern 131. In an embodiment, the first inflection point P1 may be located at a level at which the sub-interlayer insulating layer 115 is disposed. Embodiments of the present disclosure are not limited thereto. In an embodiment, the first inflection point P1 may be located at a level between the sub-interlayer insulating layer 115 and the first conductive pattern 131 or between the sub-interlayer insulating layer 115 and the sub-block insulating layer 121.

The second inflection point P2 may be located farther away from the first select gate structure SGS1 and the second select gate structure SGS2 than the first inflection point P1. In an embodiment, the second inflection point P2 may be disposed between the first stacked body ST1 and the second stacked body ST2. Embodiments of the present disclosure are not limited thereto, and the second inflection point P2 may be disposed in the first stacked body ST1.

Each of the sidewalls SW of the first channel structure CH1 and the second channel structure CH2 may include a first portion SW1, a second portion SW2, and a protrusion SWP based on the first inflection point P1 and the second inflection point P2. The first portion SW1 may extend from the first inflection point P1 in a second direction DR2. The second portion SW2 may extend from the second inflection point P2 in a first direction DR1. The protrusion SWP may be disposed between the first portion SW1 and the second portion SW2, and may protrude from the first inflection point P1 and the second inflection point P2 in a laterally direction parallel to the first surface SU1 of the first select gate structure SGS1. For example, the protrusion SWP may protrude in the third direction DR3 from the first inflection point P1 and the second inflection point P2.

The select channel component CHS of the first channel structure CH1 may extend from the first inflection point P1 of the first channel structure CH1 to penetrate the sub-interlayer insulating layer 115 and the first select gate structure SGS1. The select channel component CHS of the second channel structure CH2 may extend from the first inflection point P1 of the second channel structure CH2 to penetrate the sub-interlayer insulating layer 115 and the second select gate structure SGS2.

The first channel component CHP1 of each of the first channel structure CH1 and the second channel structure CH2 may extend from the second inflection point P2 corresponding thereto to penetrate the plurality of second interlayer insulating layers 135 and the plurality of second conductive patterns 141 of the second stacked body ST2. Each of the second conductive patterns 141 may surround the first channel structure CH1, and may continuously extend in the third direction DR3 to surround the second channel structure CH2.

The second channel component CHP2 of each of the first channel structure CH1 and the second channel structure CH2 may extend from the first inflection point P1 corresponding thereto to penetrate the first interlayer insulating layer 133 and the first conductive patterns 131 of the first stacked body ST1. The second channel component CHP2 may couple the select channel component CHS to the first channel component CHP1. The second channel component CHP2 may protrude from the first inflection point P1 and the second inflection point P2 towards the side portion of the first stacked body ST1. Each of the first conductive patterns 131 may surround the first channel structure CH1 between the first inflection point P1 and the second inflection point P2, and may continuously extend in the third direction DR3 to surround the second channel structure CH2.

The channel layer 163 may extend along respective sidewalls SW of the first channel structure CH1 and the second channel structure CH2.

Referring to FIG. 5C, the channel layer 163 may include an impurity region 163A and an intrinsic region 1638. The impurity region 163A may be a region adjacent to the capping pattern 169, and may include at least one of n-type impurities and p-type impurities. In an embodiment, the impurity region 163A may include n-type impurities same to those of the capping pattern 169. The intrinsic region 163B may be in a substantially intrinsic state. In an embodiment, the intrinsic region 163B may be an undoped region.

The memory layer 161 may include a blocking insulating layer 161A, a data storage layer 161B, and a tunnel insulating layer 161C. The blocking insulating layer 161A may include an insulating material capable of blocking the movement of charges. The data storage layer 161B may include a charge trap layer, a floating gate layer, conductive nanodots, a phase-change layer, etc. In an embodiment, the data storage layer 161B may include a charge-trap layer containing a silicon nitride. The tunnel insulating layer 161C may include an insulating material enabling charge tunneling.

Figure 6:
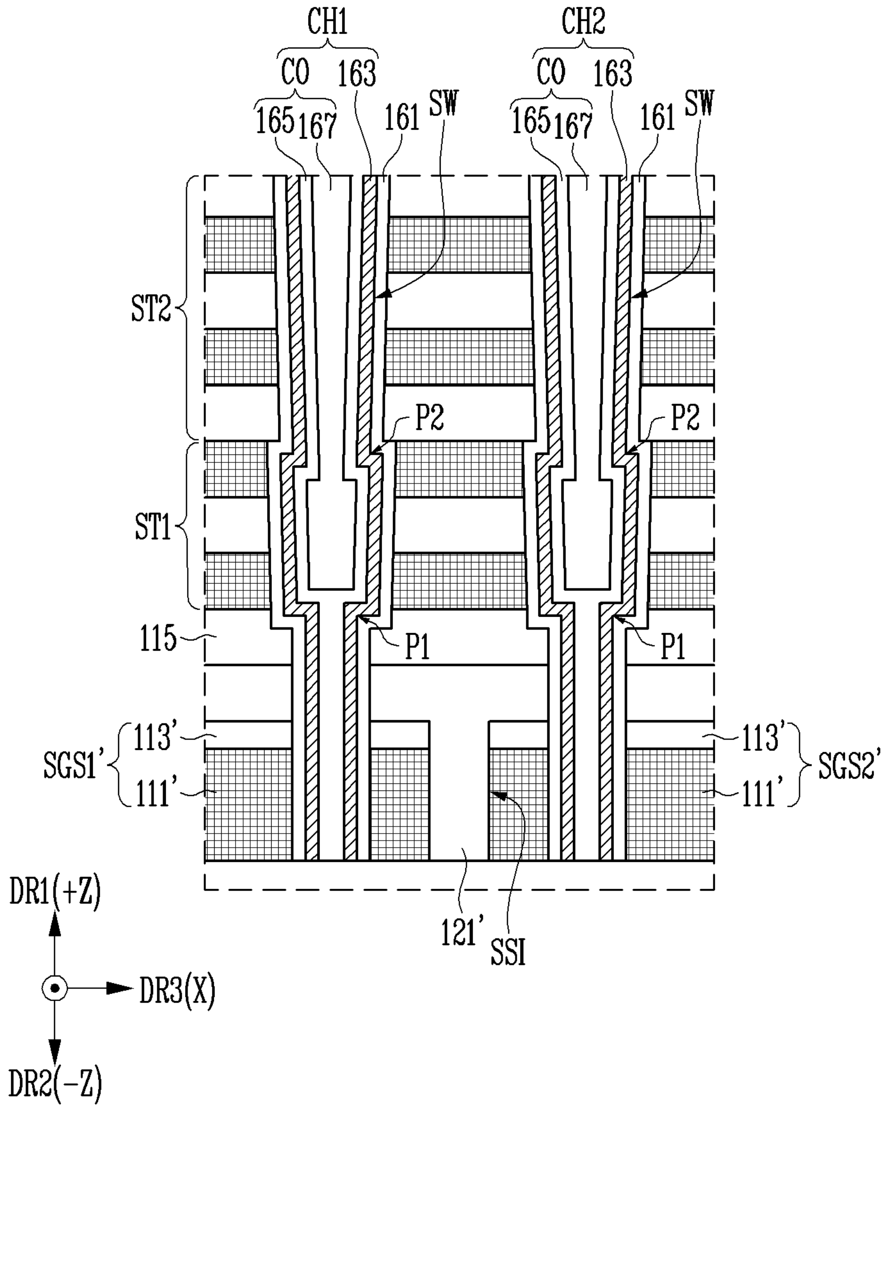
FIG. 6 is a sectional view illustrating a first select gate structure and a second select gate structure according to an embodiment of the present disclosure.

FIG. 6 is a sectional view illustrating a first select gate structure and a second select gate structure according to an embodiment of the present disclosure.

Referring to FIG. 6, a first select gate structure SGS1' and a second select gate structure SGS2' may be provided for the first source select line SSL1 and the second source select line SSL2, which are illustrated in FIG. 3B. Here, each of the first select gate structure SGS1' and the second select gate structure SGS2' may include a select gate pattern 111' disposed on a single layer. The select gate pattern 111' of the first select gate structure SGS1' may be used as the first source select line SSL1 illustrated in FIG. 3B, and the select gate pattern 111' of the second select gate structure SGS2' may be used as the second source select line SSL2 illustrated in FIG. 3B. The select gate pattern 111' may be formed to be thicker than the first conductive pattern 131 of the first stacked body ST1 and the second conductive pattern 141 of the second stacked body ST2. The embodiment of the present disclosure is not limited thereto, and the select gate pattern 111' may be formed at substantially the same thickness as the first conductive pattern 131 or the second conductive pattern 141.

Each of the first select gate structure SGS1' and the second select gate structure SGS2' may further include an inter-gate insulating layer 113' over the select gate pattern 111'.

A sub-block insulating layer 121' may be disposed in a sub-slit SSI. The sub-block insulating layer 121' may be interposed between the first select gate structure SGS1' and the second select gate structure SGS2, thus insulating the select gate patterns 111' of the first select gate structure SGS1' from the select gate patterns 111' of the second select gate structure SGS2'. The sub-block insulating layer 121' may extend upwards to the top of the inter-gate insulating layer 113'.

A sub-interlayer insulating layer 115 may be disposed over the sub-block insulating layer 121'. As described above with reference to FIG. 5A, the first stacked body ST1 and the second stacked body ST2 may be disposed over the sub-interlayer insulating layer 115. The first stacked body ST1 and the second stacked body ST2 may have the same configuration as that described above with reference to FIG. 5A.

The first channel structure CH1 may penetrate the first select gate structure SGS1, the first stacked body ST1, and the second stacked body ST2, and the second channel structure CH2 may penetrate the second select gate structure SGS2', the first stacked body ST1, and the second stacked body ST2. As described above with reference to FIG. 5A, each of the first channel structure CH1 and the second channel structure CH2 may include a channel layer 163 and a core insulating pattern CO, and the core insulating pattern CO may include a buffer layer 165 and a gap-fill layer 167. A memory layer 161 may surround a sidewall SW of the channel layer 163. As described above with reference to FIGS. 5A and 5B, the sidewall SW of the channel layer 163 may include a first inflection point P1 and a second inflection point P2. As described above with reference to FIGS. 5A and 5B, the first inflection point P1 and the second inflection point P2 may be defined by width variations for respective portions in each of the first channel structure CH1 and the second channel structure CH2.

Figure 7:
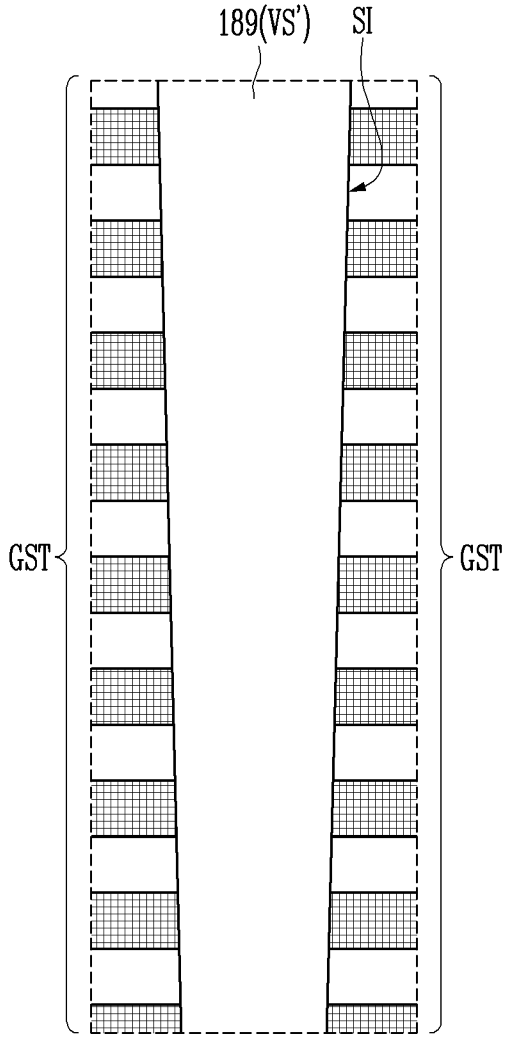
FIG. 7 is a sectional view illustrating a vertical structure according to an embodiment of the present disclosure.

FIG. 7 is a sectional view illustrating a vertical structure according to an embodiment of the present disclosure.

Referring to FIG. 7, a vertical structure VS' may be disposed in a slit SI dividing a gate stacked body GST. The vertical structure VS' may include a vertical insulating layer 189 which fills the slit SI. The vertical insulating layer 189 may include an insulating material such as a silicon oxide. The gate stacked body GST may include a first select gate structure SGS1, a second select gate structure SGS2, a first stacked body ST1, and a second stacked body ST2, described above with reference to FIG. 5A, or may include a first select gate structure SGS1', a second select gate structure SGS2', a first stacked body ST1, and a second stacked body ST2, described above with reference to FIG. 6.

Figure 8:
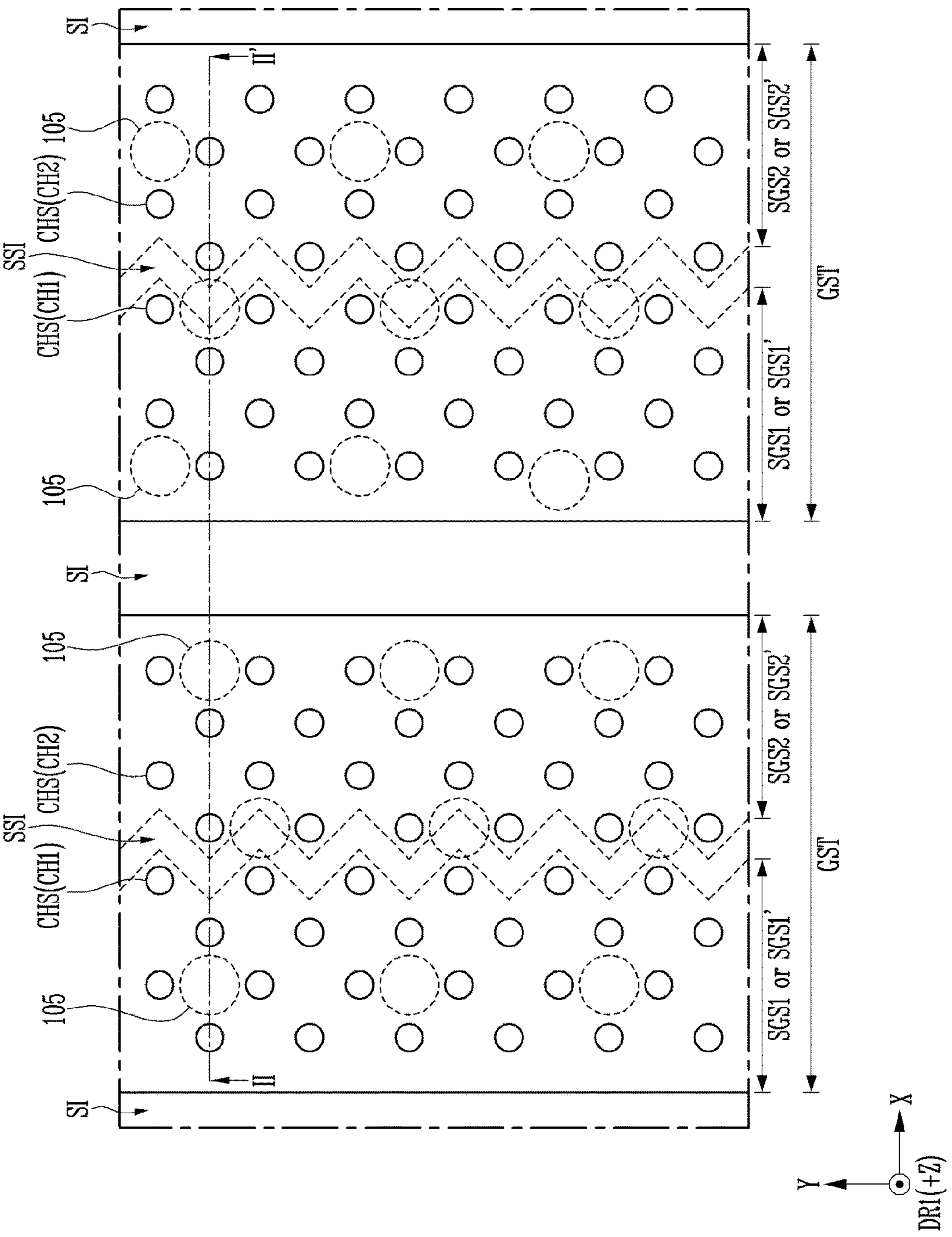
FIG. 8 is a plan view illustrating a portion of a semiconductor memory device according to an embodiment of the present disclosure.

FIG. 8 is a plan view illustrating a portion of a semiconductor memory device according to an embodiment of the present disclosure.

Referring to FIG. 8, the semiconductor memory device may include a plurality of support structures 105 overlapping a gate stacked body GST. The plurality of support structures 105 may be arranged on both sides of a slit SI dividing the gate stacked body GST. The plurality of support structures 105 may be spaced apart from each other in an XY plane.

The gate stacked body GST may include a first select gate structure SGS1 or SGS1' and a second select gate structure SGS2 or SGS2', which are separated from each other by a sub-slit SSI. In an embodiment, the first select gate structure SGS1 and the second select gate structure SGS2 may have the same configuration as those described above with reference to FIGS. 5A and 5B. Embodiments of the present disclosure are not limited thereto. For example, the first select gate structure SGS1' and the second select gate structure SGS2' may have the same configuration as those described above with reference to FIG. 6.

The first select gate structure SGS1 or SGS1' and the second select gate structure SGS2 or SGS2' may overlap the plurality of support structures 105 in the first direction DR1. Each support structure 105 may be formed to have a larger width than the select channel component CHS of the first channel structure CH1 and the select channel component CHS of the second channel structure CH2. The select channel component CHS of the first channel structure CH1 may penetrate the first select gate structure SGS1 or SGS1, and the select channel component CHS of the second channel structure CH2 may penetrate the second select gate structure SGS2 or SGS2'.

The cross-section of each support structure 105 taken along the XY plane may have any of various shapes, such as circular, elliptical, semicircular, polygonal shapes, and any combination thereof.

Figure 9A:
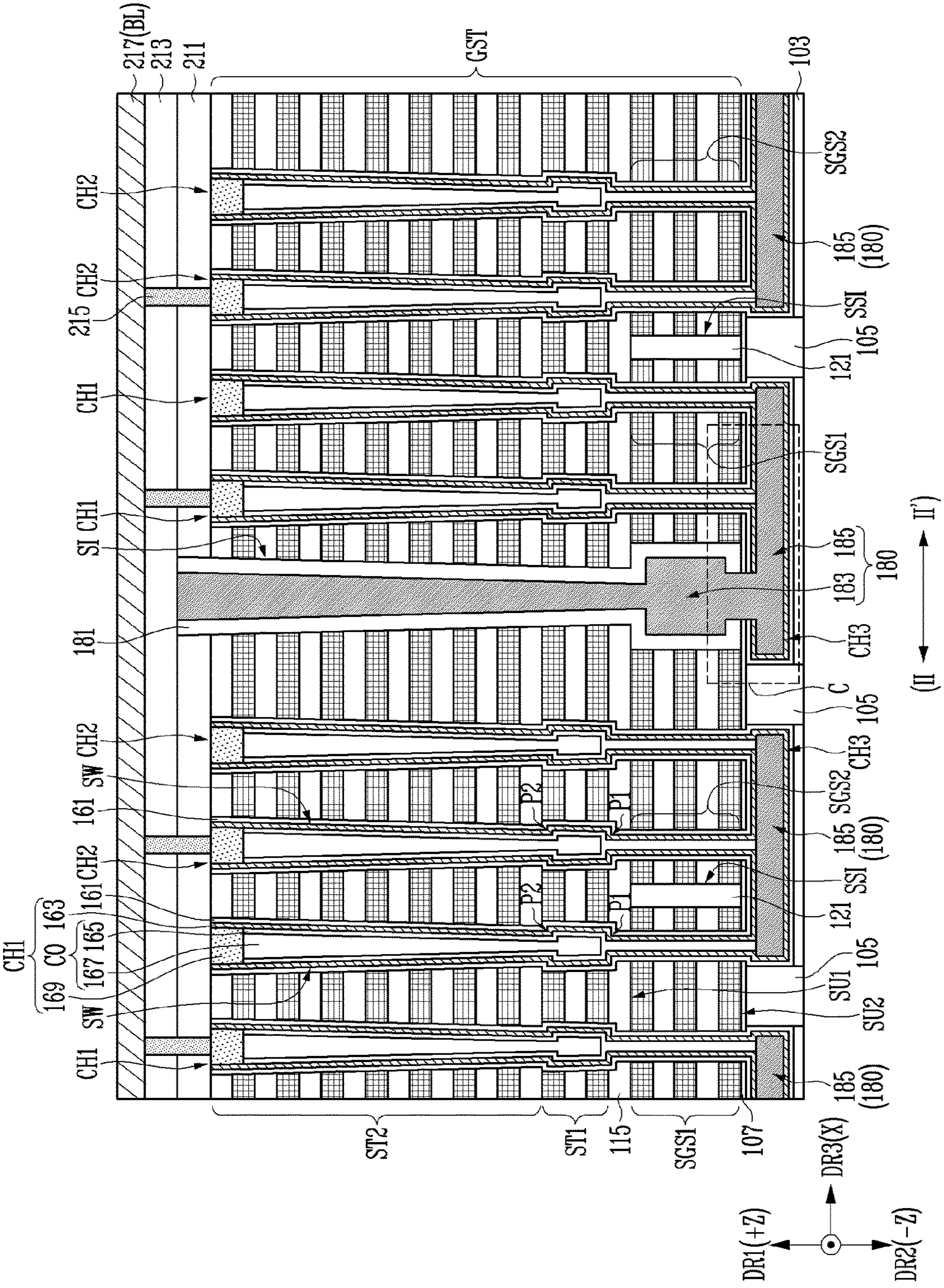
FIG. 9A is a sectional view of a semiconductor memory device taken along line II-II' of FIG. 8.
Figure 9B:
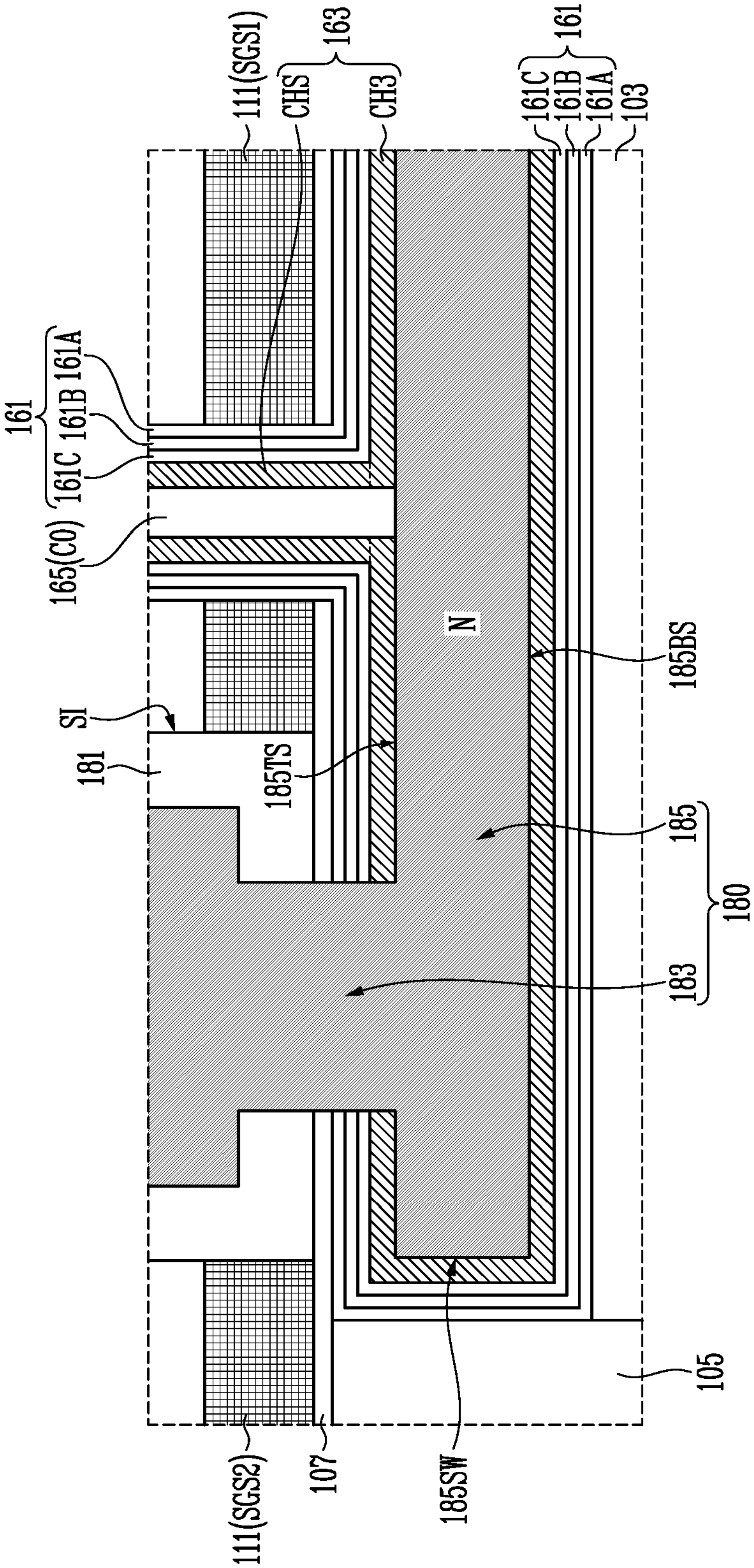
FIG. 9B is an enlarged sectional view of region C of FIG. 9A.

FIG. 9A is a sectional view of a semiconductor memory device taken along line II-II' of FIG. 8, and FIG. 9B is an enlarged sectional view of region C of FIG. 9A. FIGS. 9A and 9B illustrate a first select gate structure SGS1 and a second select gate structure SGS2, which have the same configuration as that described with reference to FIGS. 5A and 5B, but embodiments of the present disclosure are not limited thereto. For example, the first select gate structure SGS1 and the second select gate structure SGS2, illustrated in FIGS. 9A and 9B, may be replaced with the first select gate structure SGS1' and the second select gate structure SGS2, illustrated in FIG. 6.

Referring to FIG. 9A, a gate stacked body GST may be divided by a slit SI, and may include the first select gate structure SGS1, the second select gate structure SGS2, a sub-interlayer insulating layer 115, a first stacked body ST1, and a second stacked body ST2. Such a gate stacked body GST may have the same configuration as that described above with reference to FIG. 5A. A sub-block insulating layer 121 in a sub-slit SSI may also have the same configuration as that described above with reference to FIG. 5A. As described above with reference to FIG. 5A, a first surface SU1 and a second surface SU2 of the first select gate structure SGS1 may face a first direction DR1 and a second direction DR2 opposite each other.

The semiconductor memory device may further include a gate insulating layer 107 and a doped semiconductor layer 180. The doped semiconductor layer 180 may include a horizontal doped semiconductor pattern 185 and a source contact structure 183 extending from the horizontal doped semiconductor pattern 185. The horizontal doped semiconductor pattern 185 of the doped semiconductor layer 180 may face the second surface SU2 of the first select gate structure SGS1, and may extend in a third direction DR3 to overlap the sub-block insulating layer 121 and the second select gate structure SGS2.

The gate insulating layer 107 may be disposed between the horizontal doped semiconductor pattern 185 and the first select gate structure SGS1, and may extend to a space between the horizontal doped semiconductor pattern 185 and the second select gate structure SGS2.

Each of the first channel structure CH1 and the second channel structure CH2 may penetrate the gate insulating layer 107 to contact the horizontal doped semiconductor pattern 185. In other words, the first channel structure CH1 and the second channel structure CH2 may contact the horizontal doped semiconductor pattern 185, and may extend in a first direction DR1 to penetrate the gate insulating layer 107 and the gate stacked body GST. As described above with reference to FIGS. 5A and 5B, the sidewall SW of each of the first channel structure CH1 and the second channel structure CH2 may include a first inflection point P1 and a second inflection point P2. As described above with reference to FIG. 5A, each of the first channel structure CH1 and the second channel structure CH2 may include a channel layer 163, a core insulating pattern CO, and a capping pattern 169.

The channel layer 163 may be coupled to the horizontal doped semiconductor pattern 185 by penetrating the gate insulating layer 107. The channel layer 163 may include a pipe channel component CH3. The pipe channel component CH3 of the channel layer 163 may extend along the surface of the horizontal doped semiconductor pattern 185.

The core insulating pattern CO may be disposed on the horizontal doped semiconductor pattern 185. In an embodiment, the buffer layer 165 of the core insulating pattern CO may be disposed on the horizontal doped semiconductor pattern 185, and the gap-fill layer 167 of the core insulating pattern CO may overlap the horizontal doped semiconductor pattern 185 with the buffer layer 165 interposed therebetween.

The memory layer 161 may surround the sidewall SW of each of the first channel structure CH1 and the second channel structure CH2. The memory layer 161 may extend along the surface of the pipe channel component CH3.

The gate stacked body GST may be covered with a first upper insulating layer 211. A sidewall insulating layer 181 and the source contact structure 183 may extend in the first direction DR1 to penetrate the first upper insulating layer 211. The source contact structure 183 and the first upper insulating layer 211 may be covered with a second upper insulating layer 213. A conductive layer 217 for a bit line BL may be disposed on the second upper insulating layer 213. The bit line BL may be coupled to the first channel structure CH1 and the second channel structure CH2 through conductive vias 215 passing through the first upper insulating layer 211 and the second upper insulating layer 213. In an embodiment, the conductive vias 215 may be disposed between the respective capping patterns 169 of the first channel structure CH1 and the second channel structure CH2 and the bit line BL.

The semiconductor memory device may further include a lower insulating layer 103. The lower insulating layer 103 may overlap the gate stacked body GST with the horizontal doped semiconductor pattern 185 interposed therebetween. The memory layer 161 and the pipe channel component CH3 of the channel layer 163 may be interposed between the lower insulating layer 103 and the horizontal doped semiconductor pattern 185.

The plurality of support structures 105 may penetrate the lower insulating layer 103, and may contact the gate insulating layer 107. The memory layer 161, the pipe channel component CH3, and the horizontal doped semiconductor pattern 185 may surround the sidewall of each support structure 105. Each of the memory layer 161, the pipe channel component CH3, and the horizontal doped semiconductor pattern 185 may extend along the XY plane between the gate insulating layer 107 and the lower insulating layer 103.

Referring to FIG. 9B, the doped semiconductor layer 180 may include n-type impurities. In an embodiment, the doped semiconductor layer 180 may include n-type doped silicon. According to this, the horizontal doped semiconductor pattern 185 doped with n-type impurities may be coupled to the channel layer 163. The horizontal doped semiconductor pattern 185 doped with n-type impurities may be used for a GIDL erase method of inducing a GIDL current on the channel layer 163.

The source contact structure 183 of the doped semiconductor layer 180 may extend from the horizontal doped semiconductor pattern 185 into the slit SI by penetrating a portion of the pipe channel component CH3, the gate insulating layer 107, and the memory layer 161.

The horizontal doped semiconductor pattern 185 may include a bottom surface 185BS facing the lower insulating layer 103, a sidewall 185SW facing the support structure 105, and a top surface 185TS facing respective select gate patterns 111 of the first and second select gate structures SGS1 and SGS2.

The pipe channel component CH3 of the channel layer 163 may extend to surround the sidewall 185SW, the top surface 185TS, and the bottom surface 185BS of the horizontal doped semiconductor pattern 185. A partial region of the channel layer 163 adjacent to the horizontal doped semiconductor pattern 185 may include n-type impurities diffused from the horizontal doped semiconductor pattern 185. In an embodiment, the pipe channel component CH3 of the channel layer 163 may include n-type impurities. The embodiment of the present disclosure is not limited thereto, and in an example, n-type impurities may be diffused into the select channel component CHS of the channel layer 163.

As described above with reference to FIG. 5C, the memory layer 161 may include a blocking insulating layer 161A, a data storage layer 161B, and a tunnel insulating layer 161C. The blocking insulating layer 161A, the data storage layer 161B, and the tunnel insulating layer 161C may be interposed between each of the gate insulating layer 107, the support structure 105, and the lower insulating layer 103 and the pipe channel component CH3.

In an embodiment, the gate insulating layer 107 may be formed to be thinner than the memory layer 161 including the blocking insulating layer 161A, the data storage layer 161B, and the tunnel insulating layer 161C in order to secure turn-on characteristics of a source select transistor coupled to the select gate pattern 111. In an embodiment, the gate insulating layer 107 may be omitted. In this case, in an embodiment, insulating characteristics between the pipe channel component CH3 and the select gate pattern 111 may be secured through the memory layer 161 interposed between the pipe channel component CH3 and the select gate pattern 111.

Figure 10A:
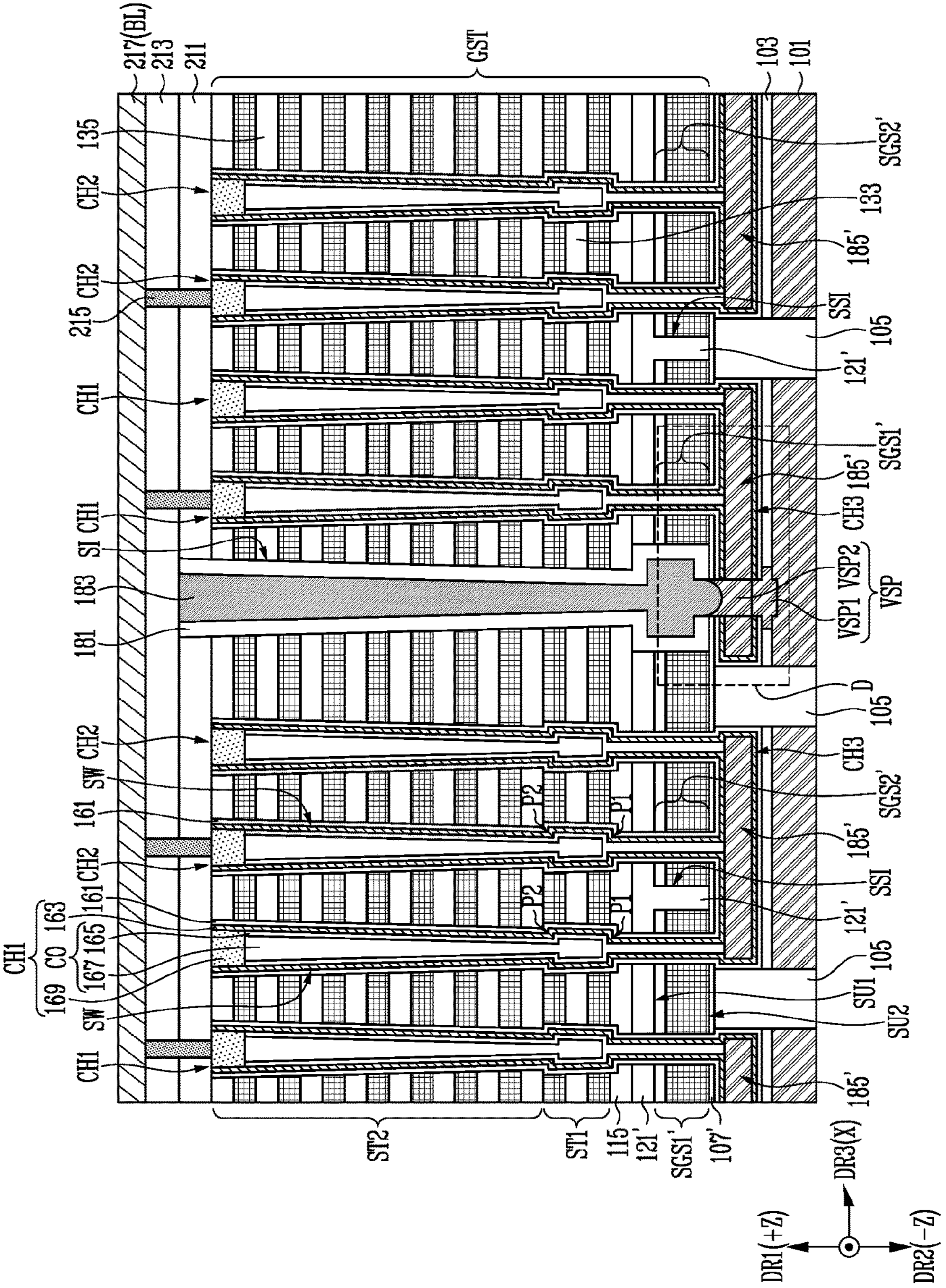
FIG. 10A is a sectional view of a semiconductor memory device according to an embodiment of the present disclosure.
Figure 10B:
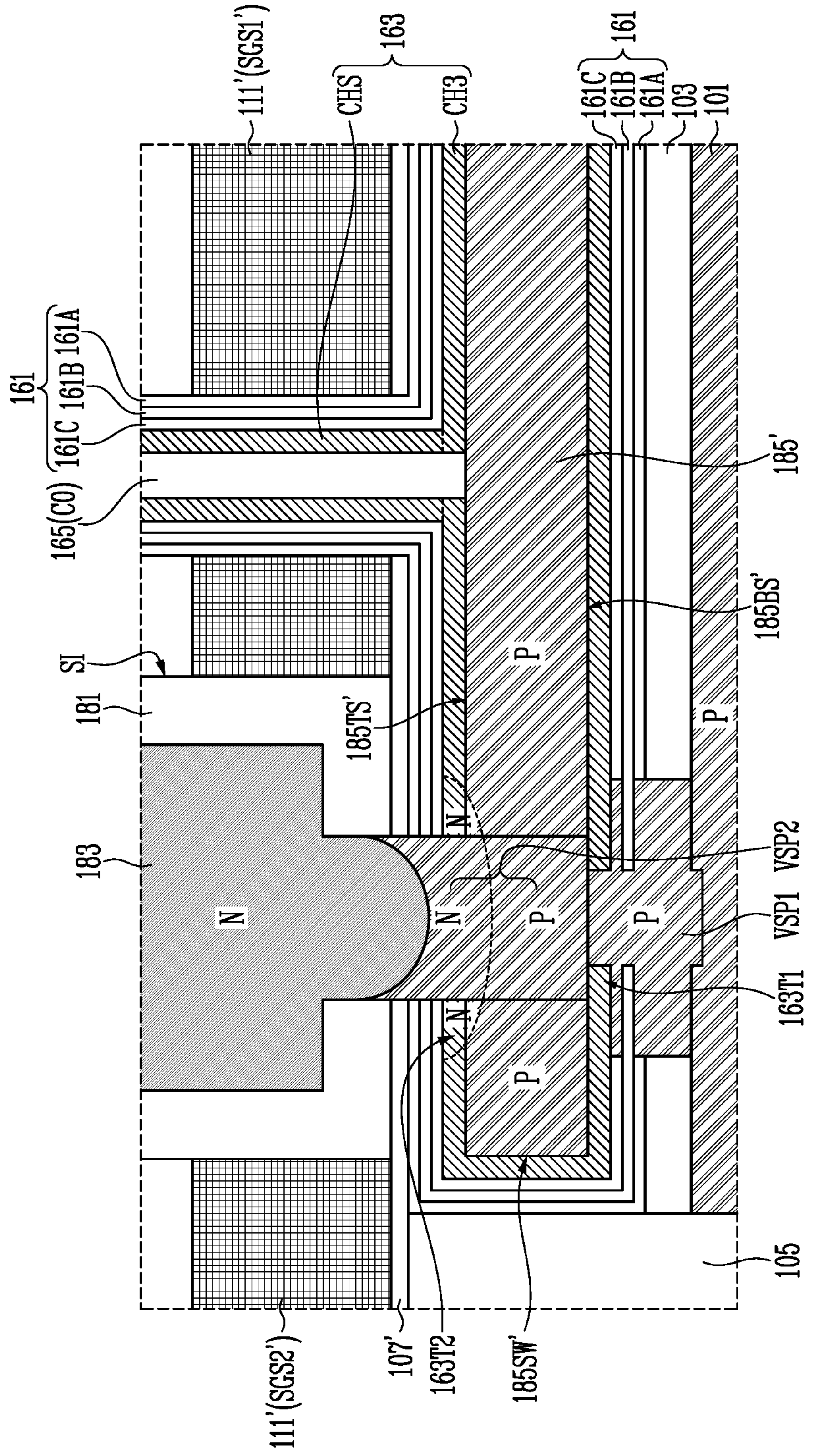
FIG. 10B is an enlarged sectional view of region D of FIG. 10A.

FIG. 10A is a sectional view of a semiconductor memory device according to an embodiment of the present disclosure, and FIG. 10B is an enlarged sectional view of region D of FIG. 10A. FIGS. 10A and 10B show a first select gate structure SGS1' and a second select gate structure SGS2', which have the same configuration as that described above with reference to FIG. 6, but embodiments of the present disclosure are not limited thereto. For example, the first select gate structure SGS1' and the second select gate structure SGS2', illustrated in FIGS. 10A and 10B, may be replaced with the first select gate structure SGS1 and the second select gate structure SGS2, illustrated in FIGS. 5A and 5B.

Referring to FIG. 10A, a gate stacked body GST may be divided by a slit SI, and may include the first select gate structure SGS1, the second select gate structure SGS2', a sub-interlayer insulating layer 115, a first stacked body ST1, and a second stacked body ST2. Such a gate stacked body GST may have the same configuration as that described above with reference to FIG. 6. A sub-block insulating layer 121' in a sub-slit SSI may also have the same configuration as that described above with reference to FIG. 6. As described above with reference to FIG. 5A, a first surface SU1 and a second surface SU2 of the first select gate structure SGS1' may face a first direction DR1 and a second direction DR2 opposite each other.

The semiconductor memory device may further include a gate insulating layer 107' and a horizontal semiconductor pattern 185'. The horizontal semiconductor pattern 185' may face the second surface SU2 of the first select gate structure SGS1, and may extend in a third direction DR3 to overlap the sub-block insulating layer 121' and the second select gate structure SGS2'.

The gate insulating layer 107' may be disposed between the horizontal semiconductor pattern 185' and the first select gate structure SGS1, and may extend to a space between the horizontal semiconductor pattern 185' and the second select gate structure SGS2'. The gate insulating layer 107' may be formed to be thinner than the first interlayer insulating layer 133 of the first stacked body ST1 and the second interlayer insulating layer 135 of the second stacked body ST2. The gate insulating layer 107' may include an insulating material such as a silicon oxide.

Each of the first channel structure CH1 and the second channel structure CH2 may penetrate the gate insulating layer 107' to contact the horizontal semiconductor pattern 185'. As described above with reference to FIGS. 5A and 5B, the sidewall SW of each of the first channel structure CH1 and the second channel structure CH2 may include a first inflection point P1 and a second inflection point P2. As described above with reference to FIG. 5A, each of the first channel structure CH1 and the second channel structure CH2 may include a channel layer 163, a core insulating pattern CO, and a capping pattern 169.

The channel layer 163 may be coupled to the horizontal semiconductor pattern 185' by penetrating the gate insulating layer 107'. The channel layer 163 may include a pipe channel component CH3, as described above with reference to FIG. 9A.

The core insulating pattern CO may be disposed on the horizontal semiconductor pattern 185'. In an embodiment, the buffer layer 165 of the core insulating pattern CO may be disposed on the horizontal semiconductor pattern 185, and the gap-fill layer 167 of the core insulating pattern CO may overlap the horizontal semiconductor pattern 185' with the buffer layer 165 interposed therebetween.

The memory layer 161 may surround the sidewall SW of each of the first channel structure CH1 and the second channel structure CH2. The memory layer 161 may extend along the surface of the pipe channel component CH3.

As described above with reference to FIG. 9A, a first upper insulating layer 211, a second upper insulating layer 213, a conductive layer 217 for a bit line BL, and conductive vias 215 may be disposed above the gate stacked body GST.

The semiconductor memory device may further include a lower insulating layer 103 and a lower conductive layer 101. The lower conductive layer 101 may overlap the gate stacked body GST with the horizontal semiconductor pattern 185' interposed therebetween. The lower insulating layer 103 may be disposed between the horizontal semiconductor pattern 185' and the lower conductive layer 101. The lower conductive layer 101 may include a semiconductor layer doped with p-type impurities.

The memory layer 161 and the pipe channel component CH3 of the channel layer 163 may be interposed between the lower insulating layer 103 and the horizontal semiconductor pattern 185'.

A plurality of support structures 105 may penetrate the lower insulating layer 103 and the lower conductive layer 101, and may contact the gate insulating layer 107'. The memory layer 161, the pipe channel component CH3, and the horizontal semiconductor pattern 185' may surround the sidewall of each support structure 105. Each of the memory layer 161, the pipe channel component CH3, and the horizontal semiconductor pattern 185' may extend along an XY plane between the gate insulating layer 107' and the lower insulating layer 103.

The horizontal semiconductor pattern 185', the memory layer 161, the pipe channel component CH3, and the gate insulating layer 107' may be penetrated by a vertical semiconductor pattern VSP. The lower conductive layer 101 may be coupled to the channel layer 163 via the vertical semiconductor pattern VSP. A source contact structure 183 may be coupled to the vertical semiconductor pattern VSP, and may extend from the vertical semiconductor pattern VSP into the slit SI.

The vertical semiconductor pattern VSP may include a first vertical semiconductor pattern VSP1 and a second vertical semiconductor pattern VSP2. The first vertical semiconductor pattern VSP1 may extend from the lower conductive layer 101 in the first direction DR1. The first vertical semiconductor pattern VSP1 may penetrate the memory layer 161 and the channel layer 163 between the lower insulating layer 103 and the horizontal semiconductor pattern 185' as well as penetrating the lower insulating layer 103. The second vertical semiconductor pattern VSP2 may extend from the first vertical semiconductor pattern VSP1 to contact the source contact structure 183. The horizontal semiconductor pattern 185' may surround the second vertical semiconductor pattern VSP2.

Each of the horizontal semiconductor pattern 185, the first vertical semiconductor pattern VSP1, and the second vertical semiconductor pattern VSP2 may be formed of a semiconductor material such as silicon or germanium. Each of the horizontal semiconductor pattern 185, the first vertical semiconductor pattern VSP1, and the second vertical semiconductor pattern VSP2 may be formed of a polycrystalline layer, an epitaxial layer, or a monocrystalline layer. In an embodiment, each of the horizontal semiconductor pattern 185' and the first vertical semiconductor pattern VSP1 may be formed of a polycrystalline silicon layer, and the second vertical semiconductor pattern VSP2 may be formed of an epitaxial silicon layer. Embodiments of the present disclosure are not limited thereto. In an embodiment, the horizontal semiconductor pattern 185, the first vertical semiconductor pattern VSP1, and the second vertical semiconductor pattern VSP2 may be formed of an integrated epitaxial silicon layer or an integrated polycrystalline silicon layer.

As described above with reference to FIG. 9A, a sidewall insulating layer 181 and the source contact structure 183 may extend to penetrate the first upper insulating layer 211.

Referring to FIG. 10B, each of the horizontal semiconductor pattern 185' and the first vertical semiconductor pattern VSP1 may be formed of a first doped semiconductor layer, and the source contact structure 183 may be formed of a second doped semiconductor layer. In an embodiment, each of the horizontal semiconductor pattern 185' and the first vertical semiconductor pattern VSP1 may be formed of a p-type doped semiconductor layer, and the source contact structure 183 may be formed of an n-type doped semiconductor layer. The p-type doped semiconductor layer may include p-type doped silicon, and the n-type doped semiconductor layer may include n-type doped silicon.

The second vertical semiconductor pattern VSP2 may include a first region doped with p-type impurities, and a second region doped with n-type impurities. The first region may be adjacent to the horizontal semiconductor pattern 185' and the first vertical semiconductor pattern VSP1, and the second region may be adjacent to the source contact structure 183. In an embodiment, the second vertical semiconductor pattern VSP2 may include a doped silicon layer formed of the structure of a PN diode.

In accordance with an embodiment of the present disclosure, the channel layer 163 may include a region contacting a structure doped with p-type impurities and a region contacting a structure doped with n-type impurities. In an embodiment, the channel layer 163 may include a first terminal 163T1 that contacts the first vertical semiconductor pattern VSP1 doped with p-type impurities, and a second terminal 163T2 that contacts a second region of the second vertical semiconductor pattern VSP2 doped with n-type impurities. Accordingly, during an erase operation, the channel layer 163 may be supplied with holes through the first terminal 163T1, and thus the semiconductor memory device according to an embodiment of the present disclosure may perform the erase operation using a well-erase method. During a read operation or a verify operation, a current path, which goes through the second terminal 163T2 of the channel layer 163 and the source contact structure 183, may be provided.

One of the second vertical semiconductor pattern VSP2 and the source contact structure 183 may penetrate the pipe channel component CH3, the memory layer 161, and the gate insulating layer 107'. In an embodiment, the second vertical semiconductor pattern VSP2 may contact the source contact structure 183 by penetrating a portion of the pipe channel component CH3 adjacent to the gate insulating layer 107', a portion of the memory layer 161 adjacent to the gate insulating layer 107', and the gate insulating layer 107'.

The horizontal semiconductor pattern 185' may include a bottom surface 185BS' facing the lower insulating layer 103, a sidewall 185SW facing the support structure 105, and a top surface 185TS' facing respective select gate patterns 111' of the first and second select gate structures SGS1' and SGS2'. The pipe channel component CH3 of the channel layer 163 may extend to surround the sidewall 185SW', the top surface 185TS', and the bottom surface 185BS' of the horizontal semiconductor pattern 185'. A partial region of the channel layer 163 adjacent to the horizontal semiconductor pattern 185' may include p-type impurities diffused from the horizontal semiconductor pattern 185'. In an embodiment, the pipe channel component CH3 of the channel layer 163 may include p-type impurities (i.e., P). A partial region of the channel layer 163 adjacent to the source contact structure 183 may include n-type impurities diffused from the source contact structure 183. In an embodiment, the second terminal 163T2 of the channel layer 163 may include n-type impurities (i.e., N).

As described above with reference to FIG. 5C, the memory layer 161 may include a blocking insulating layer 161A, a data storage layer 161B, and a tunnel insulating layer 161C. The blocking insulating layer 161A, the data storage layer 161B, and the tunnel insulating layer 161C may be interposed between each of the gate insulating layer 107, the support structure 105, and the lower insulating layer 103 and the pipe channel component CH3.

As described above with reference to FIG. 9B, the gate insulating layer 107' may be formed to be thinner than the memory layer 161, or may be omitted.

The first vertical semiconductor pattern VSP1 may protrude to a space between the lower conductive layer 101 and the data storage layer 161B, and between the data storage layer 161B and the pipe channel component CH3.

Figure 11:
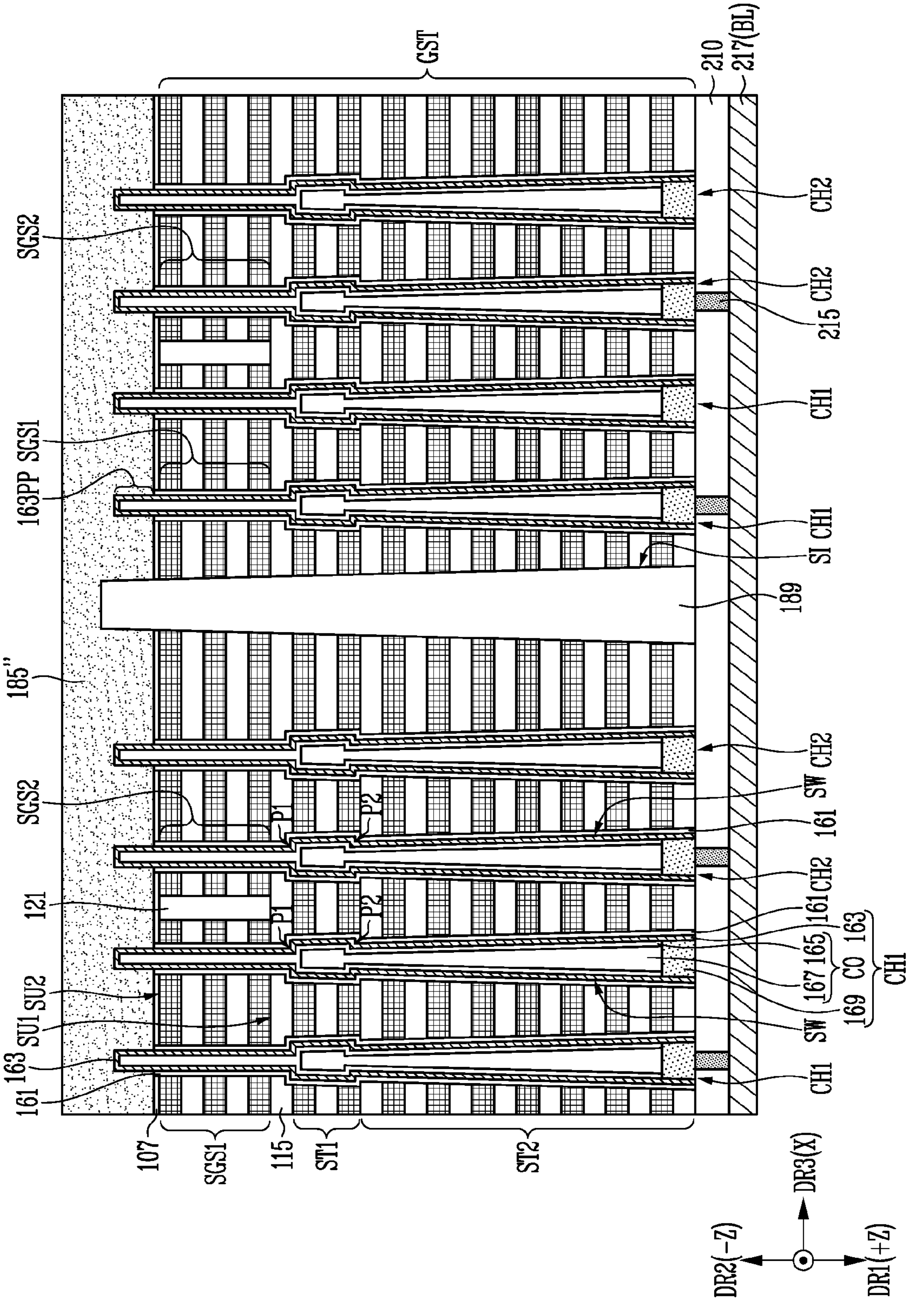
FIG. 11 is a sectional view of a semiconductor memory device according to an embodiment of the present disclosure.

FIG. 11 is a sectional view of a semiconductor memory device according to an embodiment of the present disclosure. FIG. 11 illustrates a first select gate structure SGS1 and a second select gate structure SGS2, which have the same configuration as that described above with reference to FIGS. 5A and 5B, but embodiments of the present disclosure are not limited thereto. In an embodiment, the first select gate structure SGS1 and the second select gate structure SGS2, illustrated in FIG. 11, may be replaced with the first select gate structure SGS1' and the second select gate structure SGS2, illustrated in FIG. 6.

Referring to FIG. 11, a gate stacked body GST may include the first select gate structure SGS1, the second select gate structure SGS2, a sub-interlayer insulating layer 115, a first stacked body ST1, and a second stacked body ST2. Such a gate stacked body GST may have the same configuration as that described above with reference to FIG. 5A. As described above with reference to FIG. 5A, a sub-block insulating layer 121 may be interposed between the first select gate structure SGS1 and the second select gate structure SGS2. As described above with reference to FIG. 5A, a first surface SU1 and a second surface SU2 of the first select gate structure SGS1 may face a first direction DR1 and a second direction DR2 opposite each other.

As described above with reference to FIG. 7, a slit SI dividing the gate stacked body GST may be filled with a vertical insulating layer 189.

The semiconductor memory device may further include a gate insulating layer 107 and a horizontal doped semiconductor pattern 185". The horizontal doped semiconductor pattern 185" may face the second surface SU2 of the first select gate structure SGS1, and may extend in a third direction DR3 to overlap the sub-block insulating layer 121 and the second select gate structure SGS2.

The gate insulating layer 107 may be disposed between the horizontal doped semiconductor pattern 185" and the first select gate structure SGS1, and may extend to a space between the horizontal doped semiconductor pattern 185" and the second select gate structure SGS2.

Each of a first channel structure CH1 and a second channel structure CH2 may penetrate the gate insulating layer 107 to contact the horizontal doped semiconductor pattern 185". As described above with reference to FIGS. 5A and 5B, the sidewall SW of each of the first channel structure CH1 and the second channel structure CH2 may include a first inflection point P1 and a second inflection point P2. As described above with reference to FIG. 5A, each of the first channel structure CH1 and the second channel structure CH2 may include a channel layer 163, a core insulating pattern CO, and a capping pattern 169.

The channel layer 163 may contact the horizontal doped semiconductor pattern 185" by penetrating the gate insulating layer 107. The channel layer 163 may include a protrusion 163PP protruding higher than the first select gate structure SGS1 and the second select gate structure SGS2 in a second direction DR2. The protrusion 163PP of the channel layer 163 may contact the horizontal doped semiconductor pattern 185", and may be inserted into a groove in the horizontal doped semiconductor pattern 185". The protrusion 163PP of the channel layer 163 may extend to a space between the end of the core insulating pattern CO facing the second direction DR2 and the horizontal doped semiconductor pattern 185". In this case, the end of the core insulating pattern CO facing the horizontal doped semiconductor pattern 185" may be closed by the channel layer 163.

As described above with reference to FIG. 5A, the core insulating pattern CO may include a buffer layer 165 and a gap-fill layer 167.

The memory layer 161 may surround the sidewall SW of each of the first channel structure CH1 and the second channel structure CH2. The channel layer 163 and the core insulating pattern CO may protrude higher than the memory layer 161 in the second direction DR2.

An insulating layer 210 may be disposed on the bit line-side surface of the gate stacked body GST facing the first direction DR1. A conductive layer 217 for a bit line BL may be disposed on the insulating layer 210. As described above with reference to FIG. 9A, the bit line BL may be coupled to the first channel structure CH1 and the second channel structure CH2 via conductive vias 215 passing through the insulating layer 210.

The horizontal doped semiconductor pattern 185" may include at least one of an n-type doped semiconductor layer and a p-type doped semiconductor layer. In an embodiment, the horizontal doped semiconductor pattern 185" may be formed of an n-type doped semiconductor layer that surrounds the protrusion 163PP of the channel layer 163. In this case, the n-type doped semiconductor layer may be used for a gate-induced drain leakage (GIDL) erase method of inducing a GIDL current on the channel layer 163. In an embodiment, the horizontal doped semiconductor pattern 185" may include an n-type doped semiconductor layer that surrounds the sidewall of the protrusion 163PP, and a p-type doped semiconductor layer that contacts the end of the protrusion 163PP. In this case, in an embodiment, the p-type doped semiconductor layer may be used for a well-erase operation of supplying holes to the channel layer 163.

The structure illustrated in FIGS. 5A to 5C, the structure illustrated in FIGS. 9A and 9B, the structure illustrated in FIGS. 10A and 10B, or the structure illustrated in FIG. 11 may overlap the peripheral circuit structure 40, as illustrated in FIGS. 2A and 2B.

FIGS. 12A to 12C, FIGS. 13A to 13G, FIGS. 14A and 14B, and FIGS. 15A to 15D are sectional views illustrating a method of manufacturing a semiconductor memory device according to an embodiment of the present disclosure.

Figure 12A:
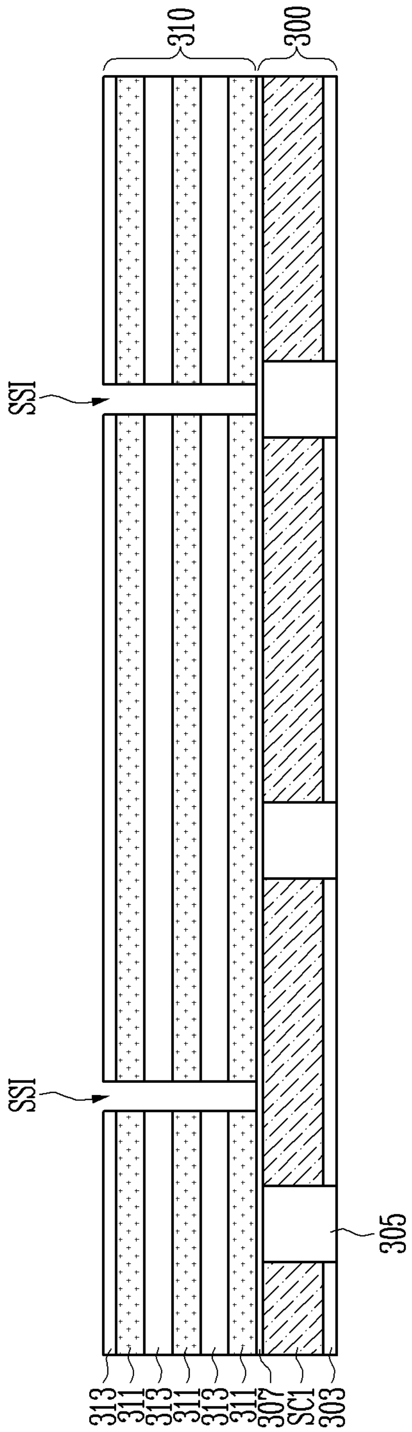
FIGS. 12A, 12B, and 12C, FIGS. 13A, 13B, 13C, 13D, 13E, 13F, and 13G, FIGS. 14A and 14B, and FIGS. 15A, 15B, 15C, and 15D are sectional views illustrating a method for manufacturing a semiconductor memory device according to an embodiment of the present disclosure.
Figure 12B:
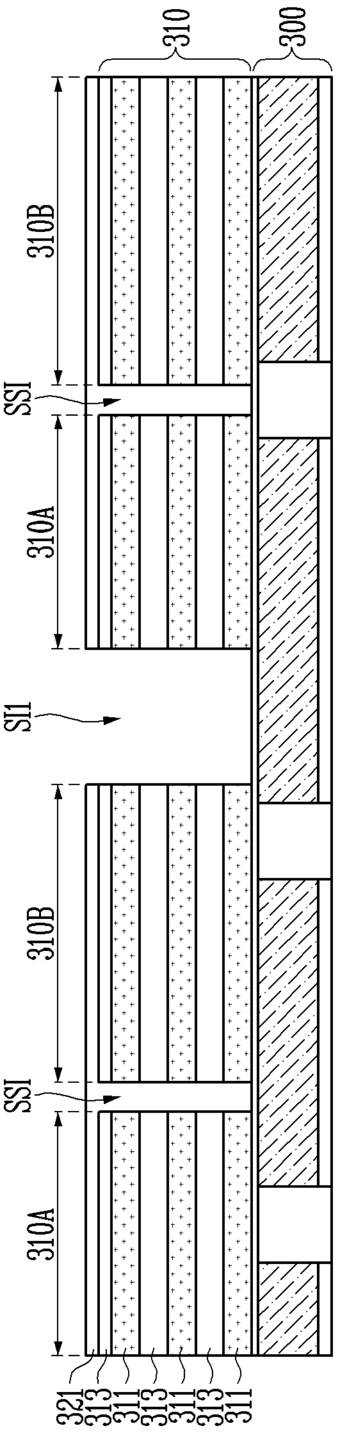
Figure 12C:
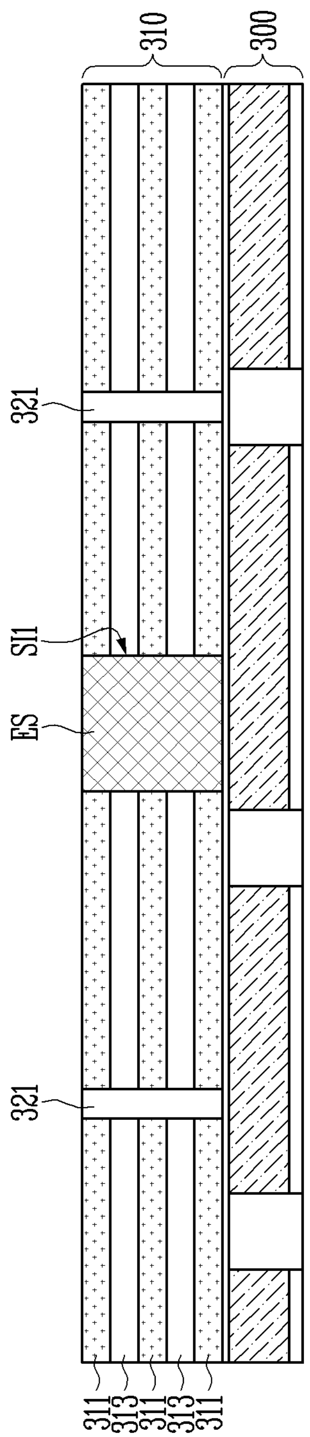

FIGS. 12A to 12C are sectional views illustrating processes of separating a preliminary select structure into a plurality of preliminary select gate structures.

Referring to FIG. 12A, a preliminary select structure 310 may be formed over a lower structure 300. The lower structure 300 may be disposed over the peripheral circuit structure 40 illustrated in FIG. 2A. The lower structure 300 may include a lower insulating layer 303, a first sacrificial layer SC1, a plurality of support structures 305, and a gate insulating layer 307. The plurality of support structures 305 may penetrate the first sacrificial layer SC1 and the lower insulating layer 303. The gate insulating layer 307 may cover the first sacrificial layer SC1 and the plurality of support structures 305. Each of the lower insulating layer 303, the plurality of support structures 305, and the gate insulating layer 307 may include an insulating material such as a silicon oxide. The first sacrificial layer SC1 may include a material having an etch selectivity with respect to those of the lower insulating layer 303 and the plurality of support structures 305 so that the first sacrificial layer SC1 may be selectively removed. In an embodiment, the first sacrificial layer SC1 may include silicon.

The preliminary select structure 310 may include at least one lower first material layer 311 and at least one lower second material layer 313, which are alternately stacked over the lower structure 300. The lower first material layer 311 may be formed of a material different from that of the lower second material layer 313. In an embodiment, the lower first material layer 311 may include a conductive layer including at least one of a doped semiconductor layer, a metal layer, and a conductive metal nitride layer, and the lower second material layer 313 may include an insulating layer made of a silicon oxide or the like. In an embodiment, the lower first material layer 311 may include a sacrificial material that may be etched with an etch selectivity with respect to the lower second material layer 313 under specific etching conditions. In an embodiment, the sacrificial material of the lower first material layer 311 may include a silicon nitride, and the lower second material layer 313 may include a silicon oxide.

Thereafter, a plurality of sub-slits SSI may be formed to pass through the preliminary select structure 310.

Referring to FIG. 12B, a sub-block insulating layer 321 may be formed to fill the plurality of sub-slits SSI. The sub-block insulating layer 321 may include an insulating material such as a silicon oxide. The sub-block insulating layer 321 may extend to cover the top surface of the preliminary select structure 310.

Next, a lower slit SI1 may be formed between the sub-slits SSI neighboring each other. The lower slit SI1 may pass through the sub-block insulating layer 321 and the preliminary select structure 310. The preliminary select structure 310 may be separated into a plurality of preliminary select gate structures by the sub-slits SSI and the lower slit SI1. In an embodiment, the plurality of preliminary select gate structures may include first preliminary select gate structures 310A and second preliminary select gate structures 310B. As the preliminary select structure 310 disposed on both sides of the lower slit SI1 is separated by the sub-slits SSI, the first preliminary select gate structures 310A and the second preliminary select gate structures 310B may be defined.

Referring to FIG. 12C, an etch stop layer ES may be formed in the lower slit SI1. Here, a planarization process may be performed such that the lower first material layer 311 of the preliminary select structure 310 is exposed. The etch stop layer ES may include a material having an etch selectivity with respect to the lower first material layer 311 and the lower second material layer 313. The etch stop layer ES may include at least one of a metal layer and a metal nitride layer. In an embodiment, the etch stop layer ES may include tungsten.

FIGS. 13A to 13G are sectional views illustrating a process of forming a first preliminary stacked body, a process of forming a second preliminary stacked body, and a process of forming a first channel structure and a second channel structure.

Figure 13A:
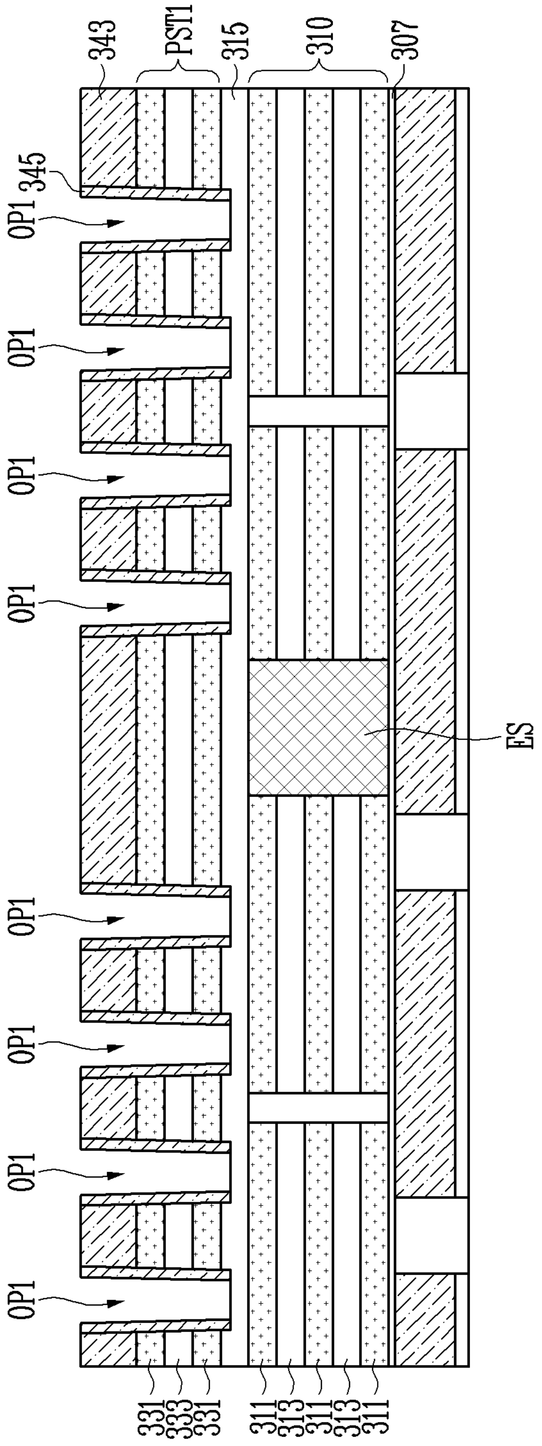

Referring to FIG. 13A, a first preliminary stacked body PST1 may be formed over the preliminary select structure 310, the sub-block insulating layer 321, and the etch stop layer ES. The first preliminary stacked body PST1 may be formed after a sub-interlayer insulating layer 315 is formed. The sub-interlayer insulating layer 315 may cover the preliminary select structure 310, the sub-block insulating layer 321, and the etch stop layer ES. The first preliminary stacked body PST1 may include at least one intermediate first material layer 331 and at least one intermediate second material layer 333, which are alternately stacked over the sub-interlayer insulating layer 315. The intermediate first material layer 331 may include the same material as the lower first material layer 311. The sub-interlayer insulating layer 315 and the intermediate second material layer 333 may include the same material as the lower second material layer 313.

Then, a mask pattern 343 including a plurality of holes may be formed over the first preliminary stacked body PST1. Thereafter, the intermediate first material layer 331 and the intermediate second material layer 333 in the first preliminary stacked body PST1 may be etched through an etching process that uses the mask pattern 343 as an etching barrier. In this way, a plurality of openings OP1 passing through the first preliminary stacked body PST1 may be formed. The sub-interlayer insulating layer 315 may be exposed through the plurality of first openings OP1.

Subsequently, a spacer layer 345 may be formed on the sidewall of the mask pattern 343 and the sidewall of each first opening OP1. The spacer layer 345 may include the same material as the mask pattern 343. In embodiment, each of the spacer layer 345 and the mask pattern 343 may include silicon. A deposition thickness of the spacer layer 345 may be controlled such that the spacer layer 345 does not fill a central region of each first opening OP1.

Figure 13B:
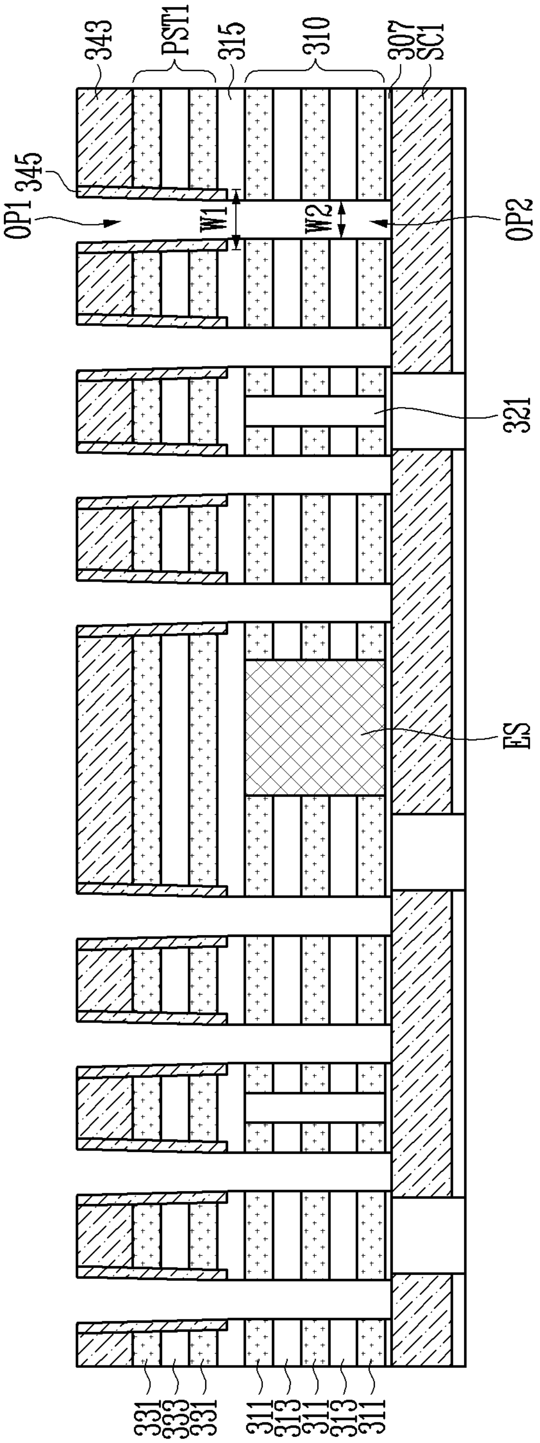

Referring to FIG. 13B, the sub-interlayer insulating layer 315, the lower first material layer 311, the lower second material layer 313, and the gate insulating layer 307 may be etched through an etching process that uses the spacer layer 345 as an etching barrier. Here, the first sacrificial layer SC1 may be used as an etch stop layer. In this way, a plurality of openings OP2 may be formed to pass through the sub-interlayer insulating layer 315, the preliminary select structure 310, and the gate insulating layer 307.

The first width W1 of each first opening OP1 may be limited to critical dimension attributable to restrictions in a photolithography process. The second width W2 of each second opening OP2 may be formed to be less than the first width W1 by controlling the deposition thickness of the spacer layer 345. Accordingly, the second width W2 of each second opening OP2 may be formed to be less than critical dimension attributable to restrictions in a photolithography process.

Figure 13C:
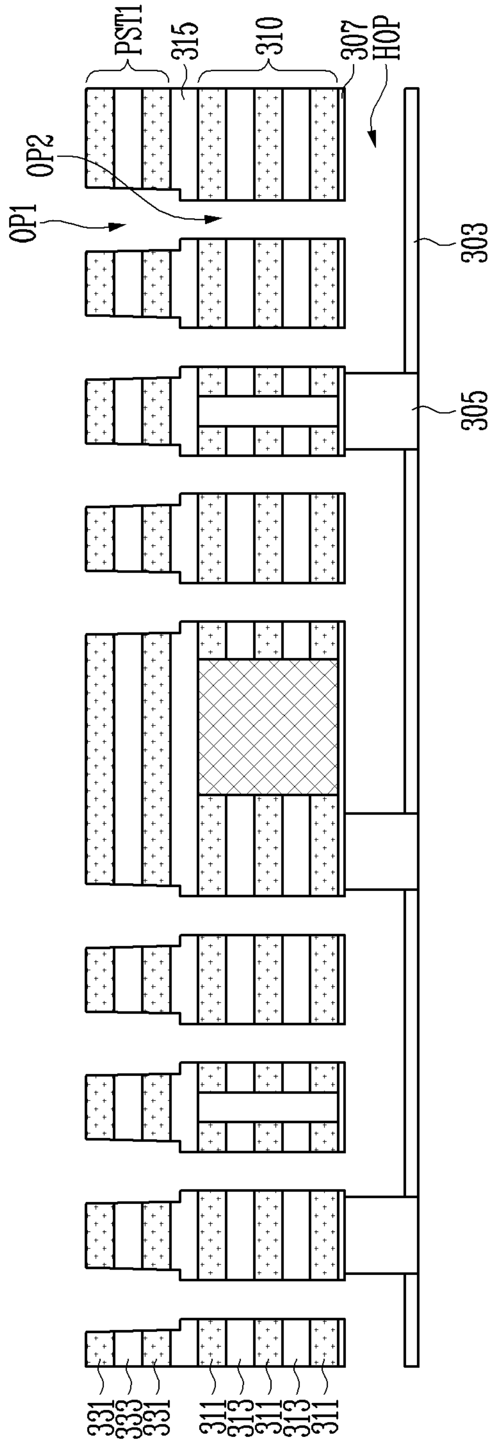

Referring to FIG. 13C, the first sacrificial layer SC1 illustrated in FIG. 13B may be selectively removed through the plurality of second openings OP2. The spacer layer 345 and the mask pattern 343 illustrated in FIG. 13B may be removed while the first sacrificial layer SC1 illustrated in FIG. 13B is removed.

The region from which the first sacrificial layer SC1 illustrated in FIG. 13B is removed may be defined as a horizontal opening HOP. The horizontal opening HOP may be defined between the lower insulating layer 303 and the gate insulating layer 307. A gap between the gate insulating layer 307 and the lower insulating layer 303 may be maintained by the plurality of support structures 305.

Figure 13D:
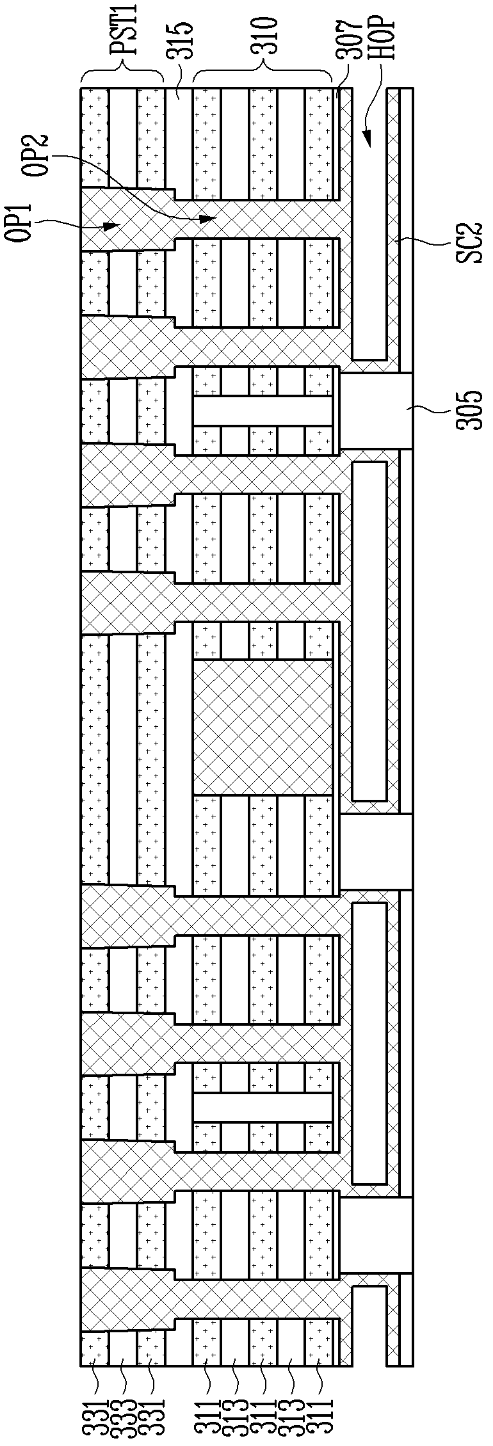

Referring to FIG. 13D, a second sacrificial layer SC2 may be formed in the plurality of first openings OP1, the plurality of second openings OP2, and the horizontal opening HOP. The second sacrificial layer SC2 may extend from the inside of the first openings OP1 into the second openings OP2 coupled to the first openings OP1, and may extend from the inside of the second openings OP2 along the surface of the horizontal opening HOP.

The second sacrificial layer SC2 may include a material having an etch selectivity with respect to the lower insulating layer 303, the lower first material layer 311, the lower second material layer 313, the sub-interlayer insulating layer 315, the intermediate first material layer 331, and the intermediate second material layer 333. The second sacrificial layer SC2 may include at least one of a metal layer and a metal nitride layer. In an embodiment, the second sacrificial layer SC2 may include a titanium nitride formed along respective surfaces of the plurality of first openings OP1, the plurality of second openings OP2, and the horizontal opening HOP, and tungsten on the titanium nitride.

Figure 13E:
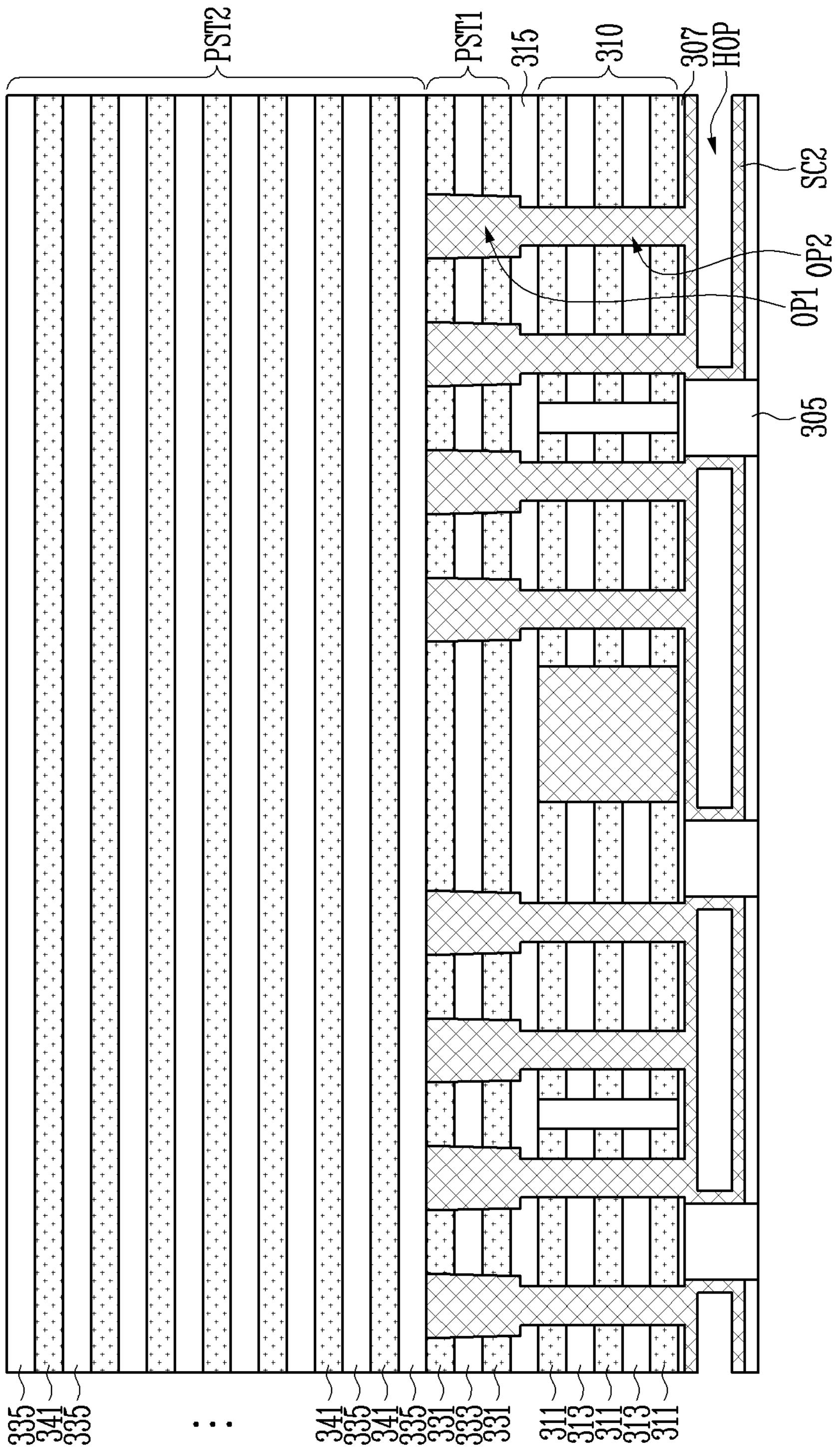

Referring to FIG. 13E, a second preliminary stacked body PST2 may be formed over the first preliminary stacked body PST1. The second preliminary stacked body PST2 may include a plurality of upper first material layers 341 and a plurality of upper second material layers 335, which are alternately stacked over the first preliminary stacked body PST1.

Each of the upper first material layers 341 may include the same material as the lower first material layer 311. Each of the upper second material layers 335 may include the same material as the lower second material layer 313.

Figure 13F:
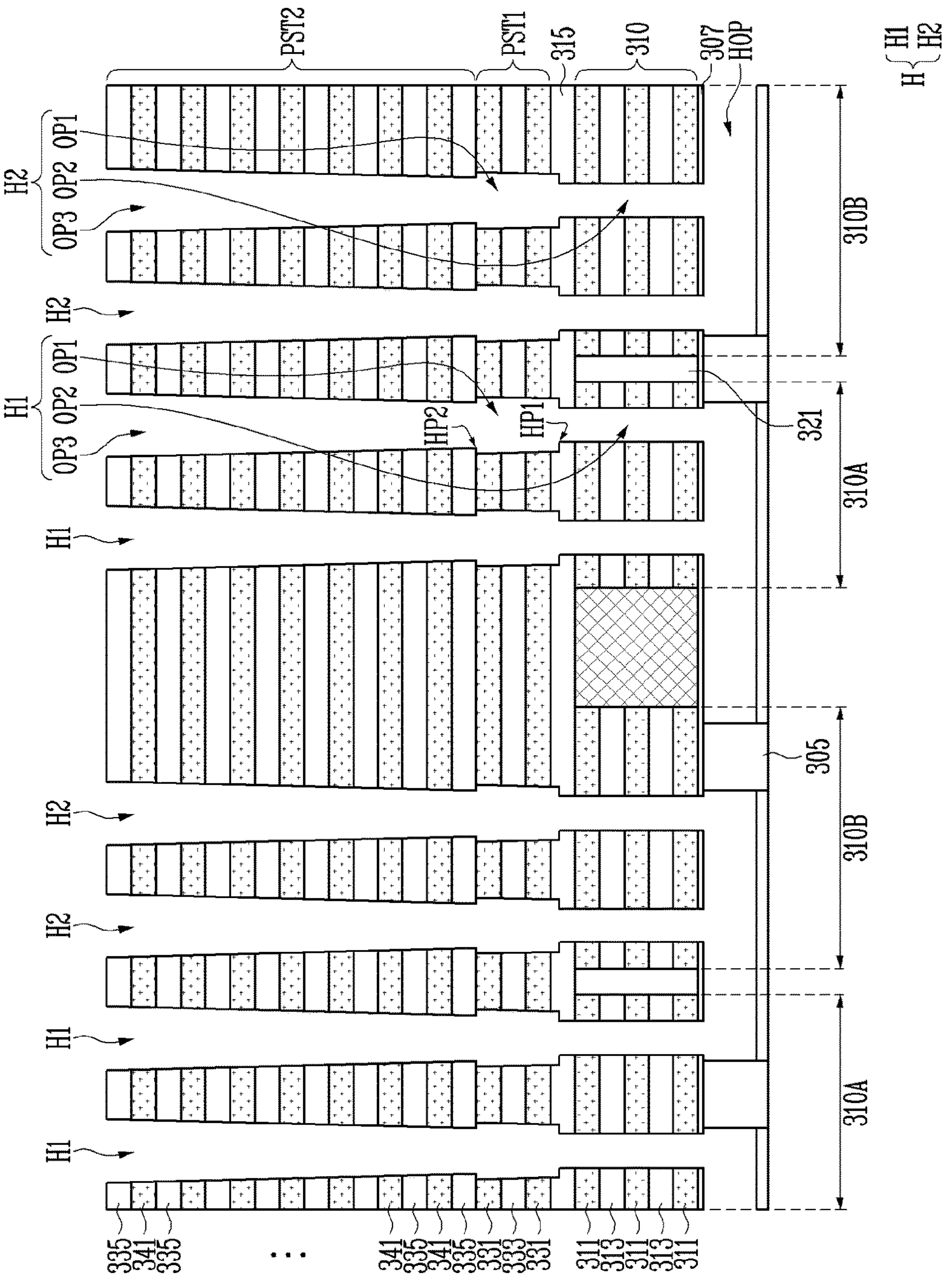

Referring to FIG. 13F, a plurality of third openings OP3 may be formed by etching the plurality of upper first material layers 341 and the plurality of upper second material layers 335 of the second preliminary stacked body PST2. The plurality of third openings OP3 may pass through the second preliminary stacked body PST2. The second sacrificial layer SC2 illustrated in FIG. 13E may be exposed through the plurality of third openings OP3. Next, the second sacrificial layer SC2 illustrated in FIG. 13E may be removed through the plurality of third openings OP3. In this way, the horizontal opening HOP, the plurality of first openings OP1, and the plurality of second openings OP2 may be exposed.

A plurality of channel holes H may be defined by the plurality of first openings OP1, the plurality of second openings OP2, and the plurality of third openings OP3. Each of the channel holes H may include a first opening OP1, a second opening OP2, and a third opening OP3, which are coupled to each other and are aligned in a line. Each of the channel holes H may include a first inflection point HP1 and a second inflection point HP2. The first inflection point HP1 may be defined at a boundary between the first opening OP1 and the second opening OP2. In accordance with an embodiment of the present disclosure, the first opening OP1 may pass through the first preliminary stacked body PST1, and may be disposed at a level higher than the sub-block insulating layer 321. Accordingly, the first inflection point HP1 may be disposed at a level between the first preliminary stacked body PST1 and the sub-block insulating layer 321. The second inflection point HP2 may be defined at a boundary between the first opening OP1 and the third opening OP3. In accordance with an embodiment of the present disclosure, the second inflection point HP2 may be located farther away from the preliminary select structure 310 than the first inflection point HP1. The first opening OP1 may protrude from the first inflection point HP1 and the second inflection point HP2 in a direction intersecting the plurality of channel holes H.

The plurality of channel holes H may include a first channel hole H1 and a second channel hole H2, which are disposed on both sides of the sub-block insulating layer 321. The first channel hole H1 may pass through the first preliminary select gate structure 310A, and the second channel hole H2 may pass through the second preliminary select gate structure 310B.

The plurality of channel holes H may be coupled to each other through the horizontal opening HOP.

Figure 13G:
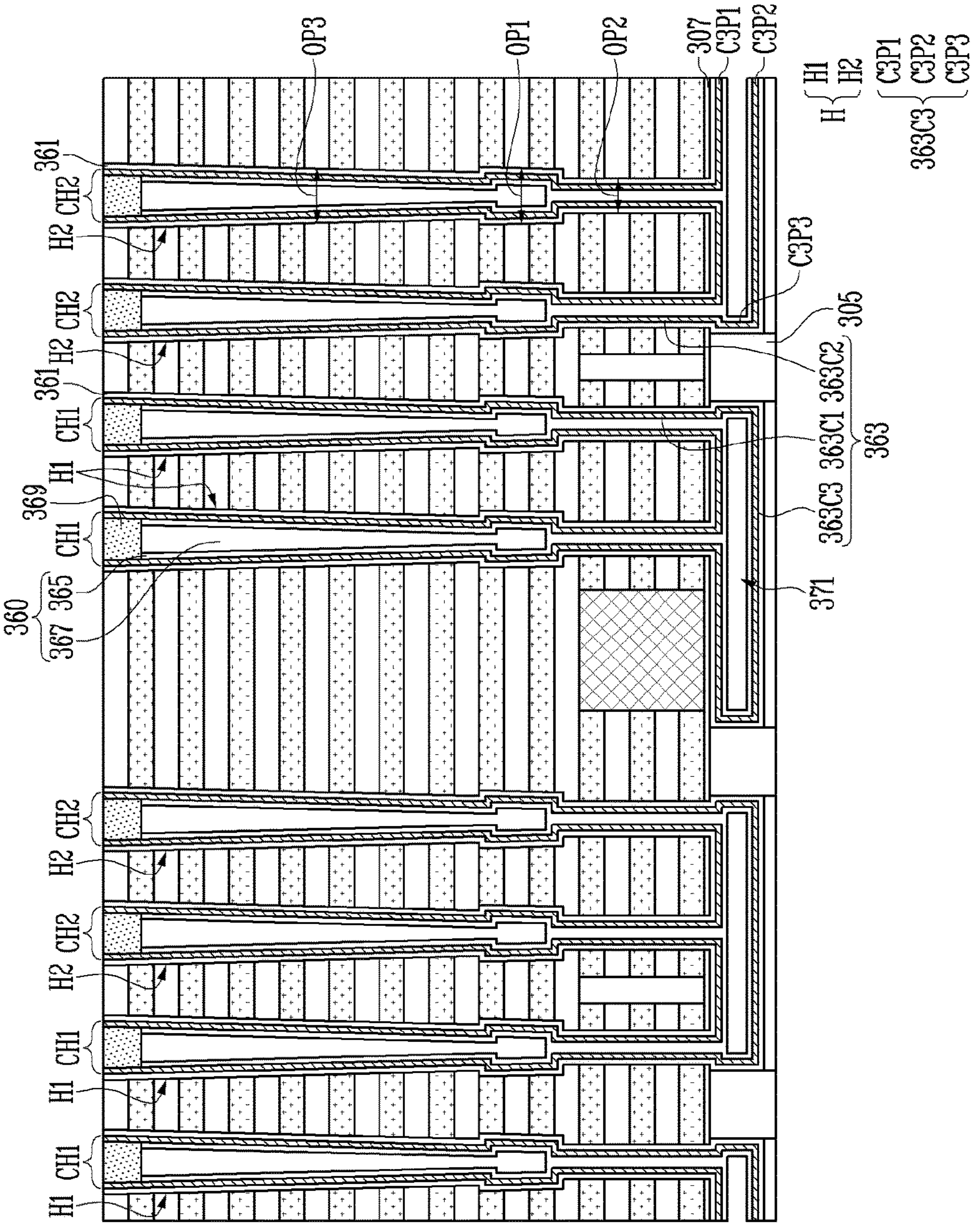

Referring to FIG. 13G, a memory layer 361 may be formed along surfaces of the plurality of channel holes H and the horizontal opening HOP. As described above with reference to FIG. 5C, the memory layer 361 may include a blocking insulating layer, a data storage layer, and a tunnel insulating layer. The memory layer 361 may extend to surround the sidewall of each support structure 305.

Thereafter, a channel layer 363 may be formed on the memory layer 361. The channel layer 363 may be formed of a semiconductor material such as silicon or germanium. The channel layer 363 may include a first column portion 363C1 in the first channel hole H1, a second column portion 363C2 in the second channel hole H2, and a pipe channel component 363C3 in the horizontal opening HOP. The pipe channel component 363C3 may extend to surround the sidewall of the support structure 305, and may couple the first column portion 363C1 to the second column portion 363C2. The pipe channel component 363C3 may include a first horizontal portion C3P1, a second horizontal portion C3P2, and a vertical portion C3P3. The first horizontal portion C3P1 may be adjacent to the gate insulating layer 307, and the second horizontal portion C3P2 may face the first horizontal portion C3P1. The first horizontal portion C3P1 and the second horizontal portion C3P2 may extend along an XY plane illustrated in FIG. 8. The vertical portion C3P3 may couple the first horizontal portion C3P1 to the second horizontal portion C3P2, and may surround the sidewall of the support structure 305.

Thereafter, an insulating structure 360 may be formed in each of the plurality of channel holes H. The insulating structure 360 may include at least one insulating layer. In an embodiment, the insulating structure 360 may include a buffer layer 365 and a gap-fill layer 367. The buffer layer 365 may be formed on the channel layer 363. The buffer layer 365 may be an insulating layer formed through a deposition method such as atomic layer deposition (ALD) or chemical vapor deposition (CVD). In each channel hole H, a central region of the second opening OP2 may be filled with the buffer layer 365. Here, a hollow portion 371 surrounded with the buffer layer 365 may be defined in a central region of the horizontal opening HOP. The gap-fill layer 367 may include a silicon oxide formed by oxidizing a fluent substance such as polysilazane (PSZ). The gap-fill layer 367 may be formed using a spin-on-coating (SOC) scheme. The gap-fill layer 367 may fill the central region of the first opening OP1 in each channel hole H, and may fill a portion of the central region of the third opening OP3.

Thereafter, a capping pattern 369 may be formed in each of the plurality of channel holes H. The capping pattern 369 may be disposed on the insulating structure 360. The capping pattern 369 may include a doped semiconductor layer including at least one of n-type impurities and p-type impurities. In an embodiment, the capping pattern 369 may include an n-type doped silicon layer.

Through the above-described process, a first channel structure CH1 disposed in the first channel hole H1 and a second channel structure CH2 disposed in the second channel hole H2 may be provided. Each of the first channel structure CH1 and the second channel structure CH2 may include a sidewall surrounded with the memory layer 361. Each of the first channel structure CH1 and the second channel structure CH2 may include the channel layer 363, the insulating structure 360, and the capping pattern 369.

Figure 14A:
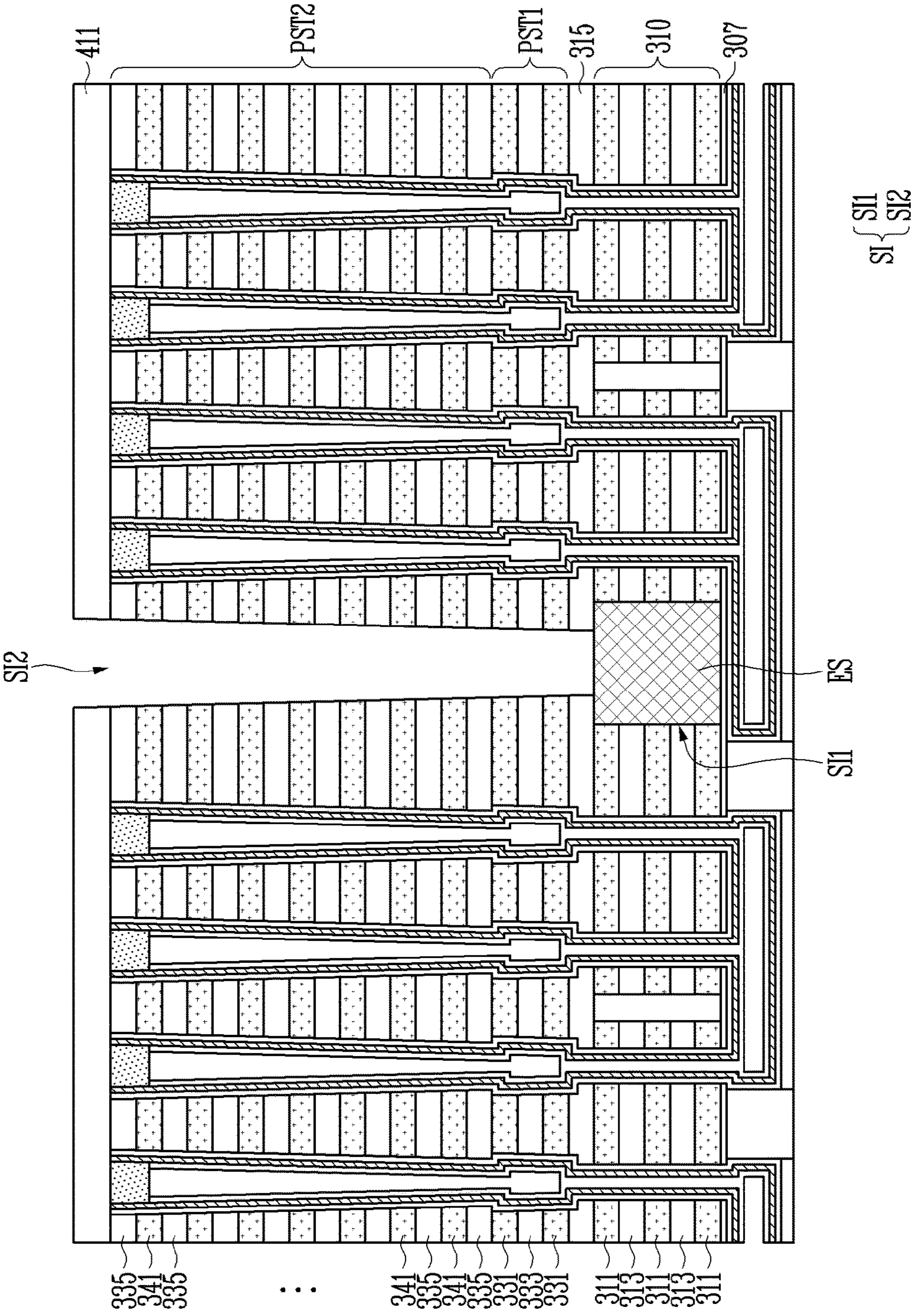
Figure 14B:
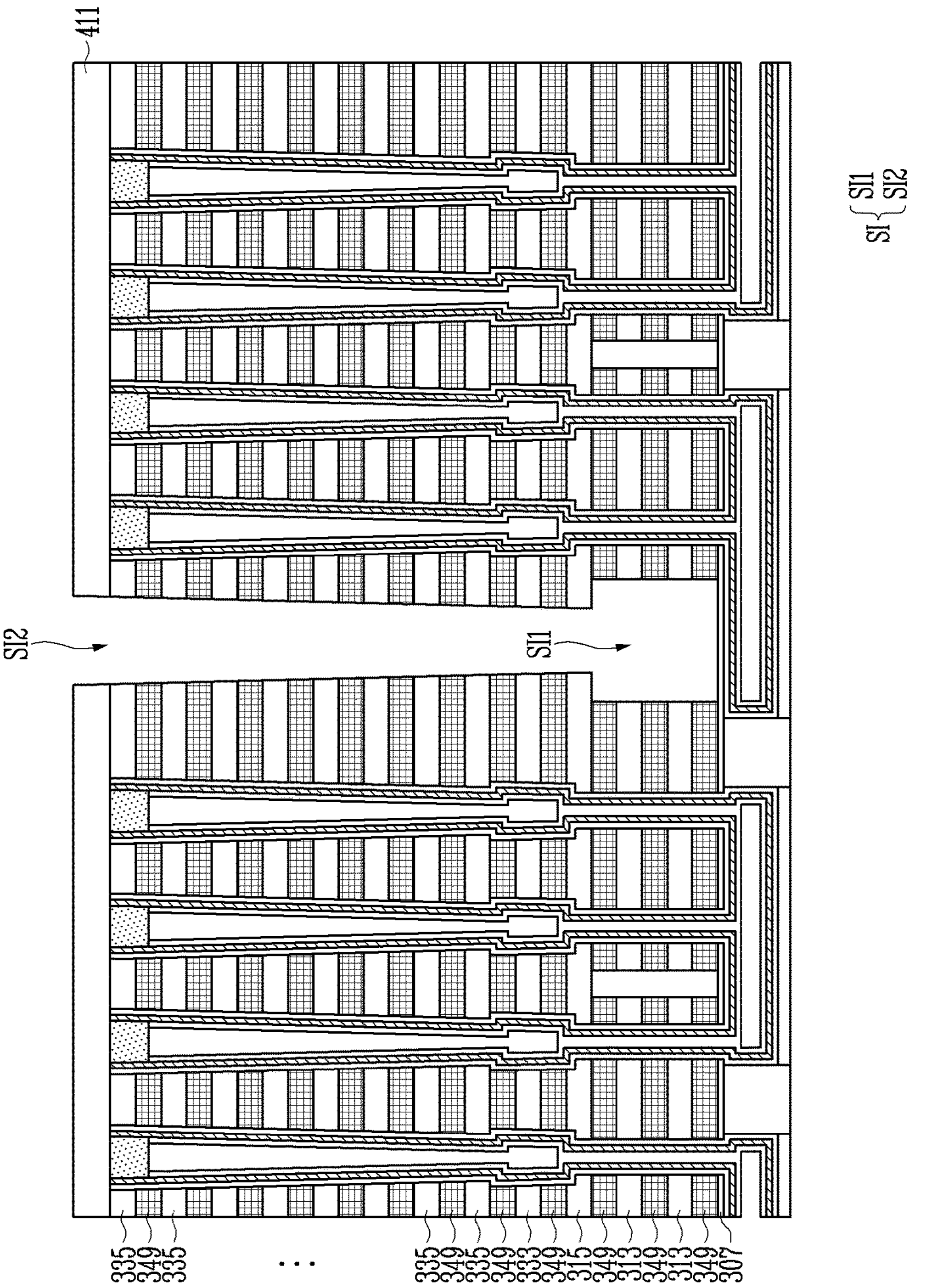

FIGS. 14A and 14B are sectional views illustrating a process of forming a gate stacked body.

Referring to FIG. 14A, a first upper insulating layer 411 may be formed over the second preliminary stacked body PST2. Then, an upper slit SI2 may be formed by etching the first upper insulating layer 411 and the plurality of upper first material layers 341 and the plurality of upper second material layers 335 of the second preliminary stacked body PST2. The upper slit SI2 may pass through the second preliminary stacked body PST2, and an etch stop layer ES may define the bottom surface of the upper slit SI2. The lower slit SI1 and the upper slit SI2 may form a slit SI.

Each of the lower first material layer 311, the intermediate first material layer 331, and the plurality of upper first material layers 341 may be formed of a conductive material, and each of the lower second material layer 313, the intermediate second material layer 333, and the plurality of upper second material layers 335 may be formed of a silicon oxide. In this case, the lower first material layer 311, the intermediate first material layer 331, the plurality of upper first material layers 341, the lower second material layer 313, the intermediate second material layer 333, and the plurality of upper second material layers 335, which are divided by the slit SI, may form the gate stacked body.

Each of the lower first material layer 311, the intermediate first material layer 331, and the plurality of upper first material layers 341 may be formed of a silicon nitride, and each of the lower second material layer 313, the intermediate second material layer 333, and the plurality of upper second material layers 335 may be formed of a silicon oxide. In this case, in order to form the gate stacked body, the process illustrated in FIG. 14B may be performed.

Referring to FIG. 14B, the etch stop layer ES illustrated in FIG. 14A may be selectively removed through the upper slit SI2. Thereafter, through the slit SI configured as a connection structure of the upper slit SI2 and the lower slit SI1, the lower first material layer 311, the intermediate first material layer 331, and the plurality of upper first material layers 341 illustrated in FIG. 14A may be replaced with the plurality of conductive patterns 349. In this case, the gate stacked body may include the plurality of conductive patterns 349, the lower second material layer 313, the intermediate second material layer 333, and the plurality of upper second material layers 335. The plurality of conductive patterns 349 may correspond to the select gate pattern, the first conductive pattern, and the second conductive pattern, described above with reference to FIG. 5A.

FIGS. 15A to 15D are sectional views illustrating a process of forming a horizontal doped semiconductor pattern.

Figure 15A:
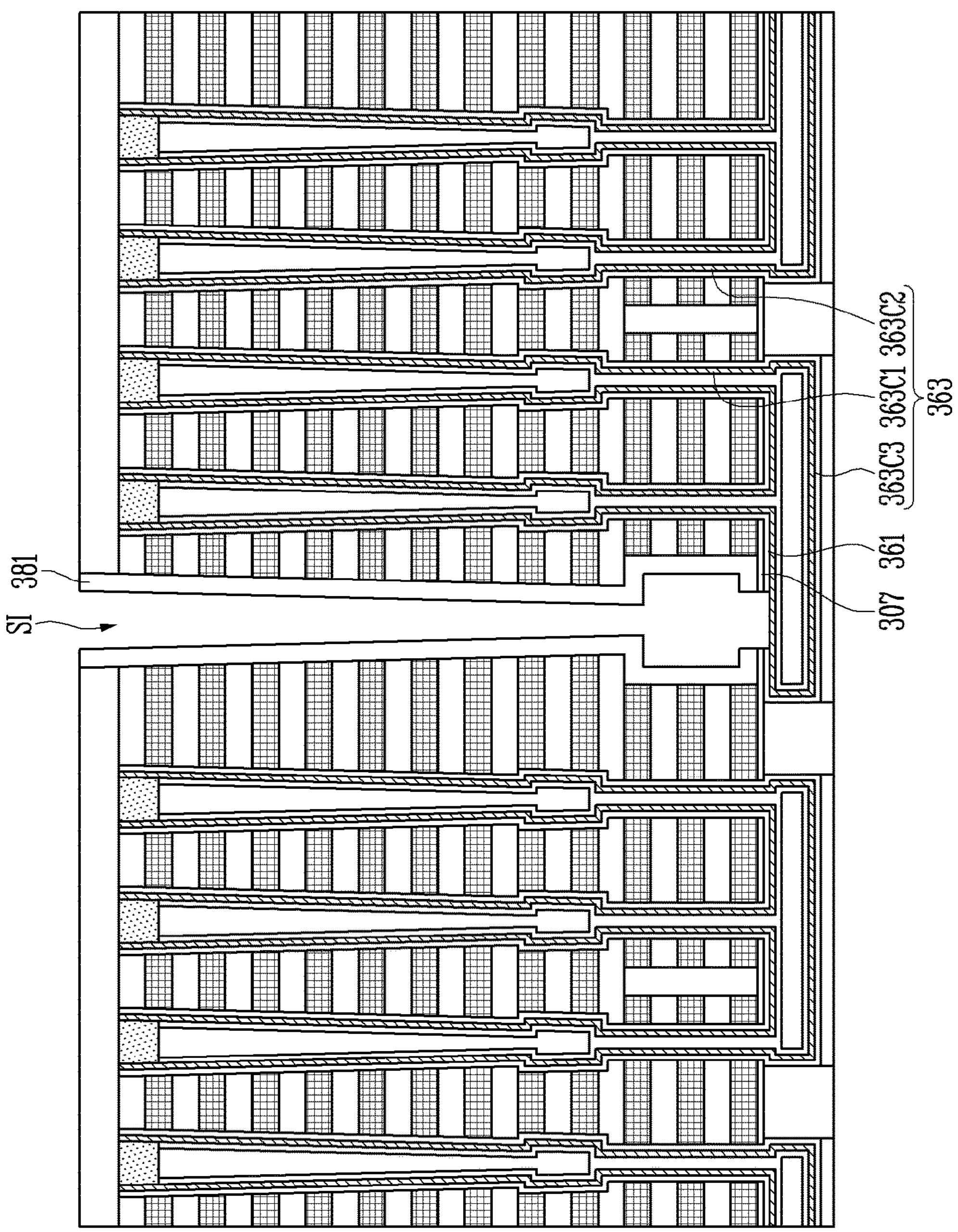

Referring to FIG. 15A, a sidewall insulating layer 381 may be formed on the sidewall of the slit SI. Thereafter, the pipe channel component 363C3 of the channel layer 363 may be exposed by etching the gate insulating layer 307 and the memory layer 361.

Figure 15B:
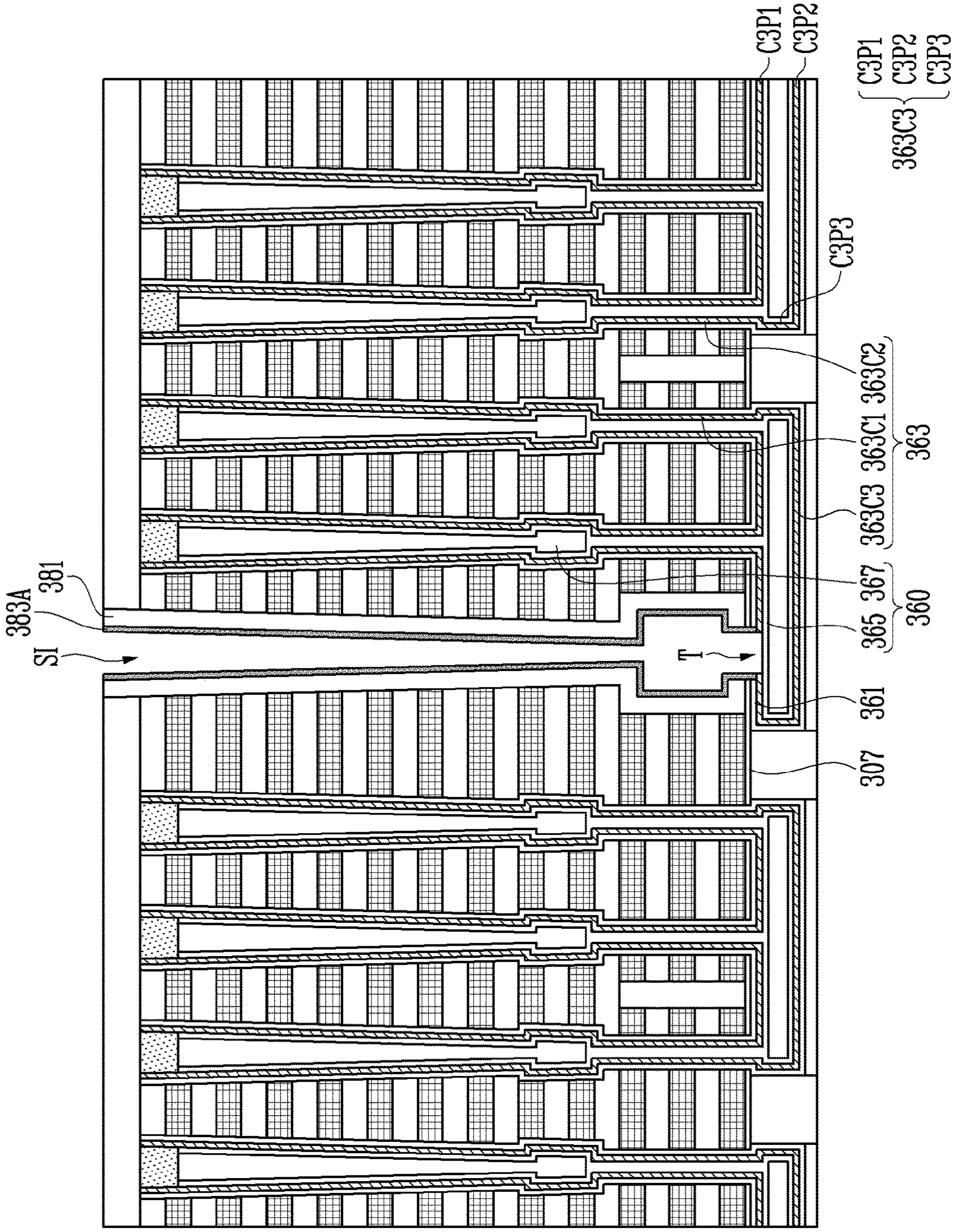

Referring to FIG. 15B, a first doped semiconductor layer 383A may be formed on the sidewall insulating layer 381. The first doped semiconductor layer 383A may extend along the sidewall of the gate insulating layer 307 and the sidewall of the memory layer 361.

Then, the first horizontal portion C3P1 of the pipe channel component 363C3 may be etched. Thus, a trench T passing through the gate insulating layer 307, the memory layer 361, and the first horizontal portion C3P1 of the pipe channel component 363C3 may be formed. The insulating structure 360 may be exposed through the trench T.

Figure 15C:
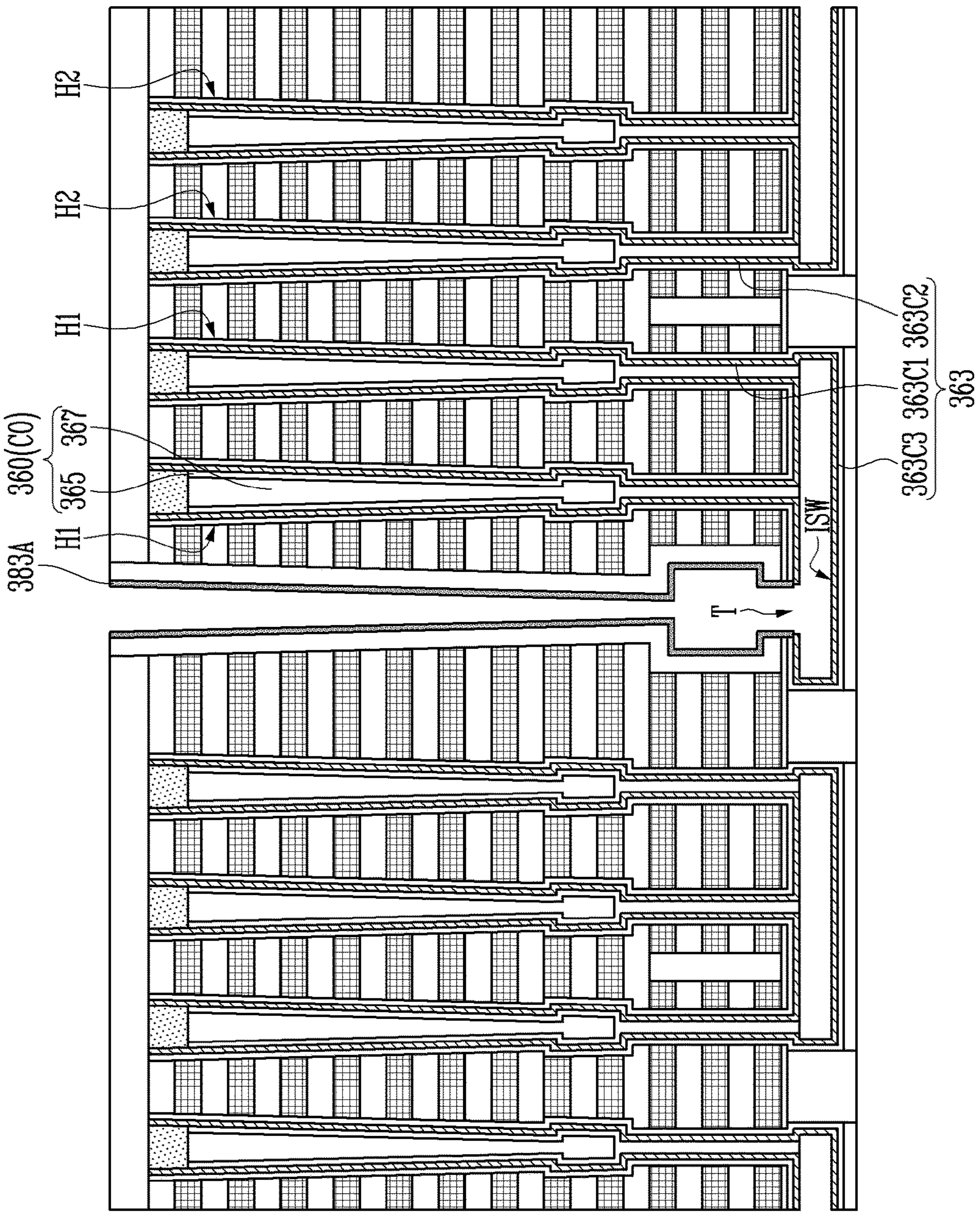

Referring to FIG. 15C, a portion of the insulating structure 360, illustrated in FIG. 15B, may be removed through the trench T. In this way, the inner wall ISW of the pipe channel component 363C3 may be exposed. The insulating structure 360 remaining in each of the first channel hole H1 and the second channel hole H2 may be defined as a core insulating pattern CO.

Figure 15D:
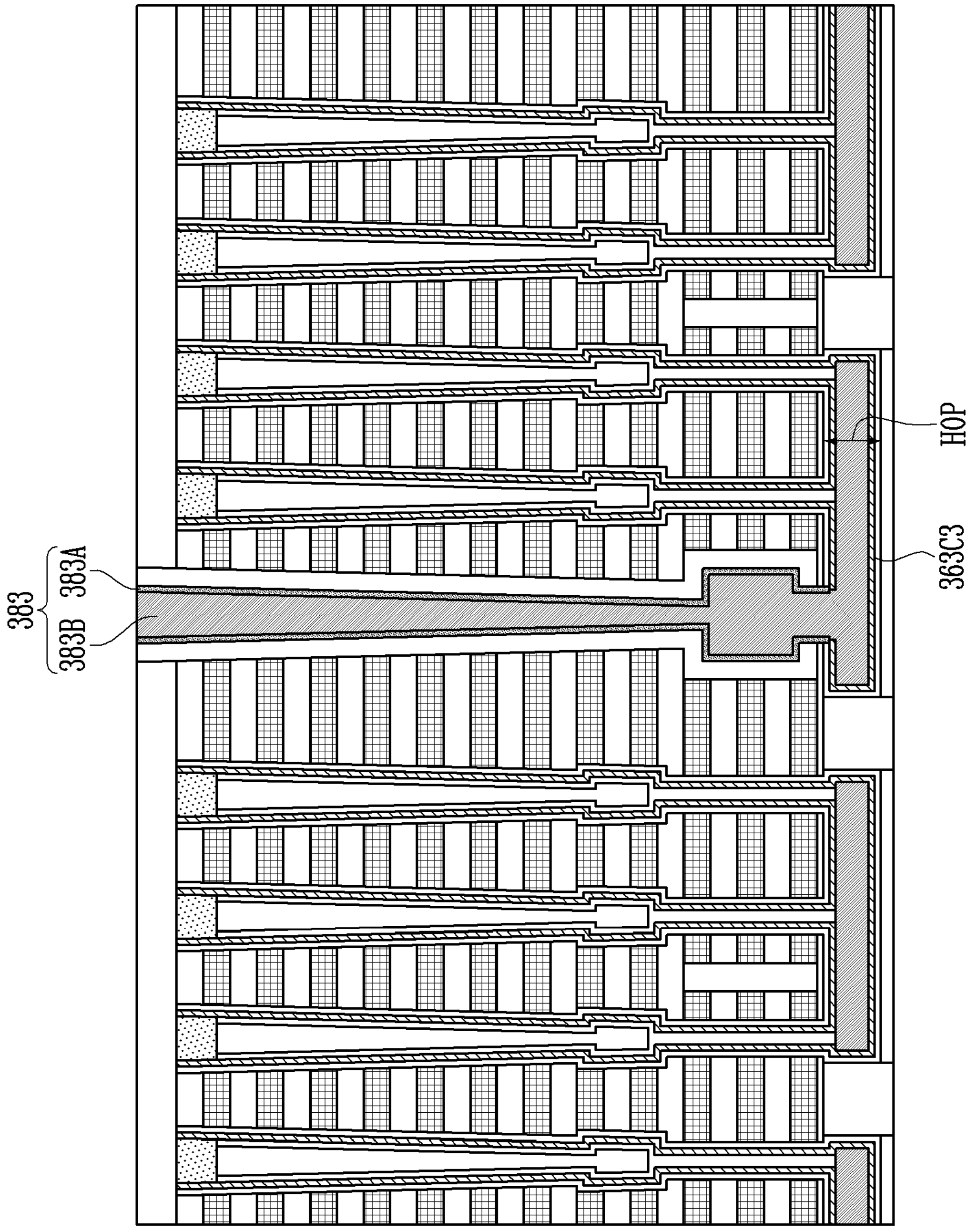

Referring to FIG. 15D, a second doped semiconductor layer 383B may be formed on the inner wall ISW of the pipe channel component 363C3, illustrated in FIG. 15C. The second doped semiconductor layer 383B may extending on the first doped semiconductor layer 383A. The first doped semiconductor layer 383A and the second doped semiconductor layer 383B may be formed of the same material. Hereinafter, the first doped semiconductor layer 383A and the second doped semiconductor layer 383B may be designated as a doped semiconductor layer 383.

The doped semiconductor layer 383 may include at least one of n-type impurities and p-type impurities. In an embodiment, the doped semiconductor layer 383 may include n-type impurities. For example, the doped semiconductor layer 383 may include n-type doped silicon. The doped semiconductor layer 383 may contact the pipe channel component 363C3 within the horizontal opening HOP.

The semiconductor memory device, illustrated in FIGS. 9A and 9B, may be provided using the processes described above with reference to FIGS. 12A to 12C, FIGS. 13A to 13G, FIGS. 14A and 14B, and FIGS. 15A to 15D. After the process illustrated in FIG. 15D, a subsequent process of forming the conductive vias 215 and the bit line BL, illustrated in FIG. 9A, may be performed.

FIGS. 16A to 16H are sectional views illustrating a method of manufacturing a semiconductor memory device according to an embodiment of the present disclosure.

Figure 16A:
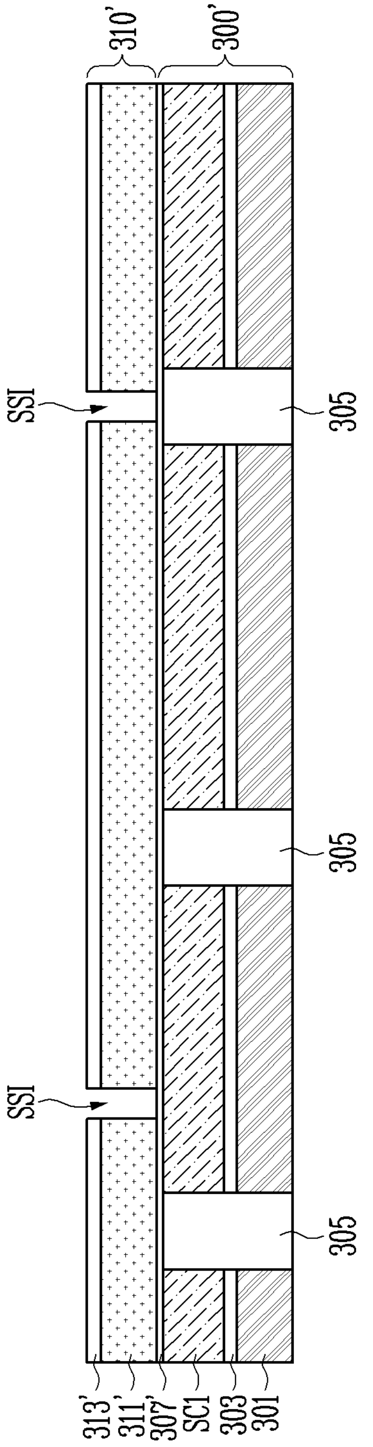
FIGS. 16A, 16B, 16C, 16D, 16E, 16F, 16G, and 16H are sectional views illustrating a method of manufacturing a semiconductor memory device according to an embodiment of the present disclosure.

Referring to FIG. 16A, a preliminary select structure 310' may be formed over a lower structure 300'. The lower structure 300' may be disposed over the peripheral circuit structure 40 illustrated in FIG. 2A. The lower structure 300' may include a lower conductive layer 301, a lower insulating layer 303, a first sacrificial layer SC1, a plurality of support structures 305, and a gate insulating layer 307'. The lower conductive layer 301 may include a doped semiconductor layer. In an embodiment, the lower conductive layer 301 may include a semiconductor layer doped with p-type impurities. For example, the lower conductive layer 301 may include a p-type doped silicon layer. The lower insulating layer 303 may be formed over the lower conductive layer 301. The first sacrificial layer SC1 may be formed over the lower insulating layer 303. The plurality of support structures 305 may penetrate the first sacrificial layer SC1, the lower insulating layer 303, and the lower conductive layer 301. The gate insulating layer 307, the first sacrificial layer SC1, the lower insulating layer 303, and the lower conductive layer 301 may respectively extend on XY planes at different levels. The plurality of support structures 305 may be spaced apart from each other on the XY plane in the same manner as the plurality of support structures 105 illustrated in FIG. 8. The gate insulating layer 307' may cover the first sacrificial layer SC1 and the plurality of support structures 305. Each of the lower insulating layer 303, the plurality of support structures 305, and the gate insulating layer 307' may include an insulating material such as a silicon oxide. The first sacrificial layer SC1 may include the same material as that described above with reference to FIG. 12A.

The preliminary select structure 310' may include at least one lower first material layer 311' and at least one lower second material layer 313', which are alternately stacked over the lower structure 300'. The lower first material layer 311' and the lower second material layer 313' may include the same materials as those described above with reference to FIG. 12A.

Thereafter, a plurality of sub-slits SSI may be formed to pass through the preliminary select structure 310'.

Figure 16B:
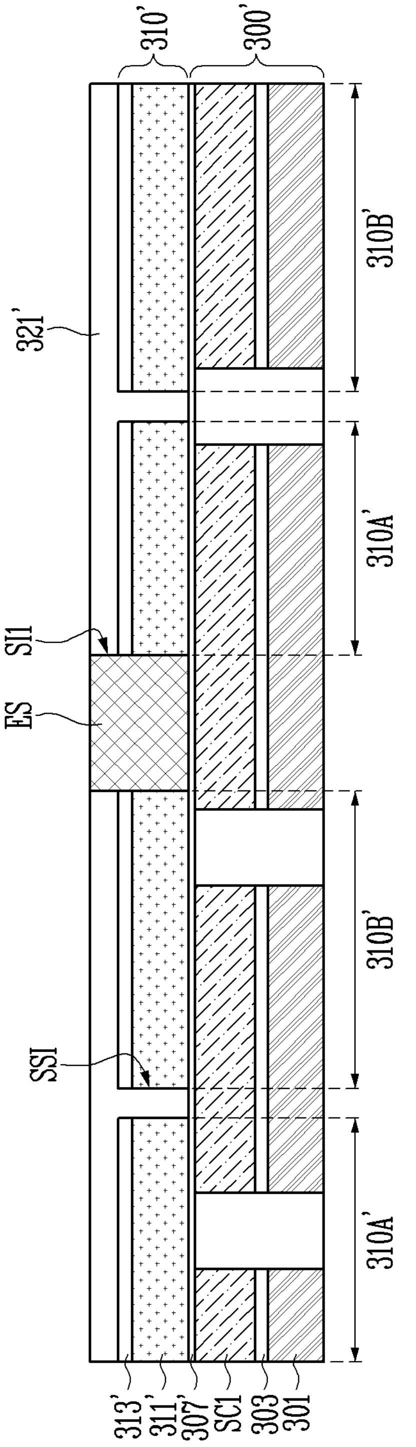

Referring to FIG. 16B, a sub-block insulating layer 321' may be formed to fill the plurality of sub-slits SSI. The sub-block insulating layer 321' may include an insulating material such as a silicon oxide. The sub-block insulating layer 321' may extend to cover the top surface of the preliminary select structure 310'.

Next, a lower slit SI1 may be formed between the sub-slits SSI neighboring each other. The lower slit SI1 may pass through the sub-block insulating layer 321' and the preliminary select structure 310'. As described above with reference to FIG. 12B, the preliminary select structure 310' may be separated into a first preliminary select gate structure 310A' and a second preliminary select gate structure 310B' by the sub-slits SSI and the lower slit SI1.

Thereafter, an etch stop layer ES may be formed in the lower slit SI1. The sub-block insulating layer 321' may remain over the preliminary select structure 310' while surrounding the top of the etch stop layer ES. The etch stop layer ES may be formed of the same material as that described above with reference to FIG. 12C.

Figure 16C:
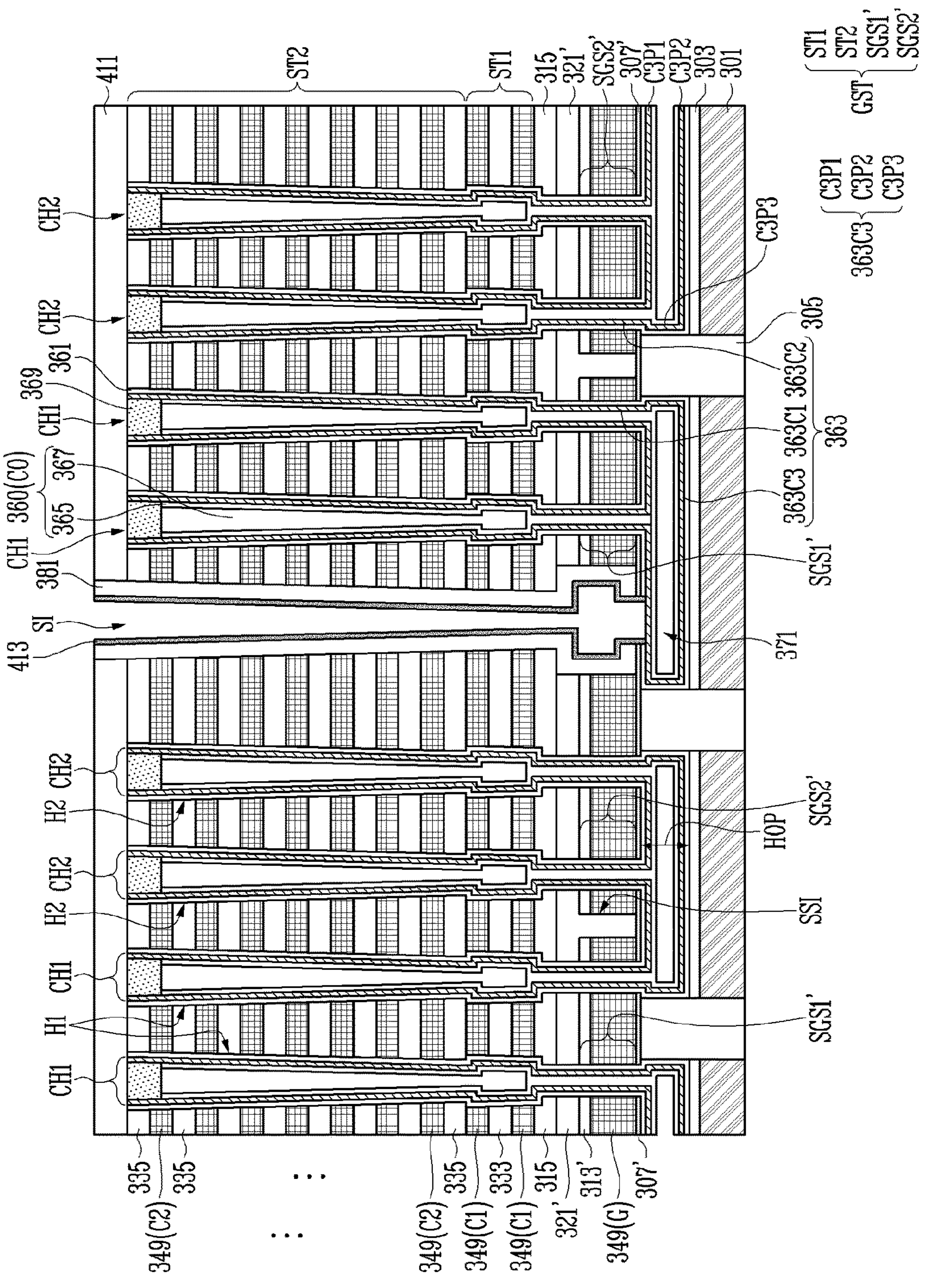

Referring to FIG. 16C, the memory layer 361, the channel layer 363, the insulating structure 360, the capping pattern 369, and the gate stacked body GST may be formed using the processes described above with reference to FIGS. 13A to 13G and FIGS. 14A and 14B.

The gate stacked body GST may be divided by a slit SI, and may be disposed over the gate insulating layer 307'. The gate stacked body GST may include a first select gate structure SGS1, a second select gate structure SGS2', a first stacked body ST1, and a second stacked body ST2. The first select gate structure SGS1' and the second select gate structure SGS2' may be disposed on both sides of the sub-slit SSI. The first stacked body ST1 may be disposed over the first select gate structure SGS1' and the second select gate structure SGS2', and the second stacked body ST2 may be disposed over the first stacked body ST1.

The first select gate structure SGS1' and the second select gate structure SGS2' may be provided using the first preliminary select gate structure 310A' and the second preliminary select gate structure 310B', illustrated in FIG. 16B. The first stacked body ST1 may be provided using a first preliminary stacked body PST1 that includes at least one intermediate first material layer 331 and at least one intermediate second material layer 333, which are illustrated in FIG. 13A. The second stacked body ST2 may be provided using a second preliminary stacked body PST2 that includes the plurality of upper first material layers 341 and the plurality of upper second material layers 335, which are illustrated in FIG. 13E.

The gate stacked body GST may include a plurality of conductive patterns 349 stacked over the gate insulating layer 307' to be spaced apart from each other. The plurality of conductive patterns 349 may include a select gate pattern G, at least one first conductive pattern C1, and a plurality of second conductive patterns C2. The lower first material layer 311, illustrated in FIG. 16B, may be replaced with a select gate pattern G through the slit SI. As described above with reference to FIGS. 14A and 14B, the first conductive pattern C1 may be formed by replacing the intermediate first material layer 331 of the first preliminary stacked body PST1 with a conductive material. As described above with reference to FIGS. 14A and 14B, the second conductive pattern C2 may be formed by replacing the upper first material layer 341 of the second preliminary stacked body PST2 with a conductive material.

The plurality of conductive patterns 349 of the gate stacked body GST may be alternately disposed over the at least one lower second material layer 313', at least one intermediate second material layer 333, a plurality of upper second material layers 335, and the gate insulating layer 307'. The gate stacked body GST may include a sub-interlayer insulating layer 315. The sub-interlayer insulating layer 315 may be disposed between the sub-block insulating layer 321' and the first conductive pattern C1.

The gate stacked body GST may surround the first channel structure CH1 and the second channel structure CH2 disposed on both sides of the sub-slit SSI. The first channel structure CH1 and the second channel structure CH2 may penetrate the gate insulating layer 307'. The first channel structure CH1 and the second channel structure CH2 may be respectively formed in the first channel hole H1 and the second channel hole H2, which are defined using the processes described above with reference to FIG. 13A to 13G. As described above with reference to FIG. 13G, each of the first channel structure CH1 and the second channel structure CH2 may include a channel layer 363, an insulating structure 360, and a capping pattern 369. As described above with reference to FIG. 13G, the insulating structure 360 may include a buffer layer 365 and a gap-fill layer 367. The memory layer 361 may extend along respective sidewalls SW of the first channel structure CH1 and the second channel structure CH2. As described above with reference to FIG. 13G, the memory layer 361, the channel layer 363, and the buffer layer 365 may extend into a horizontal opening HOP between the gate insulating layer 307' and the lower insulating layer 303.

As described above with reference to FIG. 13F, the horizontal opening HOP may be formed by removing the first sacrificial layer SC1, illustrated in FIG. 16B, through the slit SI. As described above with reference to FIG. 13G, a hollow portion 371 surrounded by the buffer layer 365 may be defined in a central region of the horizontal opening HOP.

The channel layer 363 may include a first column portion 363C1 in the first channel hole H1, a second column portion 363C2 in the second channel hole H2, and a pipe channel component 363C3 in the horizontal opening HOP. The pipe channel component 363C3 may extend to surround the sidewall of the support structure 305, and may couple the first column portion 363C1 to the second column portion 363C2. As described above with reference to FIG. 13G, the pipe channel component 363C3 may include a first horizontal portion C3P1, a second horizontal portion C3P2, and a vertical portion C3P3.

The slit SI may not only divide the gate stacked body GST but also pass through the first upper insulating layer 411 disposed over the gate stacked body GST, as described above with reference to FIG. 14A.

After the gate stacked body GST is formed, a sidewall insulating layer 381 may be formed on the sidewall of the slit SI, as described above with reference to FIG. 15A. Next, the pipe channel component 363C3 of the channel layer 363 may be exposed by etching the gate insulating layer 307' and the memory layer 361, which are exposed through the bottom surface of the slit SI. Next, a liner layer 413 may be formed on the sidewall insulating layer 381.

The liner layer 413 may extend along the sidewall of the gate insulating layer 307' and the sidewall of the memory layer 361. The liner layer 413 may include a material having an etch selectivity with respect to the lower insulating layer 303, the buffer layer 365, and the memory layer 361. In an embodiment, the liner layer 413 may include a silicon layer.

Figure 16D:
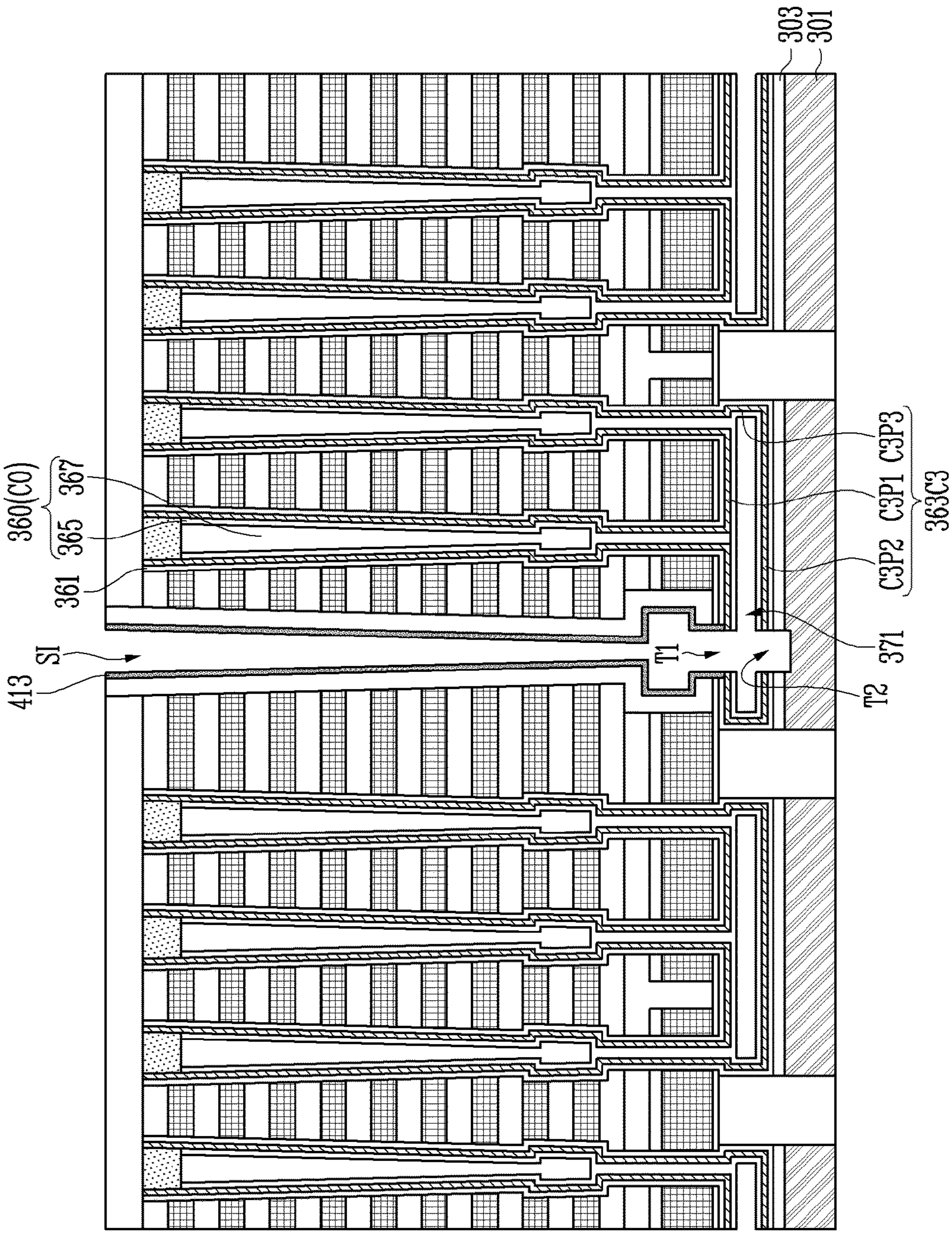

Referring to FIG. 16D, a first trench T1 may be formed through the slit SI. The first trench T1 may pass through the first horizontal portion C3P1 of the pipe channel component 363C3 and a portion of the buffer layer 365 adjacent to the first horizontal portion C3P1. The slit SI and the hollow portion 371 may be coupled to each other by the first trench T1.

Subsequently, a second trench T2 may be formed through the first trench T1. The second trench T2 may pass through a portion of the buffer layer 365, adjacent to the second horizontal portion C3P2, and the second horizontal portion C3P2. The second trench T2 may extend to pass through the lower insulating layer 303. In this way, the lower conductive layer 301 may be exposed through the second trench T2.

Figure 16E:
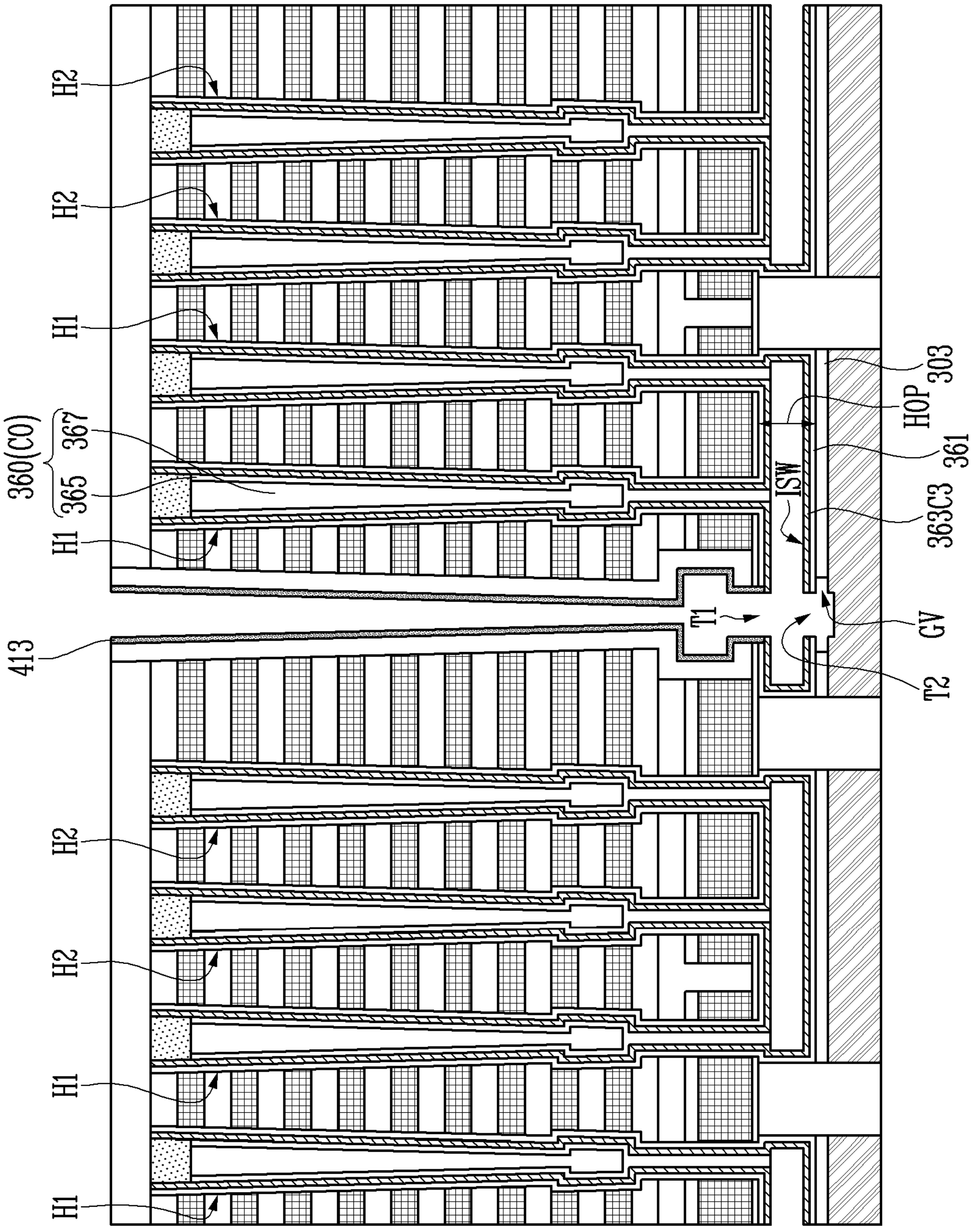

Referring to FIG. 16E, the insulating structure 360 in the horizontal opening HOP may be etched such that the inner wall ISW of the pipe channel component 363C3 is exposed. Here, the insulating structure 360 may remain, as a core insulating pattern CO, in each of the first channel hole H1 and the second channel hole H2. While the insulating structure 360 is etched, a portion of the lower insulating layer 303 may be etched, and then a groove GV may be defined in the sidewall of the second trench T2. While the insulating structure 360 is etched, a portion of the memory layer 361 exposed through the second trench T2 may be etched.

Figure 16F:
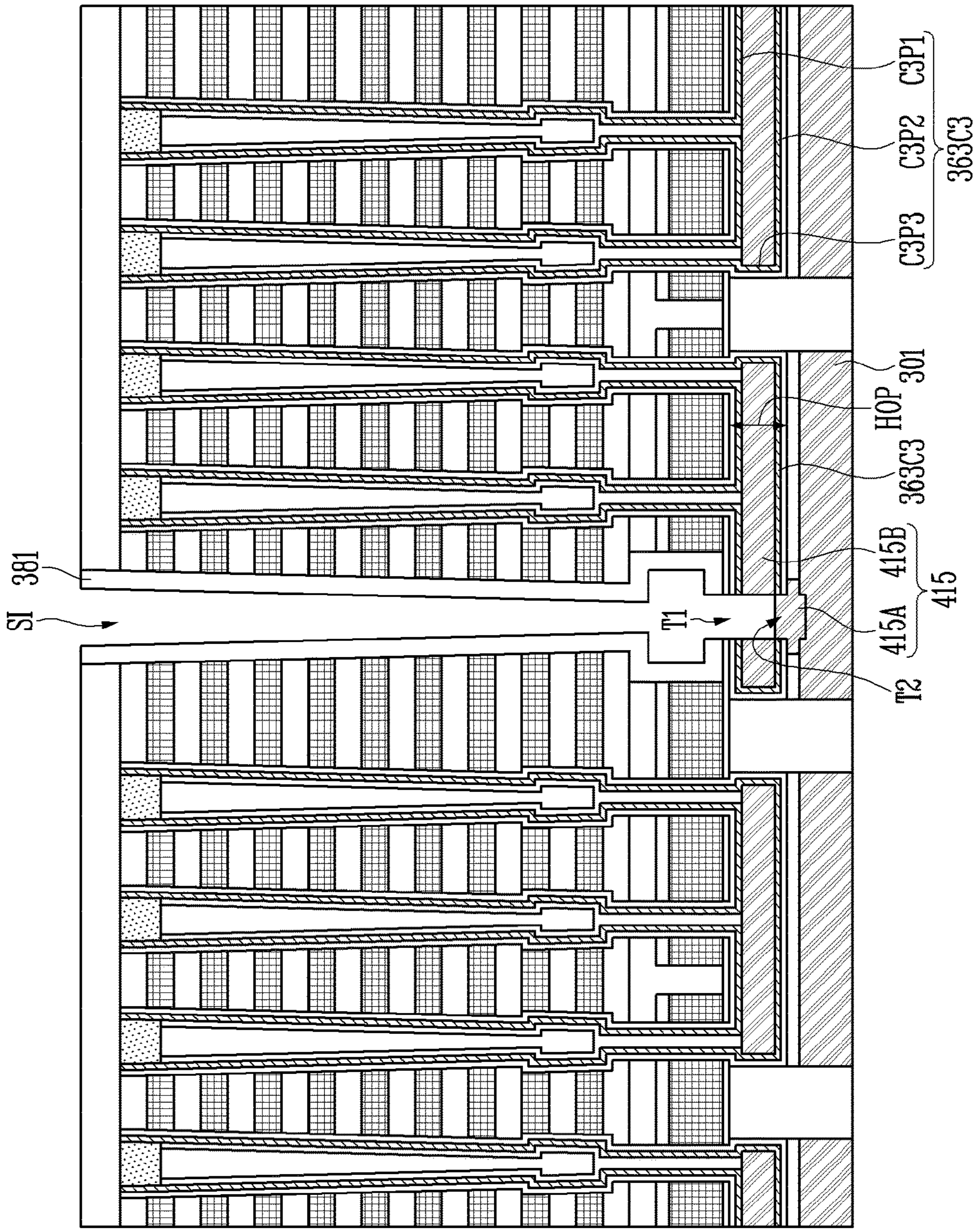

Referring to FIG. 16F, a doped semiconductor layer 415 may be formed in the horizontal opening HOP and the second trench T2. The doped semiconductor layer 415 may be formed to fill the horizontal opening HOP and the second trench T2, and may be removed from the inside of the slit SI and the first trench T1 through a cleaning process. Here, the liner layer 413, illustrated in FIG. 16E, may be removed, and thus the sidewall insulating layer 381 may be exposed.

The doped semiconductor layer 415 may include p-type impurities. The doped semiconductor layer 415 may include a first vertical semiconductor pattern 415A and a horizontal semiconductor pattern 415B. The first vertical semiconductor pattern 415A may be disposed in the second trench T2, and may contact the lower conductive layer 301. The first vertical semiconductor pattern 415A may contact the second horizontal portion C3P2 of the pipe channel component 363C3. The horizontal semiconductor pattern 415B may be disposed in the horizontal opening HOP, and may be surrounded by the pipe channel component 363C3. The horizontal semiconductor pattern 415B may contact the pipe channel component 363C3. The first vertical semiconductor pattern 415A and the horizontal semiconductor pattern 415B may be formed to be integrated with each other or to be separated from each other depending on the etch amount of the doped semiconductor layer 415 during the above-described cleaning process.

Figure 16G:
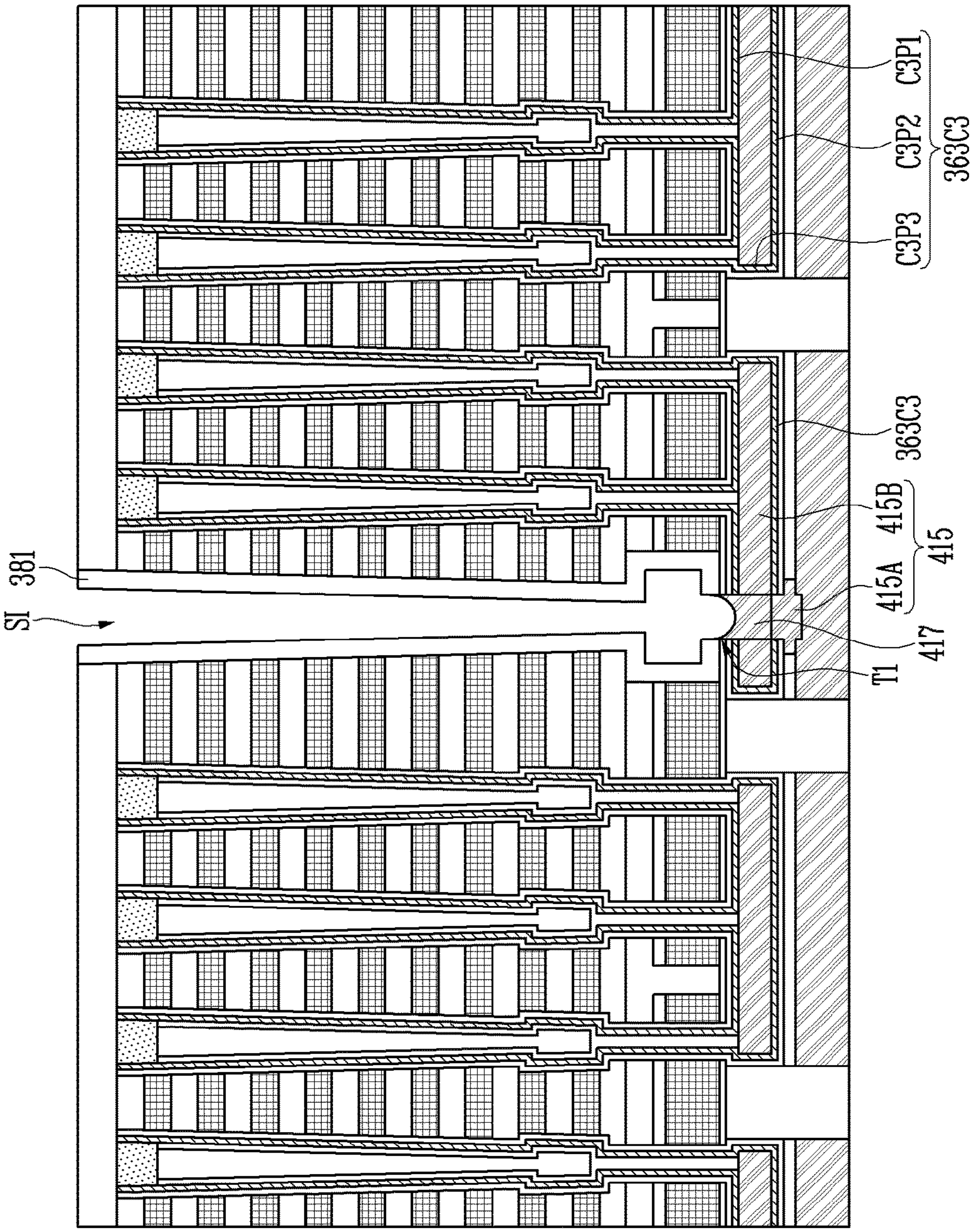

Referring to FIG. 16G, a second vertical semiconductor pattern 417 may be formed in the first trench T1. The second vertical semiconductor pattern 417 may include p-type impurities.

In an embodiment, the second vertical semiconductor pattern 417 may be formed through a selective epitaxial process. In this case, the growth height of the second vertical semiconductor pattern 417 may be controlled such that the slit SI is not filled with the second vertical semiconductor pattern 417. Embodiments of the present disclosure are not limited thereto. In an embodiment, the doped semiconductor layer 415 may be formed to fill the first trench T1, thus skipping a separate process of forming the second vertical semiconductor pattern 417.

Figure 16H:
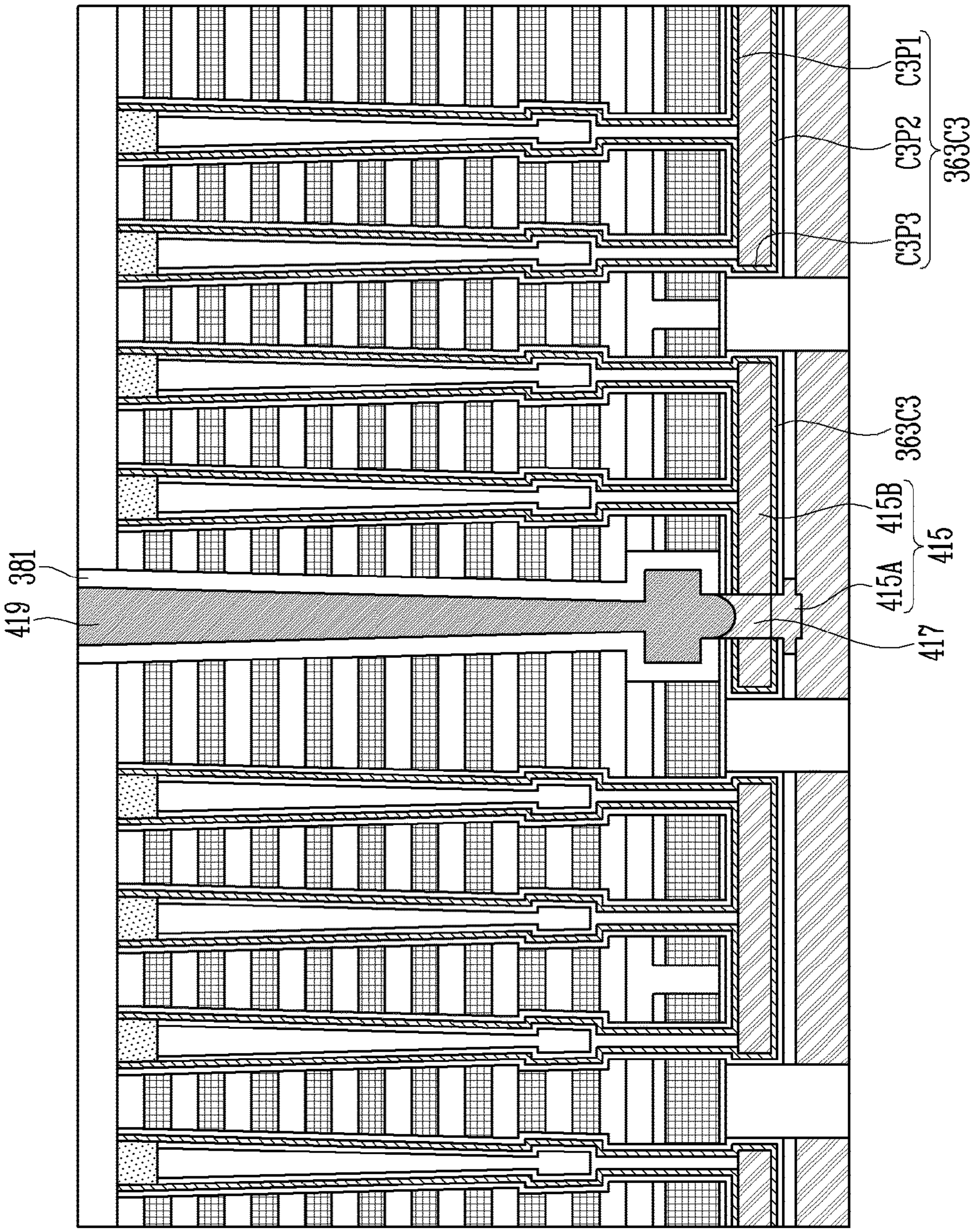

Referring to FIG. 16H, an n-type doped semiconductor layer 419 may be formed over the second vertical semiconductor pattern 417. The n-type doped semiconductor layer 419 may extend along the sidewall insulating layer 381, and may be used as a source contact structure. N-type impurities in the n-type doped semiconductor layer 419 may be diffused into the second vertical semiconductor pattern 417 through heat. The diffusion process may be controlled such that n-type impurities are diffused to a partial region of the second vertical semiconductor pattern 417 contacting the first horizontal portion C3P1 of the pipe channel component 363C3, but are not diffused into the first vertical semiconductor pattern 415A.

The semiconductor memory device illustrated in FIGS. 10A and 10B may be provided using the processes, described above with reference to FIGS. 16A to 16H.

FIGS. 17A to 17H are sectional views illustrating a method of manufacturing a semiconductor memory device according to an embodiment of the present disclosure.

Figure 17A:
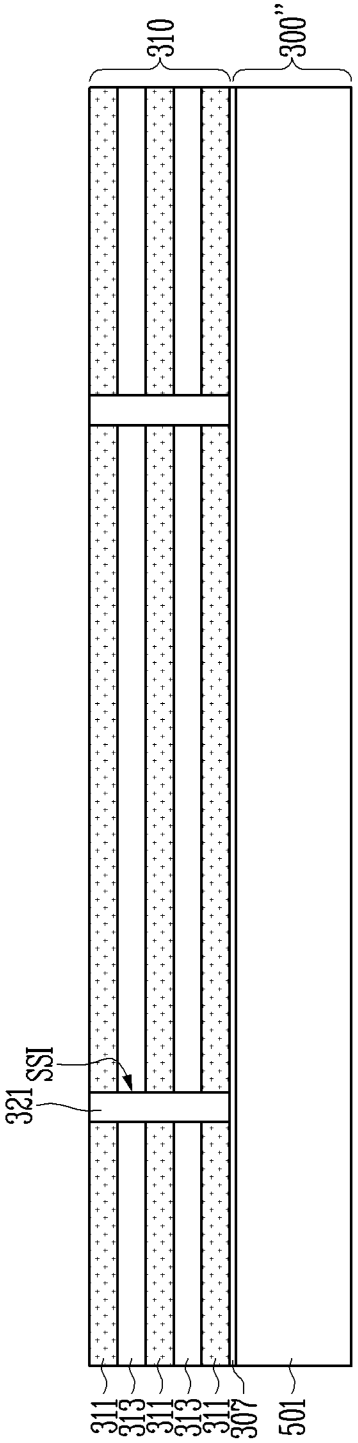
FIGS. 17A, 17B, 17C, 17D, 17E, 17F, 17G, and 17H are sectional views illustrating a method of manufacturing a semiconductor memory device according to an embodiment of the present disclosure.

Referring to FIG. 17A, a preliminary select structure 310 may be formed over a lower structure 300". The lower structure 300" may include a first substrate 501 and a gate insulating layer 307 over the first substrate 501. The first substrate 501 may include a silicon layer. The gate insulating layer 307 and the preliminary select structure 310 may be formed to have the same configuration as that described above with reference to FIG. 12A, or as that described above with reference to FIG. 16A. Hereinafter, a method of manufacturing the semiconductor memory device will be described based on the case in which the gate insulating layer 307 and the preliminary select structure 310, described above with reference to FIG. 12A, are included.

The lower first material layer 311 and the lower second material layer 313 of the preliminary select structure 310 may be penetrated by the sub-slit SSI. Next, a sub-block insulating layer 321 filling the sub-slit SSI may be formed. The sub-slit SSI and the sub-block insulating layer 321 may be formed using the processes, described above with reference to FIGS. 12A and 12B. The sub-block insulating layer 321 may be planarized such that the lower first material layer 311 is exposed.

Figure 17B:
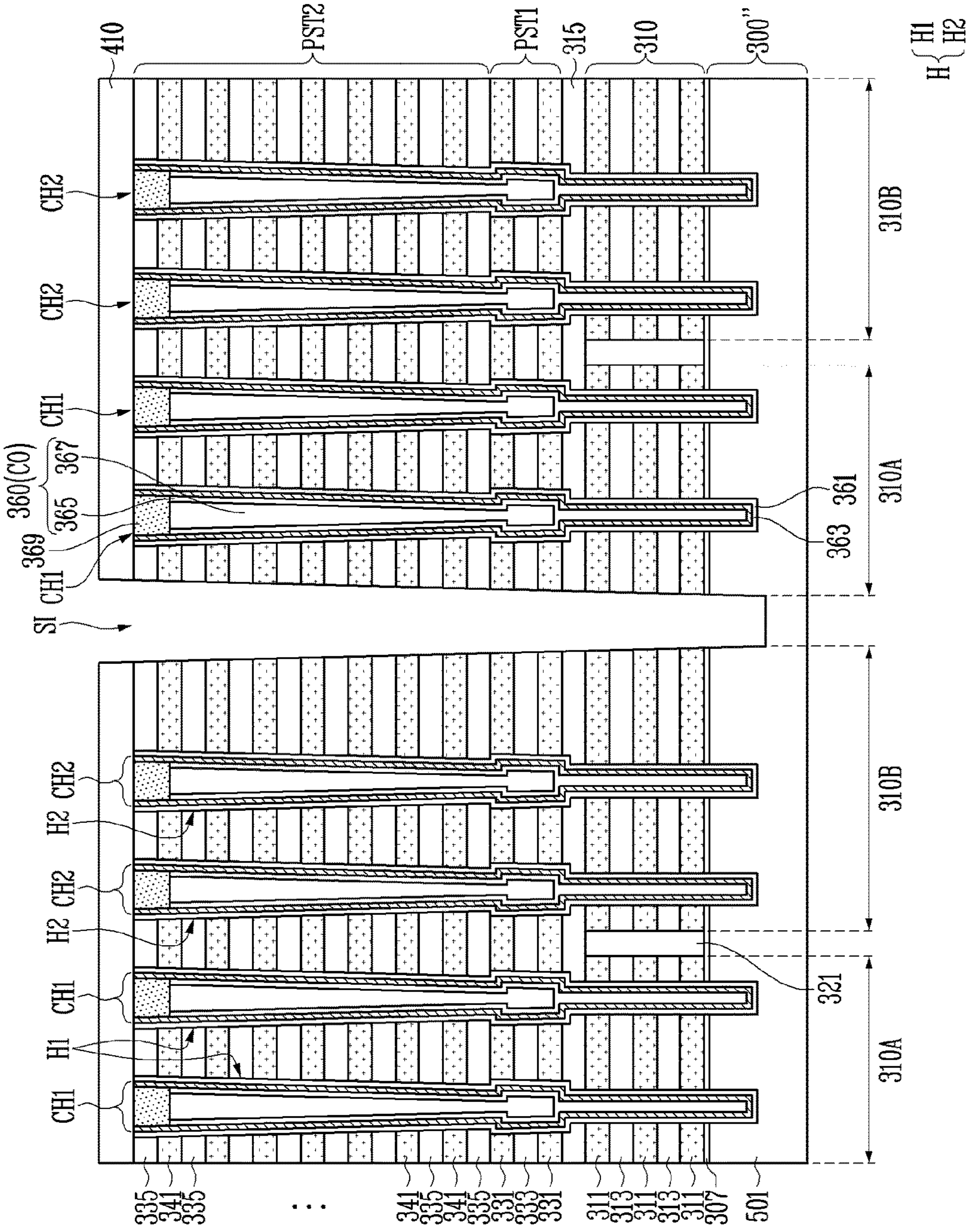

Referring to FIG. 17B, processes described above with reference to FIGS. 13A to 13G may be performed. In this way, a sub-interlayer insulating layer 315, a first preliminary stacked body PST1, and a second preliminary stacked body PST2 may be formed over the preliminary select structure 310. Also, a plurality of channel holes H may be formed to pass through the gate insulating layer 307, the preliminary select structure 310, the sub-interlayer insulating layer 315, the first preliminary stacked body PST1, and the second preliminary stacked body PST2. Further, a memory layer 361, a channel layer 363, an insulating structure 360, and a capping pattern 369 may be formed in each of the channel holes H.

As described above with reference to FIG. 13A, the first preliminary stacked body PST1 may include at least one intermediate first material layer 331 and at least one intermediate second material layer 333. As described above with reference to FIG. 13E, the second preliminary stacked body PST2 may include a plurality of upper first material layers 341 and a plurality of upper second material layers 335.

The plurality of channel holes H, the memory layer 361, the channel layer 363, and the insulating structure 360 may extend into the first substrate 501. The memory layer 361 may extend along the surface of the channel hole H corresponding thereto. The memory layer 361 may contact the first substrate 501. The channel layer 363 may be formed on the memory layer 361. As described above with reference to FIG. 13G, the insulating structure 360 may include a buffer layer 365 and a gap-fill layer 367. The capping pattern 369 may be disposed on the insulating structure 360.

Next, an insulating layer 410 may be formed over the second preliminary stacked body PST2. Thereafter, a slit SI passing through the insulating layer 410 may be formed. The slit SI may pass through the preliminary select structure 310, the sub-interlayer insulating layer 315, the first preliminary stacked body PST1, and the second preliminary stacked body PST2, and may extend into the first substrate 501. In this way, as described above with reference to FIG. 12B, the preliminary select structure 310 may be separated into a first preliminary select gate structure 310A and a second preliminary select gate structure 310B.

Each of the plurality of channel holes H may be separated into a first channel hole H1 passing through the first preliminary select gate structure 310A and a second channel hole H2 passing through the second preliminary select gate structure 310B. The channel layer 363, the insulating structure 360, and the capping pattern 369 in the first channel hole H1 may be defined as a first channel structure CH1, and the channel layer 363, the insulating structure 360, and the capping pattern 369 in the second channel hole H2 may be defined as a second channel structure CH2.

Figure 17C:
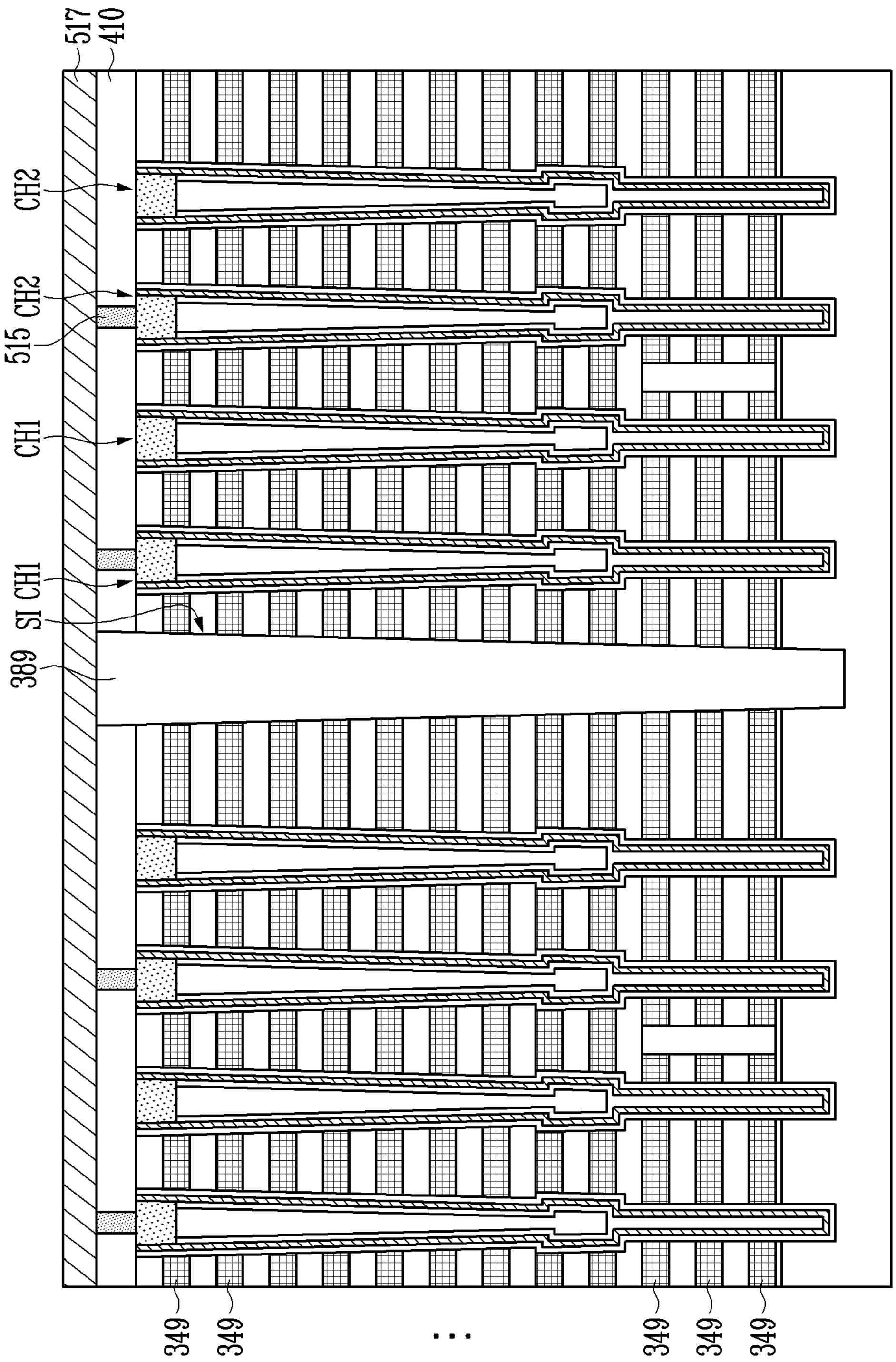

Referring to FIG. 17C, through the slit SI, the lower first material layer 311, the intermediate first material layer 331, and the plurality of upper first material layers 341, illustrated in FIG. 17B, may be replaced with a plurality of conductive patterns 349. Thereafter, a vertical insulating layer 389 may be formed in the slit SI.

Thereafter, a plurality of conductive vias 515 passing through the insulating layer 410 may be formed. Each conductive via 515 may contact a corresponding one of the first channel structure CH1 and the second channel structure CH2.

Next, a conductive layer 517 coupled to the plurality of conductive vias 515 may be formed. The conductive layer 517 may be etched as a pattern for a bit line.

Figure 17D:
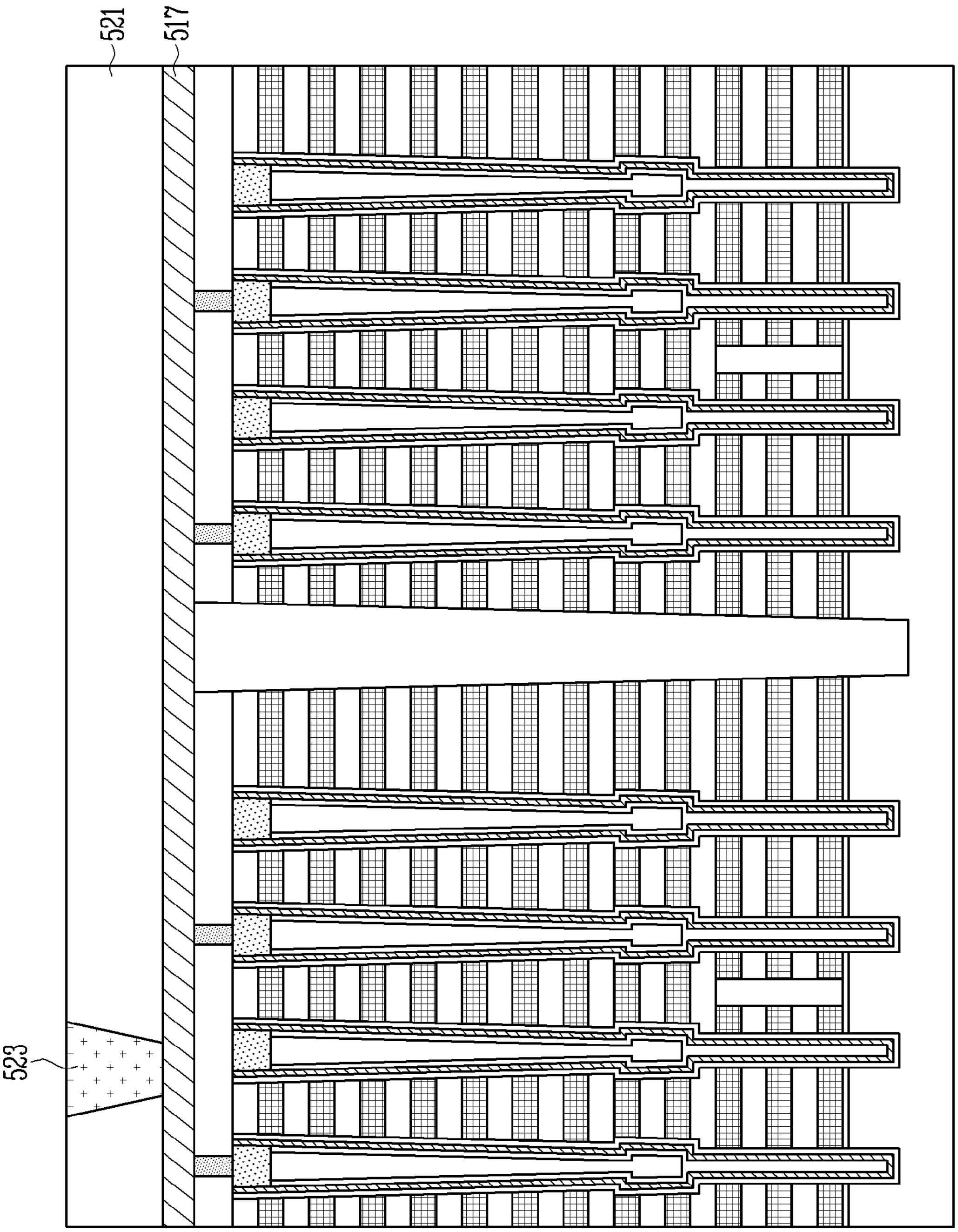

Referring to FIG. 17D, a first bonding insulating layer 521 may be formed over the conductive layer 517. The first bonding insulating layer 521 may include a silicon oxide, a silicon oxynitride, a silicon carbonitride, etc. Thereafter, a first conductive bonding pad 523 may be formed to pass through the first bonding insulating layer 521. The first conductive bonding pad 523 may include metal such as copper or a copper alloy.

Figure 17E:
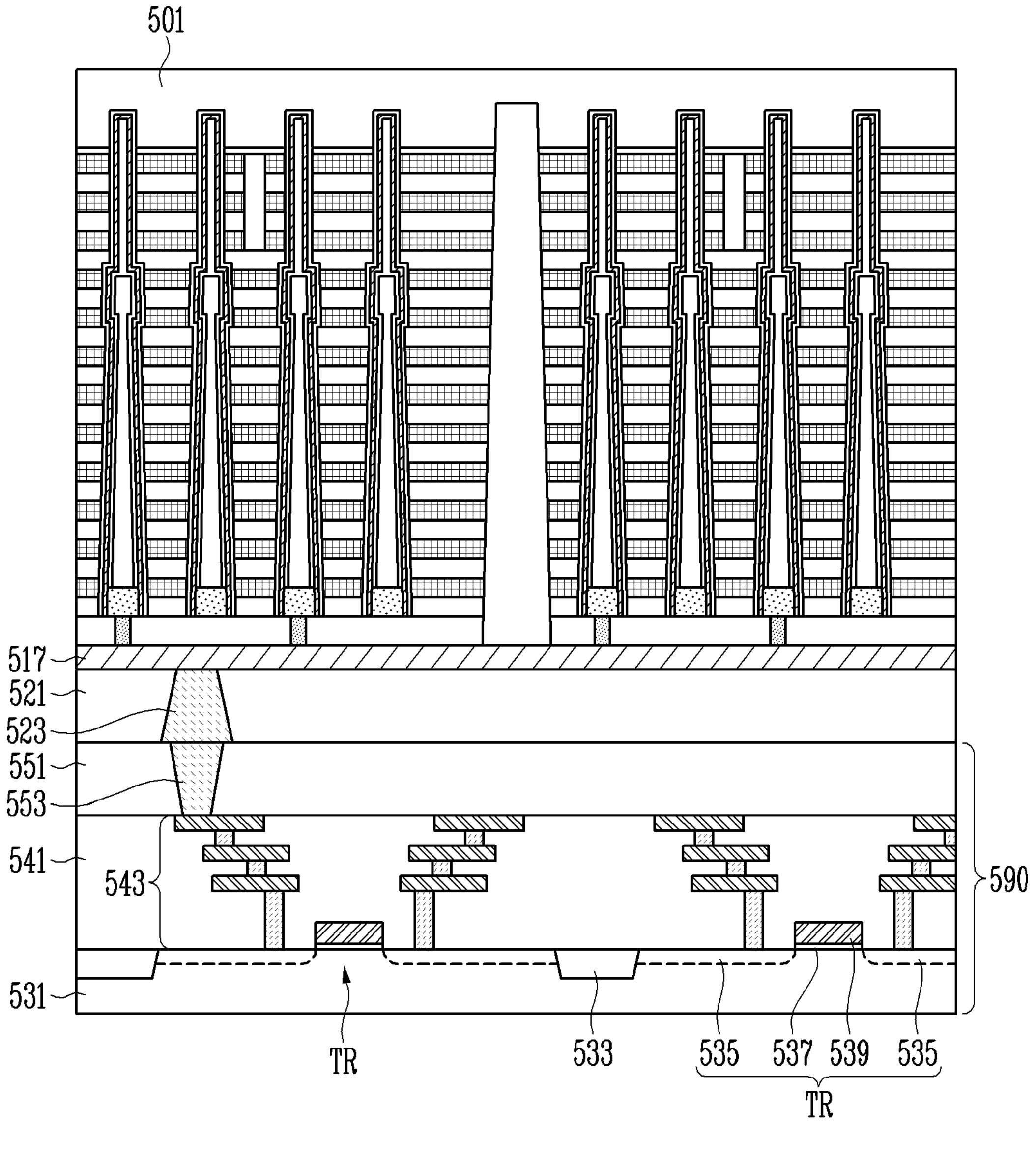

Referring to FIG. 17E, a peripheral circuit structure 590 may be provided through a separate process. The peripheral circuit structure 590 may include a plurality of transistors TR, a plurality of interconnections 543, and a second conductive bonding pad 553.

Each of the transistors TR may be disposed in an active region of a second substrate 531. The second substrate 531 may be a semiconductor substrate such as a silicon substrate, a silicon-germanium substrate, a germanium substrate, a monocrystalline silicon substrate, or a substrate including a monocrystalline epitaxial layer. The active region of the second substrate 531 may be divided by an isolation layer 533.

Each transistor TR may include a gate insulating layer 537, a gate electrode 539, and junctions 535. The gate insulating layer 537 and the gate electrode 539 may be stacked in the active region of the second substrate 531. The junctions 535 may be formed in the active region of the second substrate 531 on both sides of the gate electrode 539, and may be defined as regions into which at least one of n-type impurities and p-type impurities is injected. The junctions 535 may be provided as a source region and a drain region of the transistor TR corresponding thereto.

The plurality of transistors TR may be coupled to the plurality of interconnections 543. Each of the interconnections 543 may include conductive patterns, which are arranged on two or more layers and coupled to each other.

The second substrate 531 and the plurality of transistors TR may be covered with a lower insulating structure 541. The plurality of interconnections 543 may be embedded in the lower insulating structure 541. The lower insulating structure 541 may include insulating layers implemented as two or more layers.

A second bonding insulating layer 551 may be disposed over the lower insulating structure 541. The second conductive bonding pad 553 may be coupled to the interconnection 543 corresponding thereto by passing through the second bonding insulating layer 551. The second bonding insulating layer 551 may include a silicon oxide, a silicon oxynitride, a silicon carbonitride, etc. The second conductive bonding pad 553 may include metal such as copper or a copper alloy.

The first substrate 501 may be aligned on the peripheral circuit structure 590 so that the first conductive bonding pad 523 is capable of contacting the above-described second conductive bonding pad 553. The first conductive bonding pad 523 may be bonded to the second conductive bonding pad 553, and the first bonding insulating layer 521 may be bonded to the second bonding insulating layer 551.

Figure 17F:
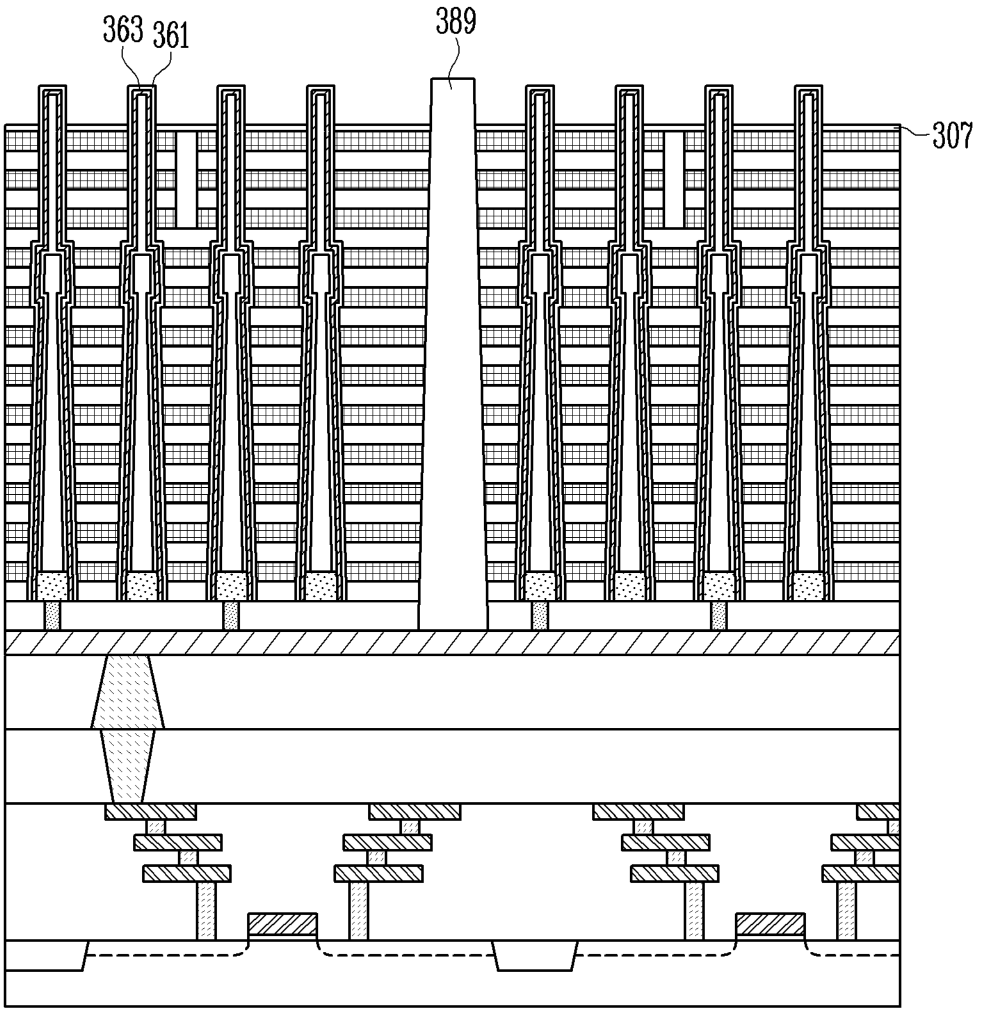

Referring to FIG. 17F, the first substrate 501 illustrated in FIG. 17E may be removed such that the memory layer 361 is exposed. Here, the channel layer 363 may be protected by the memory layer 361, and the vertical insulating layer 389 and the gate insulating layer 307 may be exposed.

Figure 17G:
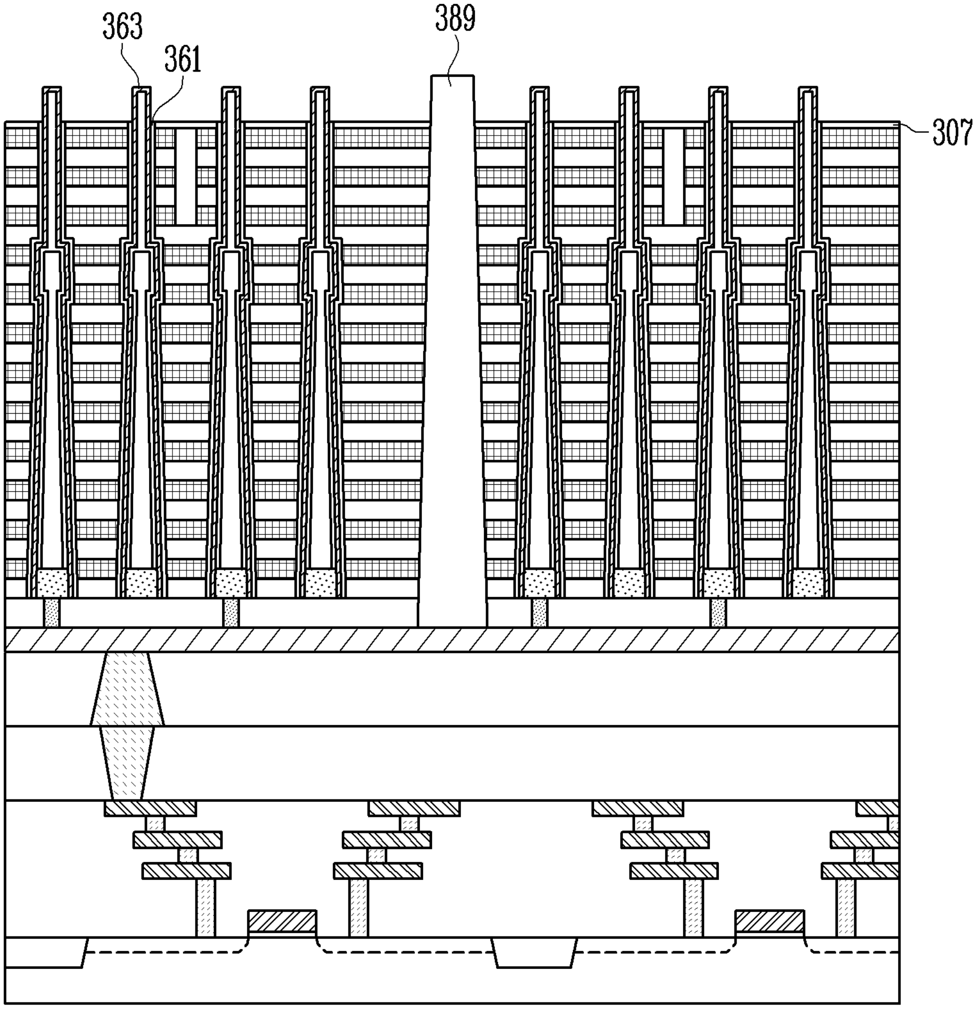

Referring to FIG. 17G, a portion of the memory layer 361 may be removed such that the channel layer 363 is exposed.

Figure 17H:
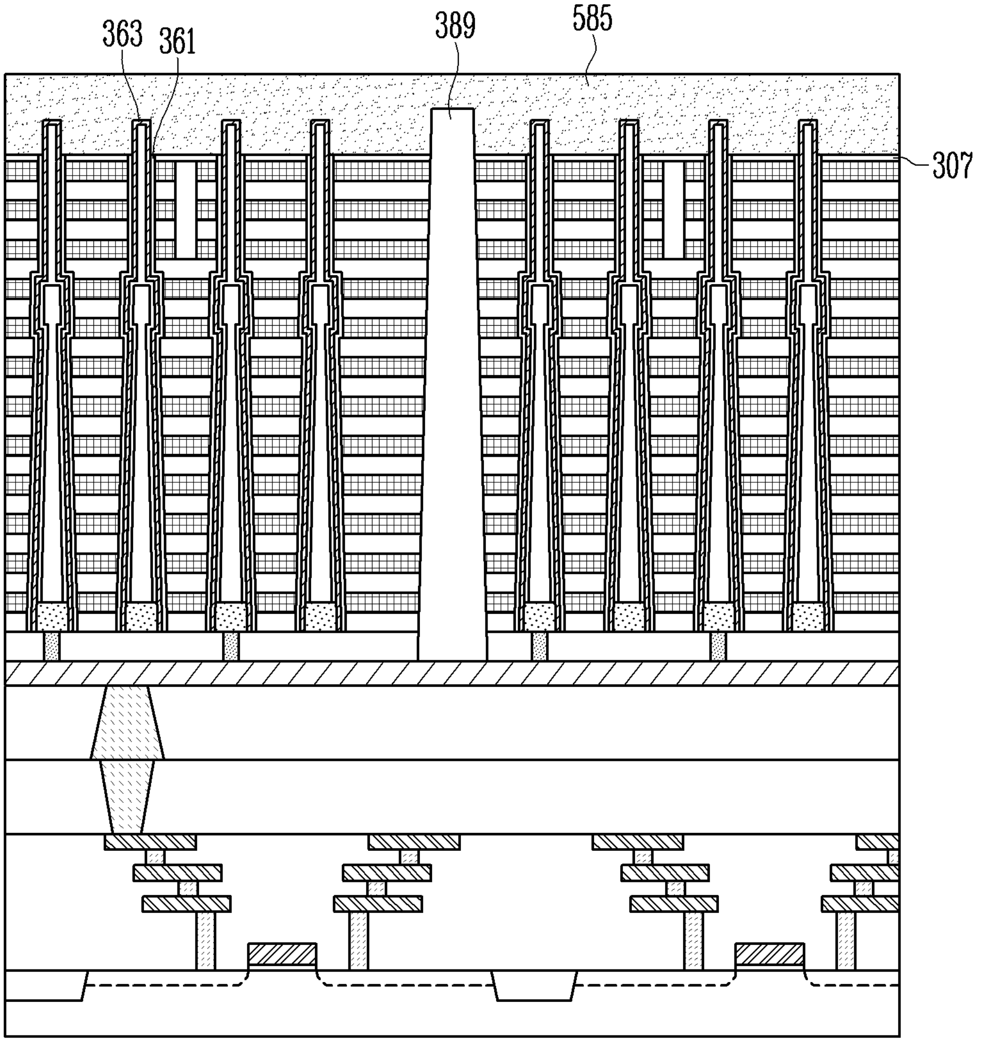

Referring to FIG. 17H, a horizontal doped semiconductor pattern 585 may be formed to contact the channel layer 363. The horizontal doped semiconductor pattern 585 may extend to cover the gate insulating layer 307 and the vertical insulating layer 389.

The horizontal doped semiconductor pattern 585 may include at least one of an n-type doped semiconductor layer and a p-type doped semiconductor layer.

The semiconductor memory device illustrated in FIG. 11 may be provided using the processes, described with reference to FIGS. 17A to 17H.

Figure 18:
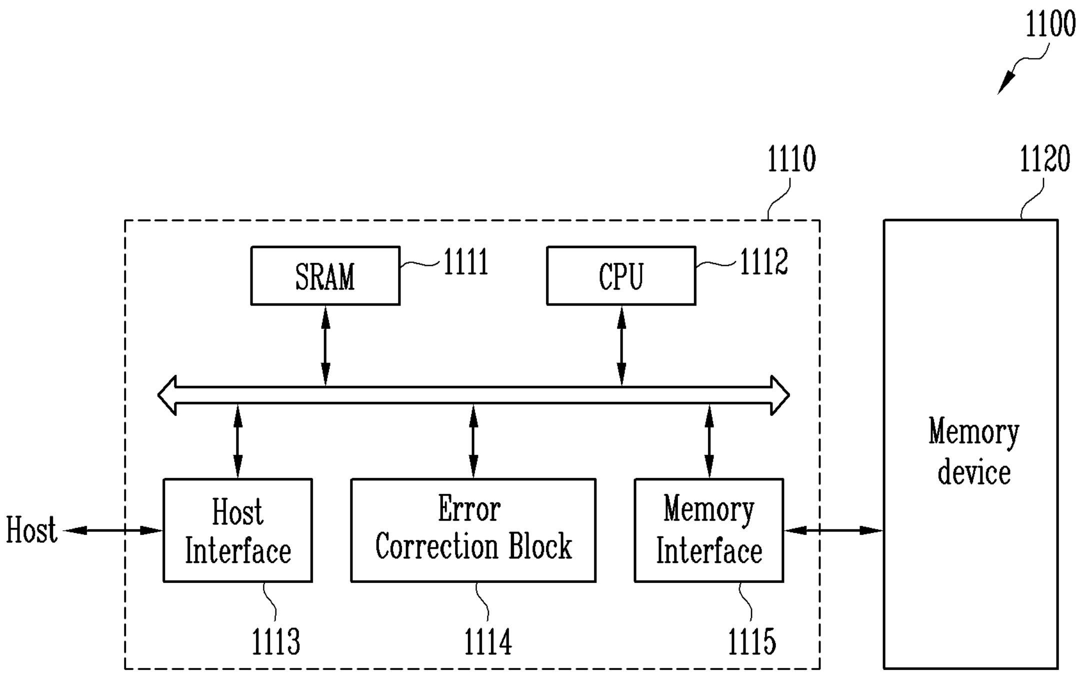
FIG. 18 is a block diagram illustrating the configuration of a memory system according to an embodiment of the present disclosure.

FIG. 18 is a block diagram illustrating the configuration of a memory system according to an embodiment of the present disclosure.

Referring to FIG. 18, a memory system 1100 includes a memory device 1120 and a memory controller 1110.

The memory device 1120 may be a multi-chip package composed of a plurality of flash memory chips. In an embodiment, the memory device 1120 may include a first select gate structure and a second select gate structure separated from each other with a sub-block insulating layer interposed therebetween, a plurality of conductive patterns stacked over the first and second select gate structures to be spaced apart from each other, and a channel structure that penetrates one of the first and second select gate structures and the plurality of conductive patterns and has inflection points located at levels between the sub-block insulating layer and the plurality of conductive patterns.

The memory controller 1110 may control the memory device 1120, and may include a static random access memory (SRAM) 1111, a central processing unit (CPU) 1112, a host interface 1113, an error correction block 1114, and a memory interface 1115. The SRAM 1111 may be used as a working memory of the CPU 1112, the CPU 1112 may perform overall control operations for data exchange of the memory controller 1110, and the host interface 1113 may be provided with a data interchange protocol of a host coupled to the memory system 1100. The error correction block 1114 may detect errors included in data read from the memory device 1120, and may correct the detected errors. The memory interface 1115 may interface with the memory device 1120. The memory controller 1110 may further include a read only memory (ROM) or the like that stores code data for interfacing with the host.

The above-described memory system 1100 may be a memory card or a solid state drive (SSD) in which the memory device 1120 and the memory controller 1110 are combined with each other. For example, when the memory system 1100 is an SSD, the memory controller 1110 may communicate with an external device (e.g., host) through one of various interface protocols, such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), and an Integrated Drive Electronics (IDE).

Figure 19:
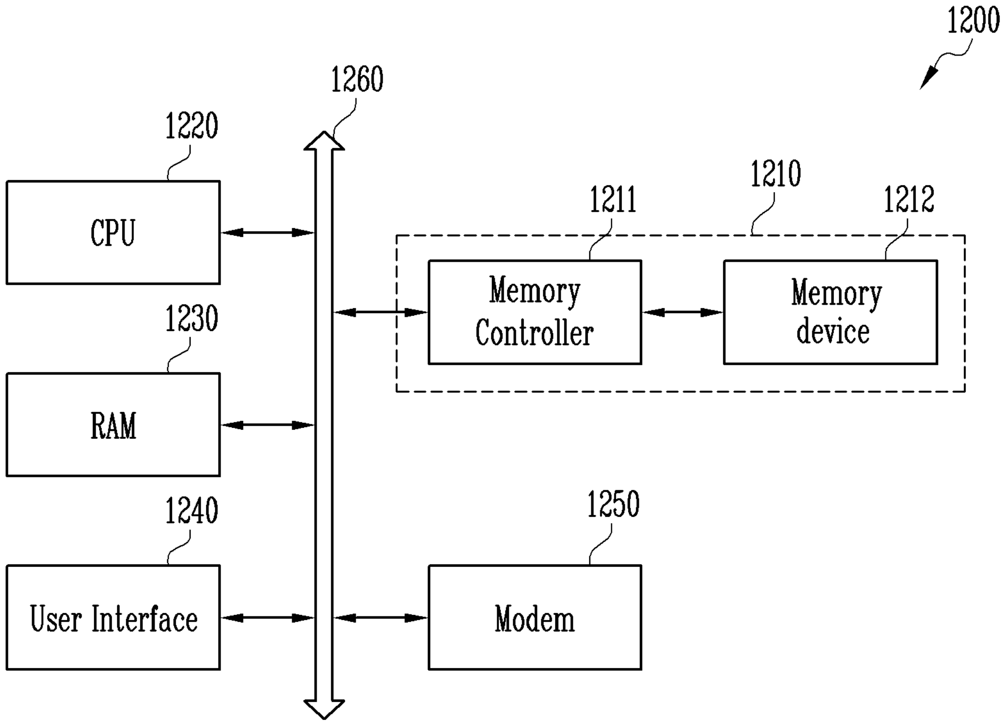
FIG. 19 is a block diagram illustrating the configuration of a computing system according to an embodiment of the present disclosure.

FIG. 19 is a block diagram illustrating the configuration of a computing system according to an embodiment of the present disclosure.

Referring to FIG. 19, a computing system 1200 may include a CPU 1220, a random access memory (RAM) 1230, a user interface 1240, a modem 1250, and a memory system 1210 which are electrically coupled to a system bus 1260. When the computing system 1200 is a mobile device, it may further include a battery for supplying an operating voltage to the computing system 1200, and may further include an application chipset, an image processor, a mobile DRAM, etc.

The memory system 1210 may include a memory device 1212 and a memory controller 1211.

In an embodiment, the memory device 1212 may include a first select gate structure and a second select gate structure separated from each other with a sub-block insulating layer interposed therebetween, a plurality of conductive patterns stacked over the first and second select gate structures to be spaced apart from each other, and a channel structure that penetrates one of the first and second select gate structures and the plurality of conductive patterns and has inflection points located at levels between the sub-block insulating layer and the plurality of conductive patterns.

The memory controller 1211 may have the same configuration as the memory controller 1110, described above with reference to FIG. 18.

In accordance with various embodiments, the locations of inflection points, determined according to the shape of a channel structure or the shape of a channel hole, are designed in consideration of the location of a sub-block insulating layer, thus securing an alignment margin for the sub-block insulating layer.

In accordance with various embodiments, the incidence of a read disturb may be reduced using a first select gate structure and a second select gate structure separated from each other by a sub-block insulating layer, and thus the operational reliability of a semiconductor memory device may be improved.

What is claimed is:

1. A semiconductor memory device, comprising:

a first select gate structure including a first surface facing a first direction and a second surface facing a second direction opposite the first direction, the first surface and the second surface extending in a third direction;

a second select gate structure neighboring the first select gate structure in the third direction;

a sub-block insulating layer interposed between the first select gate structure and the second select gate structure;

a plurality of conductive patterns stacked over the first surface of the first select gate structure to be spaced apart from each other in the first direction and extending in the third direction to overlap the sub-block insulating layer and the second select gate structure;

a first channel structure penetrating the first select gate structure and the plurality of conductive patterns; and a second channel structure penetrating the second select gate structure and the plurality of conductive patterns, wherein a sidewall of each of the first channel structure and the second channel structure comprises a first inflection point disposed at a level between the plurality of conductive patterns and the sub-block insulating layer, further comprise a bit line connected to at least one of the first channel structure or the second channel structure, and wherein the plurality of conductive patterns are disposed at a level between the first select gate structure and the bit line.

2. The semiconductor memory device according to claim 1, wherein the sidewall of each of the first channel structure and the second channel structure further comprises:

a second inflection point disposed farther away from the first select gate structure and the second select gate structure than the first inflection point.

3. The semiconductor memory device according to claim 2, wherein the sidewall of each of the first channel structure and the second channel structure further comprises:

a first portion extending from the first inflection point in the second direction;

a second portion extending from the second inflection point in the first direction; and a protrusion protruding laterally from the first inflection point and the second inflection point and disposed between the first portion and the second portion.

4. The semiconductor memory device according to claim 2, wherein the plurality of conductive patterns comprise:

a first conductive pattern surrounding the first channel structure and the second channel structure at a level between the first inflection point and the second inflection point; and a second conductive pattern surrounding the first channel structure and the second channel structure at a level farther away from the first select gate structure and the second select gate structure than the first conductive pattern.

5. The semiconductor memory device according to claim 4, wherein each of the first channel structure and the second channel structure comprises:

a select channel component extending from the first inflection point to penetrate a corresponding one of the first select gate structure and the second select gate structure;

a first channel component extending from the second inflection point to penetrate the second conductive pattern; and a second channel component coupling the select channel component to the first channel component, and protruding from the first inflection point and the second inflection point to a side portion of the first conductive pattern.

6. The semiconductor memory device according to claim 5, wherein the select channel component is formed to be narrower than each of the second channel component and the first channel component.

7. The semiconductor memory device according to claim 1, wherein each of the first channel structure and the second channel structure comprises:

a channel layer extending along the sidewall of each of the first channel structure and the second channel structure; and a core insulating pattern surrounded with the channel layer.

8. The semiconductor memory device according to claim 7, further comprising:

a horizontal doped semiconductor pattern facing the second surface of the first select gate structure, and extending in the third direction to overlap the second select gate structure; and a gate insulating layer disposed between the horizontal doped semiconductor pattern and the first select gate structure, and extending to a space between the horizontal doped semiconductor pattern and the second select gate structure, wherein the channel layer penetrates the gate insulating layer to be coupled to the horizontal doped semiconductor pattern.

9. A semiconductor memory device, comprising:

a horizontal doped semiconductor pattern;

a first channel structure and a second channel structure contacting the horizontal doped semiconductor pattern and extending in a first direction;

a sub-block structure including a first select gate structure surrounding the first channel structure, a second select gate structure surrounding the second channel structure, and a sub-block insulating layer disposed between the first select gate structure and the second select gate structure;

a first stacked body including a first conductive pattern and a first interlayer insulating layer that are alternately stacked over the sub-block structure; and a second stacked body including a second conductive pattern and a second interlayer insulating layer that are alternately stacked over the first stacked body, wherein a sidewall of each of the first channel structure and the second channel structure includes a first inflection point disposed at a level between the first stacked body and the sub-block insulating layer, further comprise a bit line connected to at least one of the first channel structure or the second channel structure, and wherein the first stacked body is disposed at a level between the first select gate structure and the bit line.

10. The semiconductor memory device according to claim 9, wherein each of the first channel structure and the second channel structure comprises:

a core insulating pattern extending in the first direction; and a channel layer surrounding a sidewall of the core insulating pattern.

11. The semiconductor memory device according to claim 10, wherein:

the sidewall of each of the first channel structure and the second channel structure further comprises:

a second inflection point farther away from the sub-block structure than the first inflection point, and the channel layer comprises:

a select channel component extending from the first inflection point to penetrate a corresponding one of the first select gate structure and the second select gate structure;

a first channel component extending from the second inflection point in the first direction to penetrate the second stacked body; and a second channel component coupling the select channel component to the first channel component, and protruding from the first inflection point and the second inflection point to a side portion of the first stacked body.

12. The semiconductor memory device according to claim 10, wherein the channel layer comprises a pipe channel component extending to surround a sidewall, a top surface, and a bottom surface of the horizontal doped semiconductor pattern.

13. The semiconductor memory device according to claim 12, wherein each of the horizontal doped semiconductor pattern and the pipe channel component includes n-type impurities.

14. The semiconductor memory device according to claim 12, wherein each of the horizontal doped semiconductor pattern and the pipe channel component comprises p-type impurities.

15. The semiconductor memory device according to claim 14, further comprising:

a vertical semiconductor pattern penetrating the horizontal doped semiconductor pattern and the pipe channel component; and a source contact structure coupled to the vertical semiconductor pattern and extending in the first direction, wherein the source contact structure includes n-type impurities.

16. The semiconductor memory device according to claim 15, wherein respective portions of the horizontal doped semiconductor pattern, the pipe channel component, and the vertical semiconductor pattern, which are adjacent to the source contact structure, include n-type impurities.

17. The semiconductor memory device according to claim 12, further comprising:

a memory layer extending along a surface of each of the first channel structure, the second channel structure, and the pipe channel component.

18. The semiconductor memory device according to claim 17, further comprising:

a source contact structure extending from the horizontal doped semiconductor pattern in the first direction to penetrate the memory layer, wherein each of the horizontal doped semiconductor pattern and the source contact structure includes n-type impurities.

19. The semiconductor memory device according to claim 17, further comprising:

a vertical semiconductor pattern penetrating the memory layer, the horizontal doped semiconductor pattern, and the pipe channel component; and a source contact structure coupled to the vertical semiconductor pattern and extending in the first direction, wherein the source contact structure includes n-type impurities, and the horizontal doped semiconductor pattern includes p-type impurities.

20. The semiconductor memory device according to claim 10, wherein:

the channel layer comprises a protrusion protruding higher than the first select gate structure and the second select gate structure in a second direction opposite the first direction, and the channel layer extends to a space between an end of the core insulating pattern facing the second direction and the horizontal doped semiconductor pattern, and contacts the horizontal doped semiconductor pattern.

* * * * *